United States Patent
Ohmaru

(10) Patent No.: US 10,033,952 B2
(45) Date of Patent: Jul. 24, 2018

(54) IMAGING DEVICE, MODULE, ELECTRONIC DEVICE, AND METHOD OF OPERATING THE IMAGING DEVICE

(71) Applicant: Semiconductor Energy Laboratory Co., Ltd., Atsugi-shi, Kanagawa-ken (JP)

(72) Inventor: Takuro Ohmaru, Fukuoka (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/258,011

(22) Filed: Sep. 7, 2016

(65) Prior Publication Data
US 2017/0078606 A1 Mar. 16, 2017

(30) Foreign Application Priority Data

Sep. 10, 2015 (JP) .................. 2015-178407
Sep. 10, 2015 (JP) .................. 2015-178420

(51) Int. Cl.
*H04N 5/335* (2011.01)
*H04N 5/378* (2011.01)
*H01L 27/146* (2006.01)
*H04N 5/359* (2011.01)
*H04N 5/369* (2011.01)

(52) U.S. Cl.
CPC ....... *H04N 5/378* (2013.01); *H01L 27/14612* (2013.01); *H01L 27/14638* (2013.01); *H04N 5/359* (2013.01); *H04N 5/3698* (2013.01)

(58) Field of Classification Search
CPC ........ H01L 27/14612; H01L 27/14638; H04N 5/359; H04N 5/3698; H04N 5/378
See application file for complete search history.

(56) References Cited

U.S. PATENT DOCUMENTS 6,576,882 B2 6/2003 Muramatsu et al.
6,850,278 B1 2/2005 Sakurai et al.
(Continued)

FOREIGN PATENT DOCUMENTS

CN 001965572 A 5/2007
CN 103843328 A 6/2014
(Continued)

OTHER PUBLICATIONS

Watanabe et al. JP 2003-134396 English Translation.*
(Continued)

*Primary Examiner* — Twyler Haskins
*Assistant Examiner* — Carramah J Quiett
(74) *Attorney, Agent, or Firm* — Fish & Richardson P.C.

(57) ABSTRACT

An imaging device whose dynamic range can be wide with a simple structure is provided. In a circuit configuration and an operation method of the imaging device, whether a charge detection portion provided in a pixel is saturated with electrons is determined and an operation mode is changed depending on the determination result. First imaging data is captured first, and is read out in the case where the charge detection portion is not saturated with electrons. In the case where the charge detection portion is saturated with electrons, the saturation of the charge detection portion is eliminated and second imaging data is captured and read out.

20 Claims, 63 Drawing Sheets

(56) References Cited

U.S. PATENT DOCUMENTS

| | | |
|---|---|---|
| 7,674,650 B2 | 3/2010 | Akimoto et al. |
| 8,378,391 B2 | 2/2013 | Koyama et al. |
| 2005/0052554 A1 | 3/2005 | Sakurai et al. |
| 2007/0103569 A1 | 5/2007 | Kawahito |
| 2008/0266434 A1 | 10/2008 | Sugawa et al. |
| 2014/0232912 A1 | 8/2014 | Morimoto |
| 2016/0064443 A1* | 3/2016 | Inoue .................. H01L 29/7869 257/43 |
| 2016/0064444 A1 | 3/2016 | Inoue et al. |
| 2016/0073066 A1 | 3/2016 | Morimoto |
| 2016/0093652 A1 | 3/2016 | Ikeda et al. |
| 2016/0133660 A1 | 5/2016 | Inoue et al. |
| 2016/0134789 A1 | 5/2016 | Inoue et al. |
| 2016/0225808 A1 | 8/2016 | Kurokawa |
| 2016/0284749 A1 | 9/2016 | Kurokawa |
| 2016/0316159 A1 | 10/2016 | Yoneda |
| 2016/0316160 A1 | 10/2016 | Kurokawa |
| 2016/0329024 A1 | 11/2016 | Maeda |
| 2016/0329368 A1 | 11/2016 | Ohmaru |
| 2016/0336363 A1 | 11/2016 | Dairiki et al. |
| 2016/0366360 A1 | 12/2016 | Okamoto et al. |
| 2016/0381266 A1 | 12/2016 | Ohmaru |
| 2017/0005126 A1 | 1/2017 | Yamazaki et al. |
| 2017/0018587 A1 | 1/2017 | Ohmaru |
| 2017/0025456 A1 | 1/2017 | Ohmaru |
| 2017/0069673 A1 | 3/2017 | Ikeda |
| 2017/0084649 A1 | 3/2017 | Ohmaru et al. |

FOREIGN PATENT DOCUMENTS

| | | |
|---|---|---|
| EP | 1746820 A | 1/2007 |
| EP | 2765773 A | 8/2014 |
| JP | 2000-165754 A | 6/2000 |
| JP | 2000-165755 A | 6/2000 |
| JP | 2002-077737 A | 3/2002 |
| JP | 2003-134396 A | 5/2003 |
| JP | 2004-363666 A | 12/2004 |
| JP | 2005-328493 A | 11/2005 |
| JP | 2006-217410 A | 8/2006 |
| JP | 2007-096055 A | 4/2007 |
| JP | 2007-123861 A | 5/2007 |
| JP | 2011-119711 A | 6/2011 |
| JP | 2013-033664 A | 2/2013 |
| JP | 2013-085028 A | 5/2013 |
| JP | 2014-236151 A | 12/2014 |
| KR | 2006-0135941 A | 12/2006 |
| KR | 10-1201269 | 11/2012 |
| TW | 200537684 | 11/2005 |
| WO | WO-2004/110057 | 12/2004 |
| WO | WO-2005/101816 | 10/2005 |
| WO | WO-2013/051477 | 4/2013 |

OTHER PUBLICATIONS

International Search Report (Application No. PCT/IB2016/055137) dated Nov. 29, 2016.
Written Opinion (Application No. PCT/IB2016/055137) dated Nov. 29, 2016.

* cited by examiner

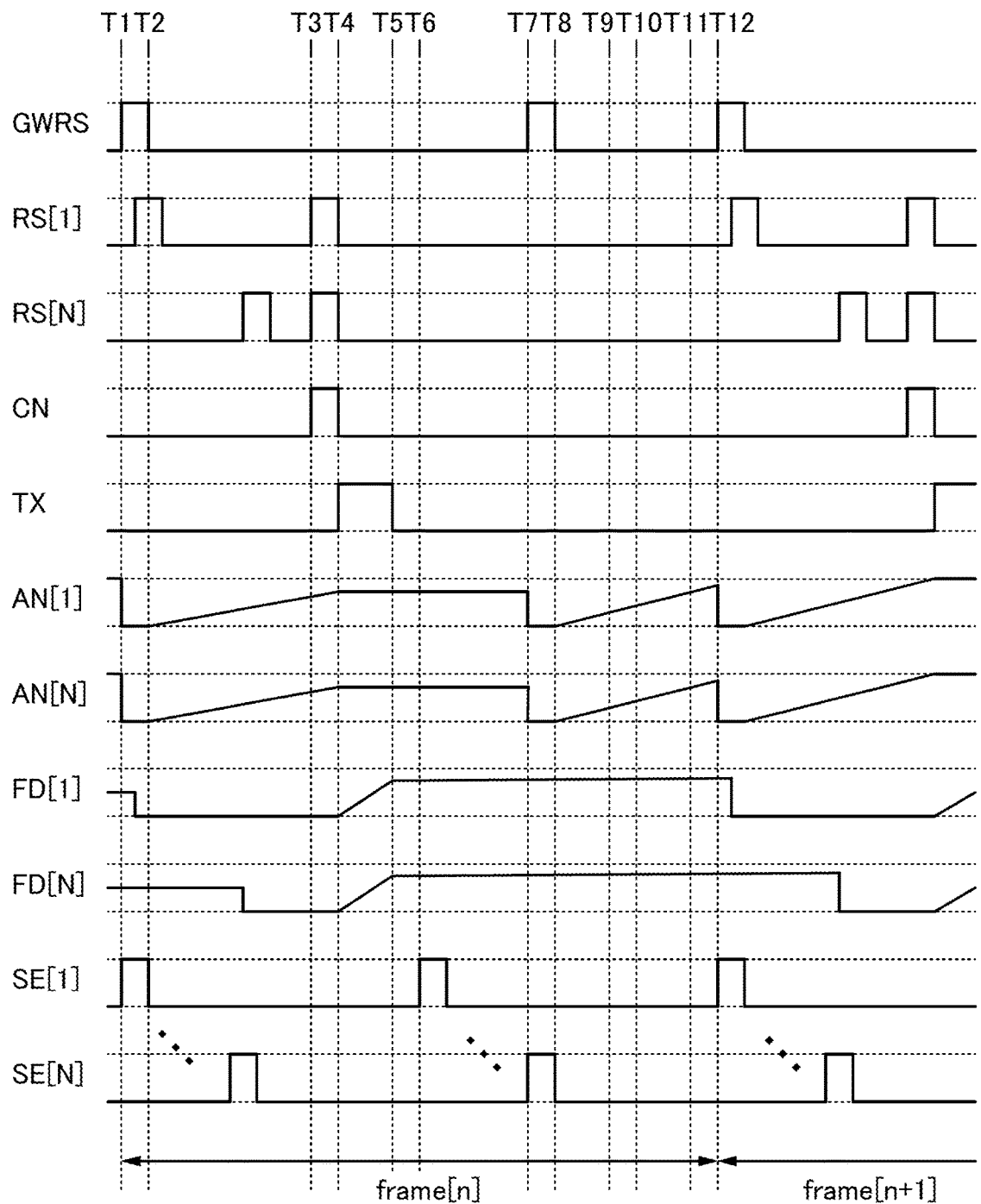

FIG. 32A1
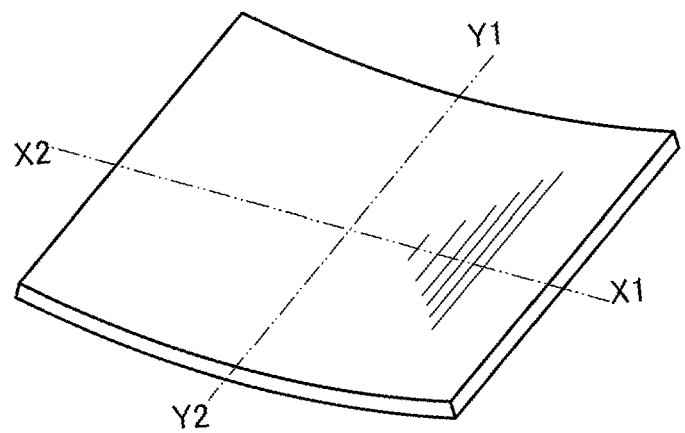
FIG. 32A2
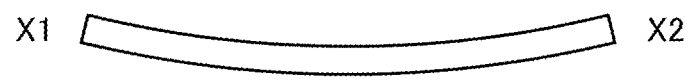
FIG. 32A3
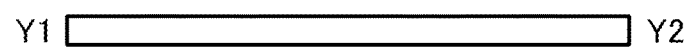
FIG. 32B1
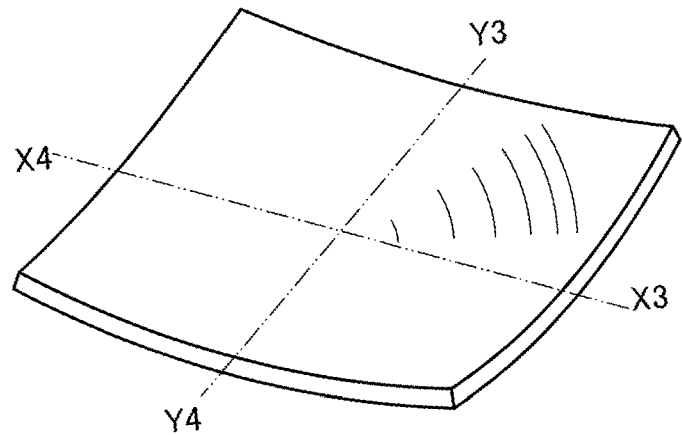
FIG. 32B2
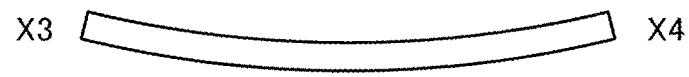
FIG. 32B3

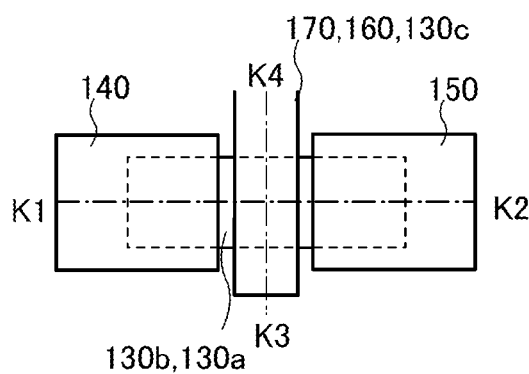
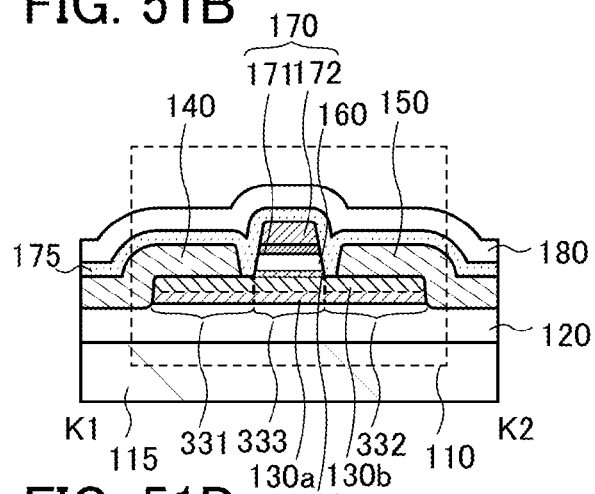
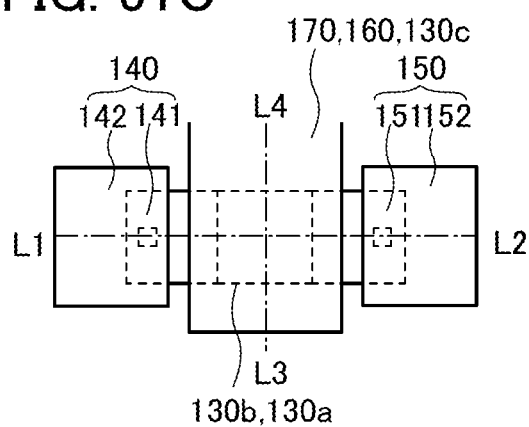
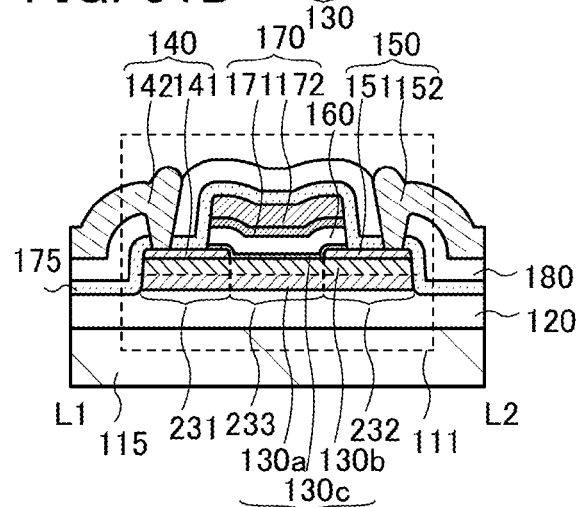
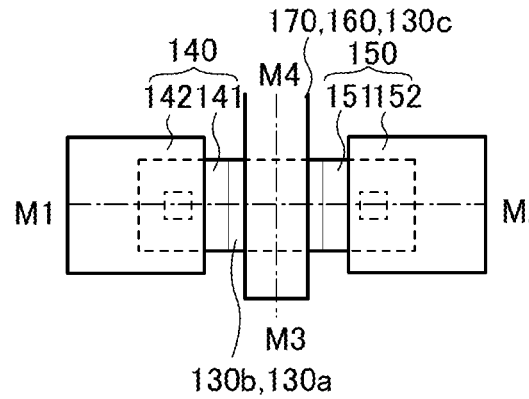
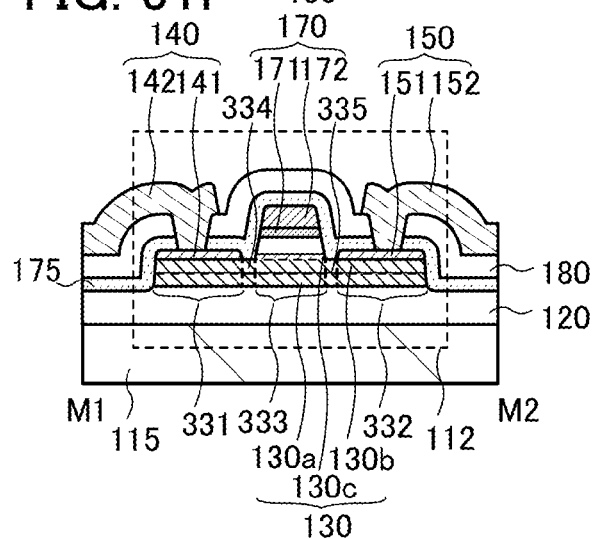

IMAGING DEVICE, MODULE, ELECTRONIC DEVICE, AND METHOD OF OPERATING THE IMAGING DEVICE

TECHNICAL FIELD

One embodiment of the present invention relates to an imaging device and a method of operating the imaging device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a memory device, an imaging device, a method for operating any of them, and a method for manufacturing any of them.

In this specification and the like, a semiconductor device generally means a device that can function by utilizing semiconductor characteristics. A transistor and a semiconductor circuit are embodiments of semiconductor devices. In some cases, a memory device, a display device, an imaging device, or an electronic device includes a semiconductor device.

BACKGROUND ART

As a semiconductor material applicable to a transistor, an oxide semiconductor has been attracting attention. For example, a technique for forming a transistor using zinc oxide or an In—Ga—Zn-based oxide semiconductor as an oxide semiconductor is disclosed (see Patent Documents 1 and 2).

Patent Document 3 discloses an imaging device in which a transistor including an oxide semiconductor is used in part of a pixel circuit.

REFERENCES

Patent Documents

[Patent Document 1] Japanese Published Patent Application No. 2007-123861
[Patent Document 2] Japanese Published Patent Application No. 2007-096055
[Patent Document 3] Japanese Published Patent Application No. 2011-119711

DISCLOSURE OF INVENTION

A CMOS image sensor has been incorporated in a variety of devices; thus, an improvement in the imaging performance of a CMOS image sensor has been expected. The dynamic range of current CMOS image sensors is approximately 3 to 4 digits (60 dB to 80 dB), but desired to be improved to 5 to 6 digits (100 dB to 120 dB) corresponding to the dynamic range of a silver salt film or human eyes.

For example, a method of taking an image in such a manner that charge accumulation portions are switched and a method of executing analog data processing in a pixel have been proposed in order to improve a dynamic range. However, in the former method, control from the outside is needed and a unit for detecting illuminance or the like is additionally needed. In the latter method, the number of transistors in the pixel increases, and thus a problem arises in deterioration of an image due to leakage current in the transistor, noise, or the like.

In view of the above, an object of one embodiment of the present invention is to provide an imaging device whose dynamic range can be wide with a simple structure. Another object is to provide an imaging device in which the sensitivity of a pixel is changed after first imaging, and then second imaging is performed. Another object is to provide an imaging device with low power consumption. Another object is to provide an imaging device in which data in the previous frame is read out in a light-exposure period. Another object is to provide an imaging device capable of taking an image with little noise. Another object is to provide an imaging device that is suitable for high-speed operation. Another object is to provide an imaging device with high resolution. Another object is to provide a highly integrated imaging device. Another object is to provide an imaging device capable of imaging under a low illuminance condition. Another object is to provide an imaging device that can be used in a wide temperature range. Another object is to provide an imaging device with a high aperture ratio. Another object is to provide an imaging device with high reliability. Another object is to provide a novel imaging device or the like. Another object is to provide a method of operating any of the imaging devices. Another object is to provide a novel semiconductor device or the like.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention relates to an imaging device that is capable of taking an image in such a manner that the sensitivity of a pixel is automatically changed.

One embodiment of the present invention is an imaging device including a first transistor; a second transistor; a third transistor; a fourth transistor; a fifth transistor; a sixth transistor; a photoelectric conversion element; a first capacitor; and a second capacitor. One of electrodes of the photoelectric conversion element is electrically connected to one of a source and a drain of the first transistor. The one of the source and the drain of the first transistor is electrically connected to one of a source and a drain of the second transistor. The other of the source and the drain of the first transistor is electrically connected to one of a source and a drain of the third transistor. The other of the source and the drain of the first transistor is electrically connected to one of a source and a drain of the fourth transistor. The other of the source and the drain of the first transistor is electrically connected to a gate electrode of the fifth transistor. The other of the source and the drain of the first transistor is electrically connected to one of electrodes of the first capacitor. The other of the source and the drain of the fourth transistor is electrically connected to one of electrodes of the second capacitor. One of a source and a drain of the fifth transistor is electrically connected to one of a source and a drain of the sixth transistor. The first transistor, the second transistor, the third transistor, and the fourth transistor each include an oxide semiconductor in a region where a channel is formed.

The oxide semiconductor preferably contains In, Zn, and M (M is Al, Ti, Ga, Sn, Y, Zr, La, Ce, Nd, or Hf). The fifth transistor and the sixth transistor may each include an oxide semiconductor in a region where a channel is formed.

In the photoelectric conversion element, selenium or a compound containing selenium can be used for a photoelectric conversion layer. For example, amorphous selenium or crystalline selenium can be used as selenium.

Another embodiment of the present invention is an imaging device including a pixel; a first circuit; a second circuit; a third circuit; a fourth circuit; and a fifth circuit. The pixel is electrically connected to the first circuit. The first circuit is electrically connected to the second circuit. The second circuit is electrically connected to the third circuit. The second circuit is electrically connected to the fourth circuit. The third circuit is electrically connected to the fifth circuit. The fifth circuit is electrically connected to the pixel. The pixel is configured to capture first imaging data or second imaging data. The pixel is configured to accumulate the first imaging data or the second imaging data in a charge accumulation portion. The pixel is configured to transfer the first imaging data or the second imaging data accumulated in the charge accumulation portion to a charge detection portion. The first circuit is configured to output a signal obtained by adding or subtracting an absolute value of a difference between a potential corresponding to the second imaging data and a potential corresponding to a reset potential of the charge detection portion to or from a reference potential. The second circuit is configured to determine whether the charge detection portion is saturated with an electron with use of the first imaging data. The third circuit is configured to output a signal for not capturing the second imaging data to the pixel through the fifth circuit when it is determined that the charge detection portion is not saturated with the electron. The third circuit is configured to eliminate saturation of the charge detection portion and output a signal for capturing the second imaging data to the pixel through the fifth circuit when it is determined that the charge detection portion is saturated with the electron. The second circuit and the fourth circuit are configured to convert a signal output from the first circuit into digital data.

Another embodiment of the present invention is a method of operating an imaging device, including, in an n-th (n is a natural number of 1 or more) frame period, a first step of resetting a potential of a charge accumulation portion; a second step of accumulating a charge in the charge accumulation portion; a third step of resetting a potential of a charge detection portion; a fourth step of transferring a potential of the charge accumulation portion to the charge detection portion; and a fifth step of reading a signal corresponding to the potential of the charge detection portion and determining whether the charge detection portion is saturated with an electron on the basis of the signal. The first step, the second step, the third step, the fourth step, and the fifth step are sequentially performed. When it is determined that the charge detection portion is saturated with the electron in the fifth step, a sixth step, a seventh step, an eighth step, and a ninth step are sequentially performed. The potential of the charge accumulation portion is reset in the sixth step. A charge is accumulated in the charge accumulation portion in the seventh step. A capacitance of the charge detection portion is temporarily increased to eliminate saturation of the charge detection portion in the eighth step. The potential of the charge accumulation portion is transferred to the charge detection portion in the ninth step. Reading a signal corresponding to the potential of the charge detection portion in the ninth step in the n-th frame period is performed in parallel with the first step and the second step in an (n+1)-th frame period. When it is determined that the charge detection portion is not saturated with the electron in the fifth step, reading a signal corresponding to the potential of the charge detection portion in the fourth step in the n-th frame period is performed in parallel with the first step and the second step in the (n+1)-th frame period.

Another embodiment of the present invention is an imaging device including a first transistor; a second transistor; a third transistor; a fourth transistor; a fifth transistor; a sixth transistor; a seventh transistor; a photoelectric conversion element; a first capacitor; a second capacitor; and a third capacitor. One of electrodes of the photoelectric conversion element is electrically connected to one of a source and a drain of the first transistor. The one of the source and the drain of the first transistor is electrically connected to one of a source and a drain of the second transistor. The other of the source and the drain of the first transistor is electrically connected to one of a source and a drain of the third transistor. The other of the source and the drain of the first transistor is electrically connected to one of a source and a drain of the fourth transistor. The other of the source and the drain of the first transistor is electrically connected to a gate electrode of the fifth transistor. The other of the source and the drain of the first transistor is electrically connected to one of electrodes of the first capacitor. The other of the source and the drain of the fourth transistor is electrically connected to one of electrodes of the second capacitor. One of a source and a drain of the fifth transistor is electrically connected to one of a source and a drain of the sixth transistor. One of a source and a drain of the seventh transistor is electrically connected to a gate of the fourth transistor. One of electrodes of the third capacitor is electrically connected to the gate of the fourth transistor. The first transistor, the second transistor, the third transistor, the fourth transistor, and the seventh transistor each include an oxide semiconductor in a region where a channel is formed.

The oxide semiconductor preferably contains In, Zn, and M (M is Al, Ti, Ga, Sn, Y, Zr, La, Ce, Nd, or Hf). The fifth transistor and the sixth transistor may each include an oxide semiconductor in a region where a channel is formed.

In the photoelectric conversion element, selenium or a compound containing selenium can be used for a photoelectric conversion layer. For example, amorphous selenium or crystalline selenium can be used as selenium.

Another embodiment of the present invention is an imaging device including a pixel; a first circuit; a second circuit; a third circuit; and a fourth circuit. The pixel includes a charge accumulation portion and a charge detection portion. The charge detection portion is electrically connected to a first capacitor and a second capacitor. The pixel is electrically connected to the first circuit. The first circuit is electrically connected to the second circuit. The second circuit is electrically connected to the third circuit. The second circuit is electrically connected to the fourth circuit. The third circuit is electrically connected to the pixel. The pixel is configured to capture first imaging data or second imaging data. The pixel is configured to accumulate the first imaging data or the second imaging data in the charge accumulation portion. The pixel is configured to transfer the first imaging data or the second imaging data accumulated in the charge accumulation portion to the charge detection portion. The first circuit is configured to output a signal obtained by adding or subtracting an absolute value of a difference between a potential corresponding to the second imaging data and a potential corresponding to a reset potential of the charge detection portion to or from a reference potential. The second circuit is configured to determine whether the charge detection portion is saturated with an electron with use of the first imaging data. The third circuit is configured to output a signal for not electrically connecting the charge detection portion and one of electrodes of the second capacitor to the pixel when it is determined that the charge detection portion is not saturated with the electron. The third circuit is configured to output a signal for electrically connecting the charge detection portion and the one of the electrodes of the second capacitor to the pixel when it is determined that the charge detection portion is saturated with the electron. The pixel is configured to transfer the second imaging data from the charge accumulation portion to the charge detection portion after the determination. The second circuit and the fourth circuit are configured to convert a signal output from the first circuit into digital data.

Another embodiment of the present invention is a method of operating an imaging device, comprising, in an n-th (n is a natural number of 1 or more) frame period, a first step of resetting a potential of a charge accumulation portion; a second step of accumulating a charge in the charge accumulation portion; a third step of resetting a potential of a charge detection portion; a fourth step of transferring a potential of the charge accumulation portion to the charge detection portion; and a fifth step of reading a signal corresponding to the potential of the charge detection portion and determining whether the charge detection portion is saturated with an electron on the basis of the signal. The first step, the second step, the third step, the fourth step, and the fifth step are sequentially performed. When it is determined that the charge detection portion is saturated with the electron in the fifth step, a sixth step and a seventh step are sequentially performed. A capacitance of the charge detection portion is increased in the sixth step. The potential of the charge detection portion is reset in the seventh step. When it is determined that the charge detection portion is not saturated with the electron in the fifth step, the seventh step is performed and an eighth step and a ninth step are sequentially performed in parallel with the fifth step, the sixth step, and the seventh step. The potential of the charge accumulation portion is reset in the eighth step. A charge is accumulated in the charge accumulation portion in the ninth step. A tenth step is performed after the seventh step when it is determined that the charge detection portion is saturated with the electron in the fifth step or is performed after the ninth step when it is determined that the charge detection portion is not saturated with the electron in the fifth step. The potential of the charge accumulation portion is transferred to the charge detection portion in the tenth step. Reading a signal corresponding to the potential of the charge detection portion in the tenth step in the n-th frame period is performed in parallel with the first step and the second step in an (n+1)-th frame period.

According to one embodiment of the present invention, an imaging device whose dynamic range can be wide with a simple structure can be provided. According to one embodiment of the present invention, an imaging device in which the sensitivity of a pixel is changed after first imaging, and then second imaging is performed can be provided. According to one embodiment of the present invention, an imaging device with low power consumption can be provided. According to one embodiment of the present invention, an imaging device in which data in the previous frame is read out in a light-exposure period can be provided. According to one embodiment of the present invention, an imaging device capable of taking an image with little noise can be provided. According to one embodiment of the present invention, an imaging device that is suitable for high-speed operation can be provided. According to one embodiment of the present invention, an imaging device with high resolution can be provided. According to one embodiment of the present invention, a highly integrated imaging device can be provided. According to one embodiment of the present invention, an imaging device capable of imaging under a low illuminance condition can be provided. According to one embodiment of the present invention, an imaging device that can be used in a wide temperature range can be provided. According to one embodiment of the present invention, an imaging device with a high aperture ratio can be provided. According to one embodiment of the present invention, an imaging device with high reliability can be provided. According to one embodiment of the present invention, a novel imaging device or the like can be provided. According to one embodiment of the present invention, a method of operating any of the imaging devices can be provided. According to one embodiment of the present invention, a novel semiconductor device or the like can be provided.

Note that one embodiment of the present invention is not limited to these effects. For example, depending on circumstances or conditions, one embodiment of the present invention might produce another effect. Furthermore, depending on circumstances or conditions, one embodiment of the present invention might not produce the above effects.

BRIEF DESCRIPTION OF DRAWINGS

FIG. 12 is a timing chart showing an operation of an imaging device.

FIGS. 32A1, 32A2, 32A3, 32B1, 32B2, and 32B3 illustrate bent imaging devices.

FIGS. 51A to 51F are top views and cross-sectional views illustrating transistors.

BEST MODE FOR CARRYING OUT THE INVENTION

Figure 1:
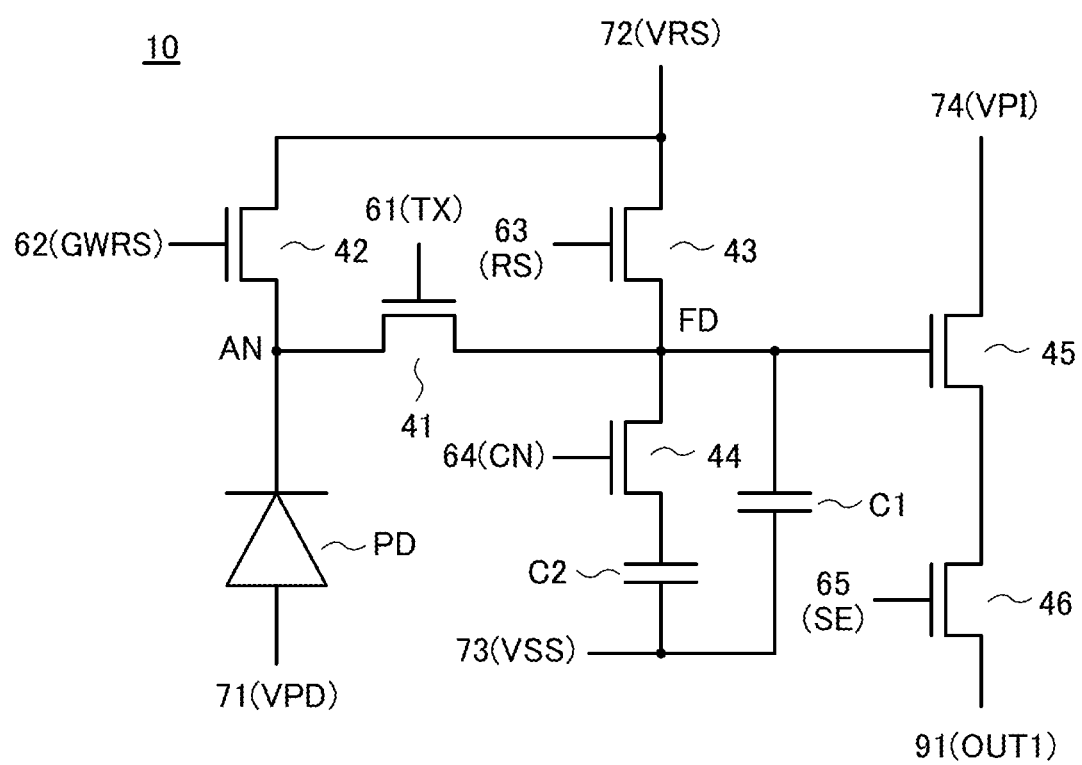
FIG. 1 is a circuit diagram illustrating a pixel.

Embodiments will be described in detail with reference to drawings. Note that the present invention is not limited to the following description and it will be readily appreciated by those skilled in the art that modes and details can be modified in various ways without departing from the spirit and the scope of the present invention. Therefore, the present invention should not be construed as being limited to the description of the embodiments below. Note that in structures of the invention described below, the same portions or portions having similar functions are denoted by the same reference numerals in different drawings, and description thereof is not repeated in some cases. The same components are denoted by different hatching patterns in different drawings, or the hatching patterns are omitted in some cases.

Note that the ordinal numbers such as "first" and "second" are used for convenience and do not denote the order of steps or the stacking order of layers. Therefore, for example, the term "first" can be replaced with the term "second", "third", or the like as appropriate. In addition, the ordinal numbers in this specification and the like do not correspond to the ordinal numbers which specify one embodiment of the present invention in some cases.

For example, in this specification and the like, an explicit description "X and Y are connected" means that X and Y are electrically connected, X and Y are functionally connected, and X and Y are directly connected. Accordingly, without being limited to a predetermined connection relation, for example, a connection relation shown in drawings or text, another connection relation is included in the drawings or the text.

Here, X and Y each denote an object (e.g., a device, an element, a circuit, a wiring, an electrode, a terminal, a conductive film, or a layer).

Examples of the case where X and Y are directly connected include the case where an element that enables electrical connection between X and Y (e.g., a switch, a transistor, a capacitor, an inductor, a resistor, a diode, a display element, a light-emitting element, or a load) is not connected between X and Y, and the case where X and Y are connected without the element that enables electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, a switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit capable of increasing signal amplitude, the amount of current, or the like, an operational amplifier, a differential amplifier circuit, a source follower circuit, or a buffer circuit; a signal generation circuit; a memory circuit; and/or a control circuit) can be connected between X and Y. For example, in the case where a signal output from X is transmitted to Y even when another circuit is placed between X and Y, X and Y are functionally connected. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit structure is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path". Another example of the expression is "a source (or a first terminal or the like) of a transistor is electrically connected to X at least with a first connection path through Z1, the first connection path does not include a second connection path, the second connection path includes a connection path through which the transistor is provided, a drain (or a second terminal or the like) of the transistor is electrically connected to Y at least with a third connection path through Z2, and the third connection path does not include the second connection path". Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit structure is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Note that the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

Note that in general, a potential (voltage) is relative and is determined depending on the amount relative to a certain potential. Therefore, even when the expression "ground", "GND", or the like is used, the potential is not necessarily 0 V. For example, the "ground potential" or "GND" may be defined using the lowest potential in a circuit as a reference. Alternatively, the "ground potential" or "GND" may be defined using an intermediate potential in a circuit as a reference. In those cases, a positive potential and a negative potential are set using the potential as a reference.

Embodiment 1

In this embodiment, an imaging device that is one embodiment of the present invention will be described with reference to drawings.

One embodiment of the present invention is a circuit configuration and an operation method of an imaging device in which whether a charge detection portion provided in a pixel is saturated with electrons is determined and an operation mode is changed depending on the determination result. First imaging data is captured first, and is read out in the case where the charge detection portion is not saturated with electrons. In the case where the charge detection portion is saturated with electrons, the saturation of the charge detection portion is eliminated and second imaging data is captured and read out. The first imaging data corresponds to image data obtained under low illuminance, and the second imaging data corresponds to image data obtained under high illuminance.

With the above operation, even in the case of imaging in an environment with low illuminance, an image with little noise and a wide dynamic range can be obtained because the gray level can be kept. Furthermore, also in the case of imaging in an environment with high illuminance, the gray level of a bright portion can be kept; thus, an image with a wide dynamic range can be obtained.

FIG. 1 is a circuit diagram of a pixel 10 included in an imaging device of one embodiment of the present invention. Note that an example in which transistors are n-channel transistors is shown in FIG. 1 and the like; however, one embodiment of the present invention is not limited to this, and some transistors may be replaced with p-channel transistors.

In the pixel 10, one electrode of a photoelectric conversion element PD is electrically connected to one of a source and a drain of a transistor 41. The one of the source and the drain of the transistor 41 is electrically connected to one of a source and a drain of a transistor 42. The other of the source and the drain of the transistor 41 is electrically connected to one of a source and a drain of a transistor 43. The other of the source and the drain of the transistor 41 is electrically connected to one of a source and a drain of a transistor 44. The other of the source and the drain of the transistor 41 is electrically connected to a gate of a transistor 45. The other of the source and the drain of the transistor 41 is electrically connected to one electrode of a capacitor C1. The other of the source and the drain of the transistor 44 is electrically connected to one electrode of a capacitor C2. One of a source and a drain of the transistor 45 is electrically connected to one of a source and a drain of a transistor 46.

Here, a node AN where the one electrode of the photoelectric conversion element PD, the one of the source and the drain of the transistor 41, and the one of the source and the drain of the transistor 42 are connected to each other is a charge accumulation portion. A node FD where the other of the source and the drain of the transistor 41, the one of the source and the drain of the transistor 43, the one of the source and the drain of the transistor 44, the gate of the transistor 45, and the one electrode of the capacitor C1 are connected to each other is a charge detection portion.

The other electrode of the photoelectric conversion element PD is electrically connected to a wiring 71 (VPD). The other of the source and the drain of the transistor 42 and the other of the source and the drain of the transistor 43 are electrically connected to a wiring 72 (VRS). The other electrode of the capacitor C1 and the other electrode of the capacitor C2 are electrically connected to a wiring 73 (VSS). The other of the source and the drain of the transistor 45 is electrically connected to a wiring 74 (VPI). The other of the source and the drain of the transistor 46 is electrically connected to a wiring 91 (OUT1).

In the connection between the above components, a plurality of transistors or a plurality of capacitors are electrically connected to a wiring to share it; however, they may be electrically connected to different wirings.

The wiring 71 (VPD), the wiring 72 (VRS), the wiring 73 (VSS), and the wiring 74 (VPI) can function as power supply lines. For example, the wiring 71 (VPD) and the wiring 73 (VSS)) can function as low potential power supply lines. The wiring 72 (VRS) and the wiring 74 (VPI) can function as high potential power supply lines.

A gate of the transistor 41 is electrically connected to a wiring 61 (TX). A gate of the transistor 42 is electrically connected to a wiring 62 (GWRS). A gate of the transistor 43 is electrically connected to a wiring 63 (RS). A gate of the transistor 44 is electrically connected to a wiring 64 (CN). A gate of the transistor 46 is electrically connected to a wiring 65 (SE).

The wiring 61 (TX), the wiring 62 (GWRS), the wiring 63 (RS), the wiring 64 (CN), and the wiring 65 (SE) can function as signal lines for controlling the conduction states of the transistors to which the respective wirings are connected. Note that the wiring 63 (RS) and the wiring 65 (SE) can control the transistors on a row basis.

The transistor 41 can function as a transistor for transferring the potential of the node AN to the node FD. The transistor 42 can function as a transistor for resetting the potential of the node AN. The transistor 43 can function as a transistor for resetting the potential of the node FD. The transistor 44 can function as a transistor for controlling the electrical connection between the node FD and the capacitor C2 and dividing electrons accumulated in the node FD. The transistor 45 can function as a transistor for outputting a signal corresponding to the potential of the node FD. The transistor 46 can function as a transistor for selecting the pixel 10.

Note that the above structure of the pixel 10 is just an example, and some of the circuits, some of the transistors, some of the capacitors, some of the wirings, or the like might not be included. Alternatively, a circuit, a transistor, a capacitor, a wiring, or the like that is not included in the above structure might be included. Alternatively, connection between some wirings might be different from the above connection.

Figure 2A:
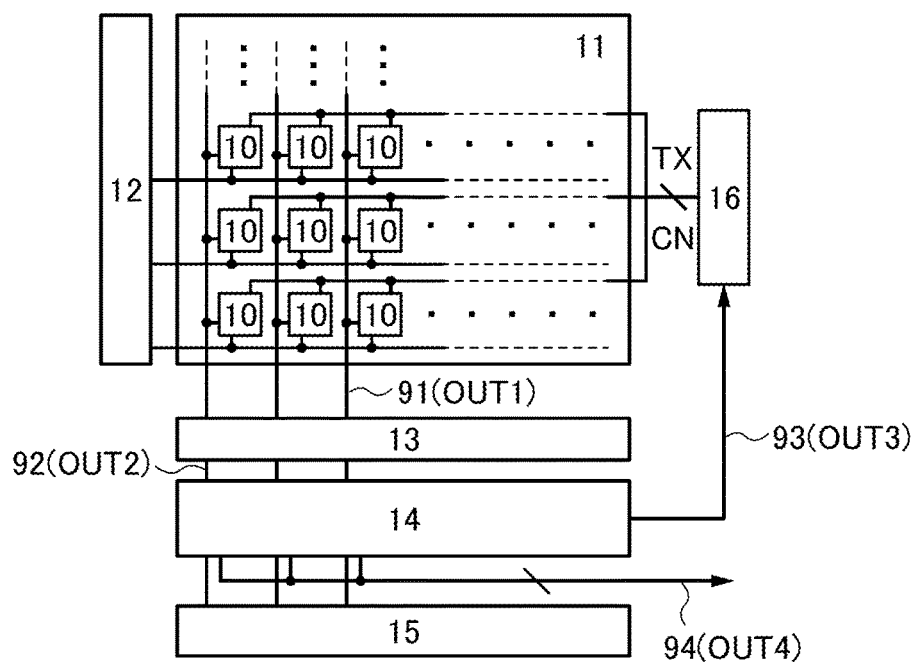
FIGS. 2A and 2B are a top view illustrating an imaging device, and a circuit diagram of a CDS circuit and a block diagram of an A/D converter circuit.

FIG. 2A illustrates an imaging device of one embodiment of the present invention. The imaging device includes a pixel array 11 including the pixels 10 arranged in a matrix, a circuit 12 (row driver) having a function of driving the pixels 10, a circuit 13 (CDS circuit) for performing correlated double sampling (CDS) on an output signal of the pixel 10, a circuit 14 (A/D converter circuit or the like) having a function of determining whether the node FD is saturated with electrons and a function of converting analog data output from the circuit 13 into digital data, a circuit 15 (column driver) having a function of selecting and reading data converted by the circuit 14, and a circuit 16 (pixel control circuit) for changing the operation mode of the pixel depending on whether the node FD is saturated with electrons. Note that a configuration in which the circuit 13 is not provided can also be employed.

Figure 2B:
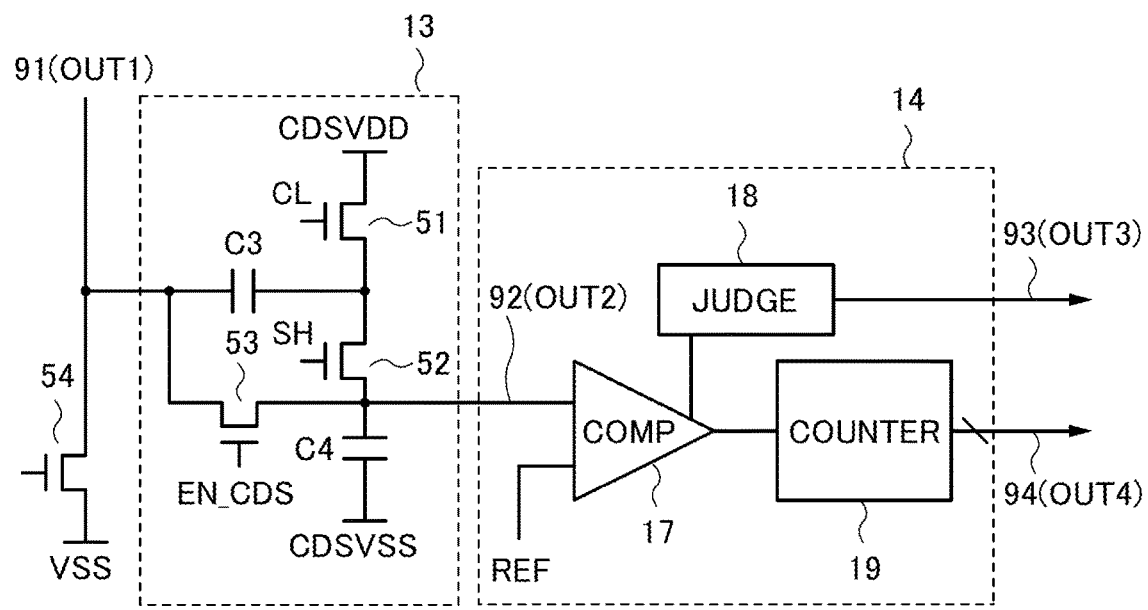

FIG. 2B shows a circuit diagram of the circuit 13 and a block diagram of the circuit 14; the circuit 13 and the circuit 14 are connected to one column of the pixel array 11. The circuit 13 can include a transistor 51, a transistor 52, a transistor 53, a capacitor C3, and a capacitor C4. The circuit 14 can include a comparator circuit 17, a determination output circuit 18, and a counter circuit 19.

A transistor 54 functions as a current supply circuit. One of a source and a drain of the transistor 54 is electrically connected to the wiring 91 (OUT1), and the other of the source and the drain of the transistor 54 is connected to a power supply line. The power supply line can function as a low potential power supply line, for example. To a gate of the transistor 54, a bias voltage is constantly applied.

In the circuit 13, one of a source and a drain of the transistor 51 is electrically connected to one of a source and a drain of the transistor 52. The one of the source and the drain of the transistor 51 is electrically connected to one electrode of the capacitor C3. The other of the source and the drain of the transistor 52 is electrically connected to one of a source and a drain of the transistor 53. The other of the source and the drain of the transistor 52 is electrically connected to one electrode of the capacitor C4. The other of the source and the drain of the transistor 52 is electrically connected to a wiring 92 (OUT2). The other of the source and the drain of the transistor 53 and the other electrode of the capacitor C3 are electrically connected to the wiring 91 (OUT1). The other of the source and the drain of the transistor 51 is electrically connected to a high potential power supply line (CDSVDD) through which a reference potential is supplied, for example. The other electrode of the capacitor C4 is electrically connected to a low potential power supply line (CDSVSS), for example.

An operation example of the circuit 13 connected to the pixel 10 illustrated in FIG. 1 will be described. First, the transistor 51 and the transistor 52 are turned on. Next, the potential of imaging data is output from the pixel 10 to the wiring 91 (OUT1), and the reference potential (CDSVDD) is held at the wiring 92 (OUT2). Then, the transistor 51 is turned off, and a reset potential (here, a potential higher than the potential of the imaging data; for example, a potential VDD) is output from the pixel 10 to the wiring 91 (OUT1). At this time, the potential of the wiring 92 (OUT2) is a value obtained by adding the absolute value of a difference between the potential of the imaging data and the reset potential to the reference potential (CDSVDD). Thus, a potential signal with little noise that is obtained by adding the net potential of the imaging data to the reference potential (CDSVDD) can be supplied to the circuit 14.

In the case where the reset potential is lower than the potential of the imaging data (for example, in the case where the reset potential is a potential GND or the like), the potential of the wiring 92 (OUT2) is a value obtained by subtracting the absolute value of the difference between the potential of the imaging data and the reset potential from the reference potential (CDSVDD).

When the transistor 53 is turned on, a bypass is formed; thus, the signal of the wiring 91 (OUT1) can be directly output to the wiring 92 (OUT2).

In the circuit 14, a signal potential input from the circuit 13 and a reference potential (REF) are compared in the comparator circuit 17. To the comparator circuit 17, the signal potential corresponding to first imaging data or second imaging data is input through the wiring 92 (OUT2). Here, the first imaging data is data of first-time light exposure, with which whether the node FD in the pixel 10 is saturated with electrons can be determined. The second imaging data is data of second-time light exposure, which is captured depending on the above determination.

First, the first imaging data is input to the comparator circuit 17, and then a determination result is output from the comparator circuit 17 to the determination output circuit 18. The determination output circuit 18 has a function of removing noise output from the comparator circuit 17 by adjusting an output timing.

In the comparator circuit 17, whether the node FD in the pixel 10 is saturated with electrons is determined with the use of the first imaging data. At this time, the reference potential (REF) input to the comparator circuit 17 is a constant potential at which the node FD is saturated with electrons; whether the node FD is saturated with electrons is determined by a comparison between the reference potential (REF) and a signal potential corresponding to the first imaging data. The signal potential corresponding to the first imaging data bypasses the circuit 13 to be input to the comparator circuit 17 in this embodiment, but may be input to the comparator circuit 17 without bypassing the circuit 13.

In the case where it is determined that the node FD is not saturated with electrons, the determination output circuit 18 outputs a signal for not capturing the second imaging data to the circuit 16. Thus, the signal potential corresponding to the first imaging data is input to the comparator circuit 17 through the circuit 13. The reference potential input to the comparator circuit 17 has a ramp wave, and the result of comparing the reference potential and the signal potential corresponding to the first imaging data is output to the counter circuit 19. Then, the counter circuit 19 outputs digital data corresponding to the first imaging data to a wiring 94 (OUT4).

In the case where it is determined that the node FD is saturated with electrons, the determination output circuit 18 outputs a signal for capturing the second imaging data to the circuit 16. The circuit 16 outputs the signal for capturing the second imaging data to the pixel 10. A signal potential corresponding to the second imaging data is input to the comparator circuit 17 through the circuit 13. The reference potential input to the comparator circuit 17 has a ramp wave, and the result of comparing the reference potential and the signal potential corresponding to the second imaging data is output to the counter circuit 19. Then, the counter circuit 19 outputs digital data corresponding to the second imaging data to the wiring 94 (OUT4).

Figure 3A:
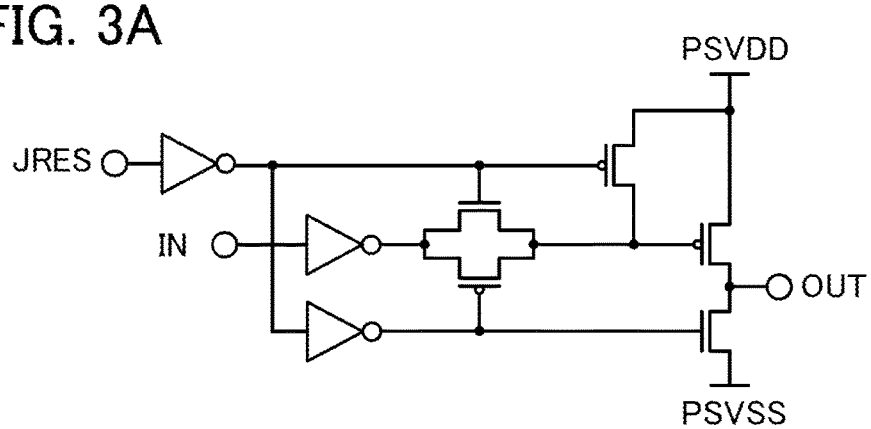
FIGS. 3A and 3B are circuit diagrams of a determination output circuit and a pixel control circuit.

As the determination output circuit 18, a circuit illustrated in FIG. 3A can be used, for example. To an input terminal (IN) of the circuit, an output terminal of the comparator circuit 17 is electrically connected. To an output terminal (OUT) of the circuit, a wiring 93 (OUT3) is electrically connected. The potential of the determination output circuit 18 is reset in response to a JRES signal on a selected row basis, and then the determination result of the comparator circuit 17 is output to the circuit 16.

Figure 3B:
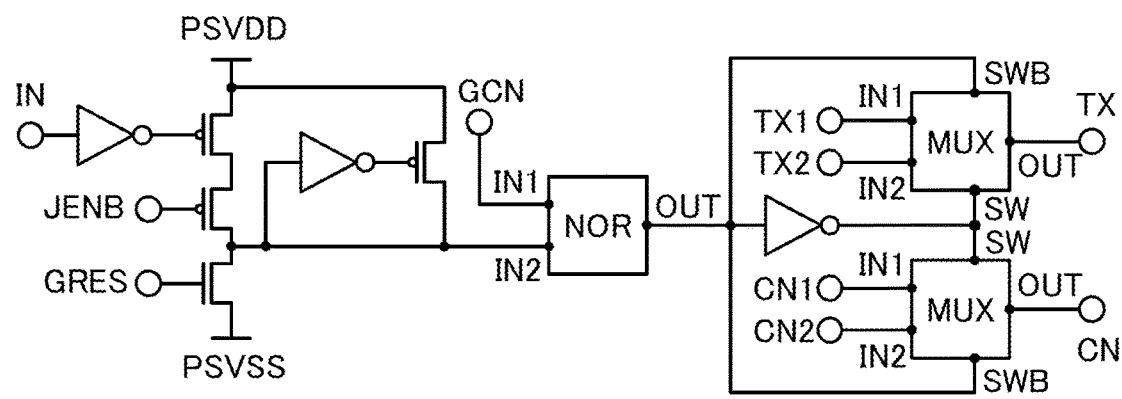

As the circuit 16, a circuit illustrated in FIG. 3B can be used, for example. To an input terminal (IN) of the circuit, the wiring 93 (OUT3) is electrically connected. The number of output terminals (OUT) of the circuit is two; one of them is electrically connected to the wiring 61 (TX), and the other is electrically connected to the wiring 64 (CN). A signal input to one of a terminal TX1 and a terminal TX2 is output from the circuit to the wiring 61 (TX). A signal input to one of a terminal CN1 and a terminal CN2 is output from the circuit to the wiring 64 (CN). Note that a control signal may be input to a terminal GCN in order that signals output from the wiring 61 (TX) and the wiring 64 (CN) can be fixed. In the case where it is determined that the node FD is saturated with electrons, a signal output from the determination output circuit 18 is held in the circuit 16 because the circuit 16 has a latch function. Therefore, the signal is held even in the case where the determination is repeated to the last row.

Figure 4:
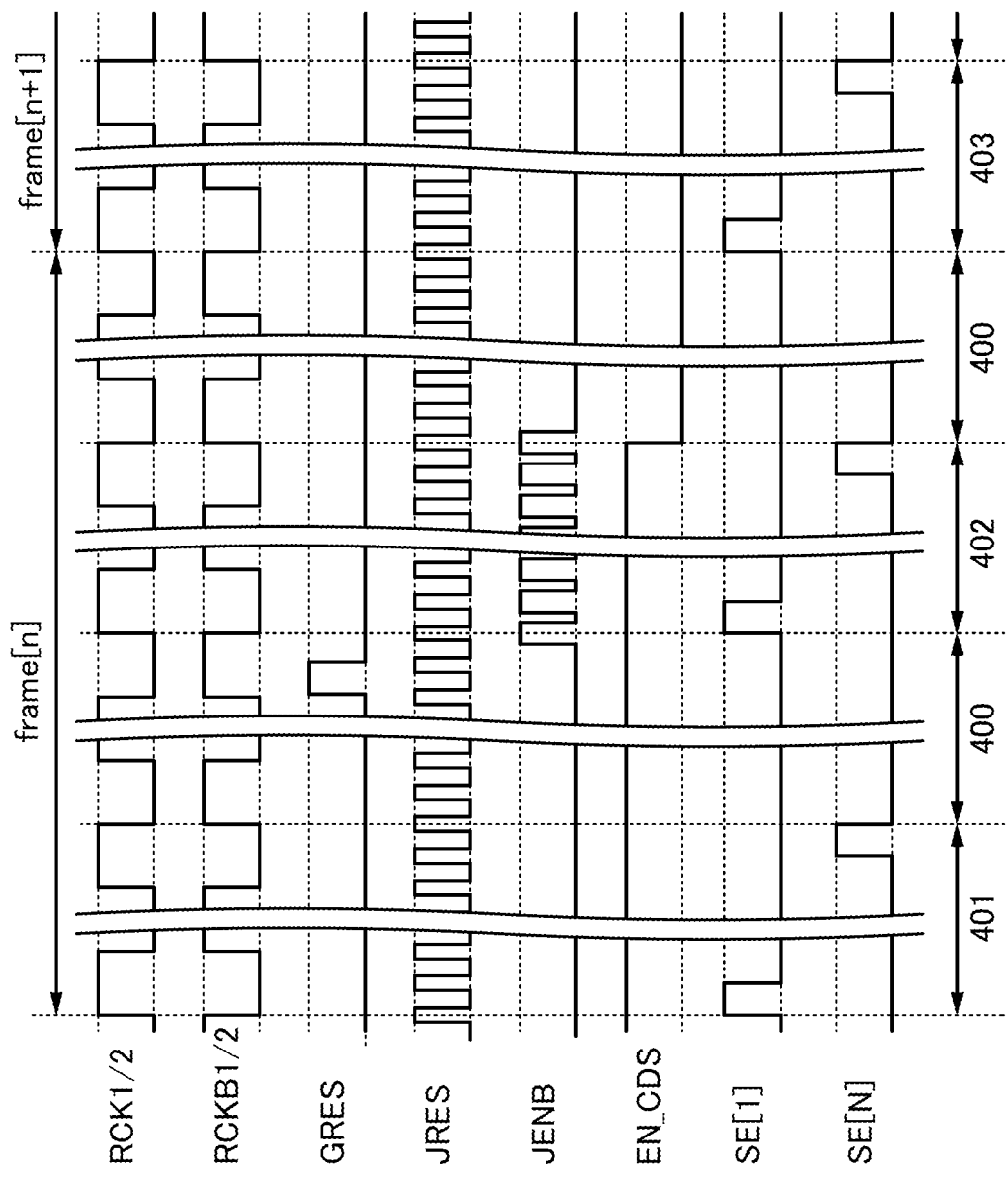
FIG. 4 is a timing chart showing operations of a determination output circuit and a pixel control circuit.

The above circuit can be driven as shown in a timing chart of FIG. 4. In FIG. 4, RCK1/2 and RCKB1/2 refer to a clock signal and an inverted clock signal, respectively, that are input to the circuit 12 (row driver); JRES refers to a signal input to the circuit illustrated in FIG. 3A; GRES and JENB refer to signals input to the circuit illustrated in FIG. 3B; EN_CDS refers to a signal input to a gate of the transistor 53 in the circuit 13; SE[1] refers to a signal input to the wiring 65 in the pixels 10 in the first row; and SE[N] refers to a signal input to the wiring 65 in the pixels 10 in the last row.

A period denoted by frame[n] corresponds to a period of an n-th (n is a natural number of 2 or more) frame. In the n-th frame, a period 401 corresponds to a period during which data of an (n−1)-th frame is read out, a period 402 corresponds to a period during which the first imaging data is read out and determination is performed, and a period 400 corresponds to a period during which the row driver does not operate. A period 403 in an (n+1)-th frame corresponds to a period during which data of the n-th frame is read out.

Next, the operation of the pixel 10 in FIG. 1 will be described with reference to a flow chart shown in FIG. 5 and a timing chart shown in FIG. 6. The imaging device of one embodiment of the present invention operates in a global shutter system. The operation in one frame is roughly divided into the capture of the first imaging data, the determination using the first imaging data, the capture of the second imaging data, and the reading of imaging data in the previous frame. Note that the capture of the first imaging data and the reading of the imaging data in the previous frame are performed concurrently.

Figure 5:
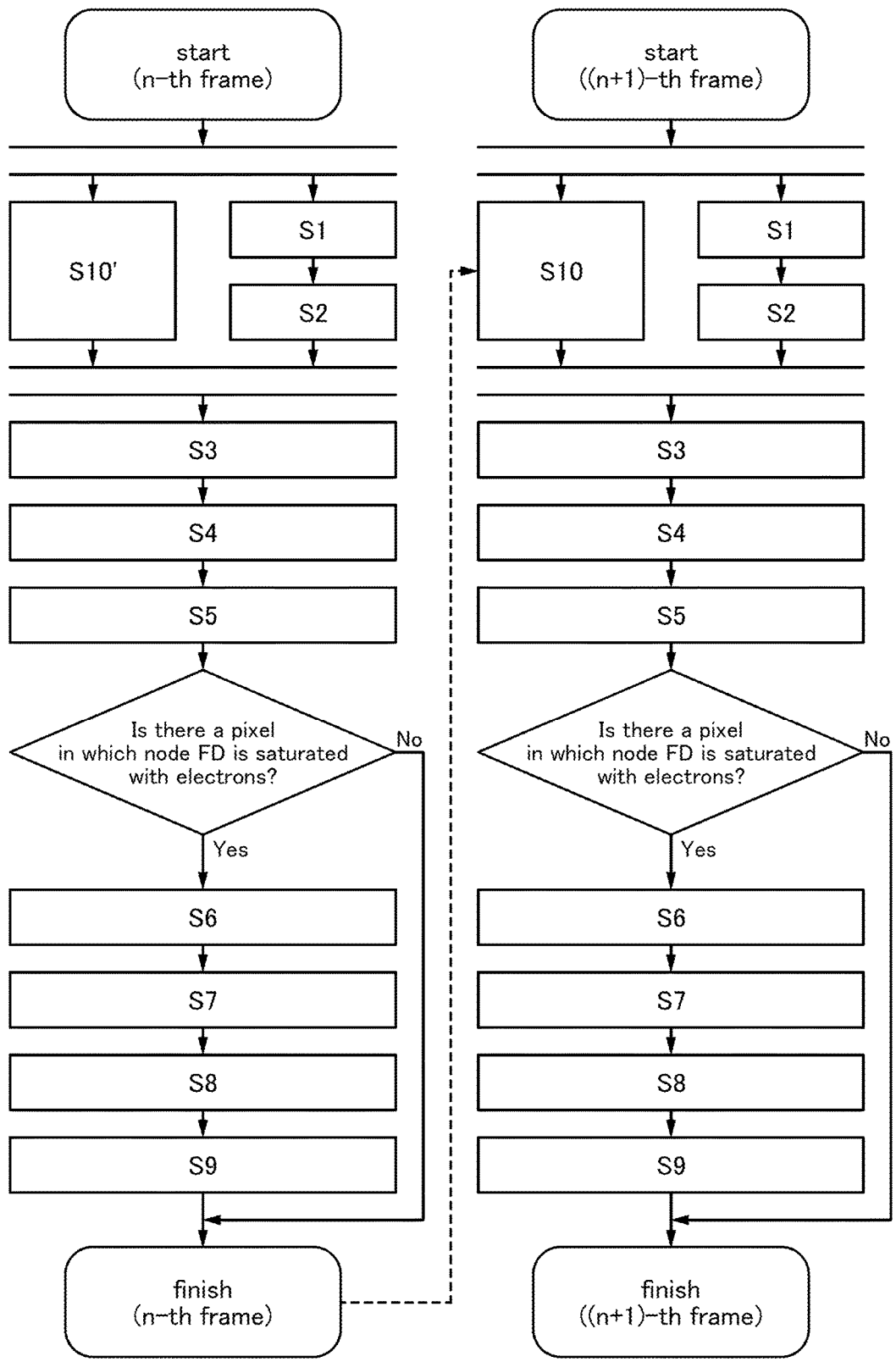
FIG. 5 is a flow chart showing an operation of an imaging device.
Figure 6:
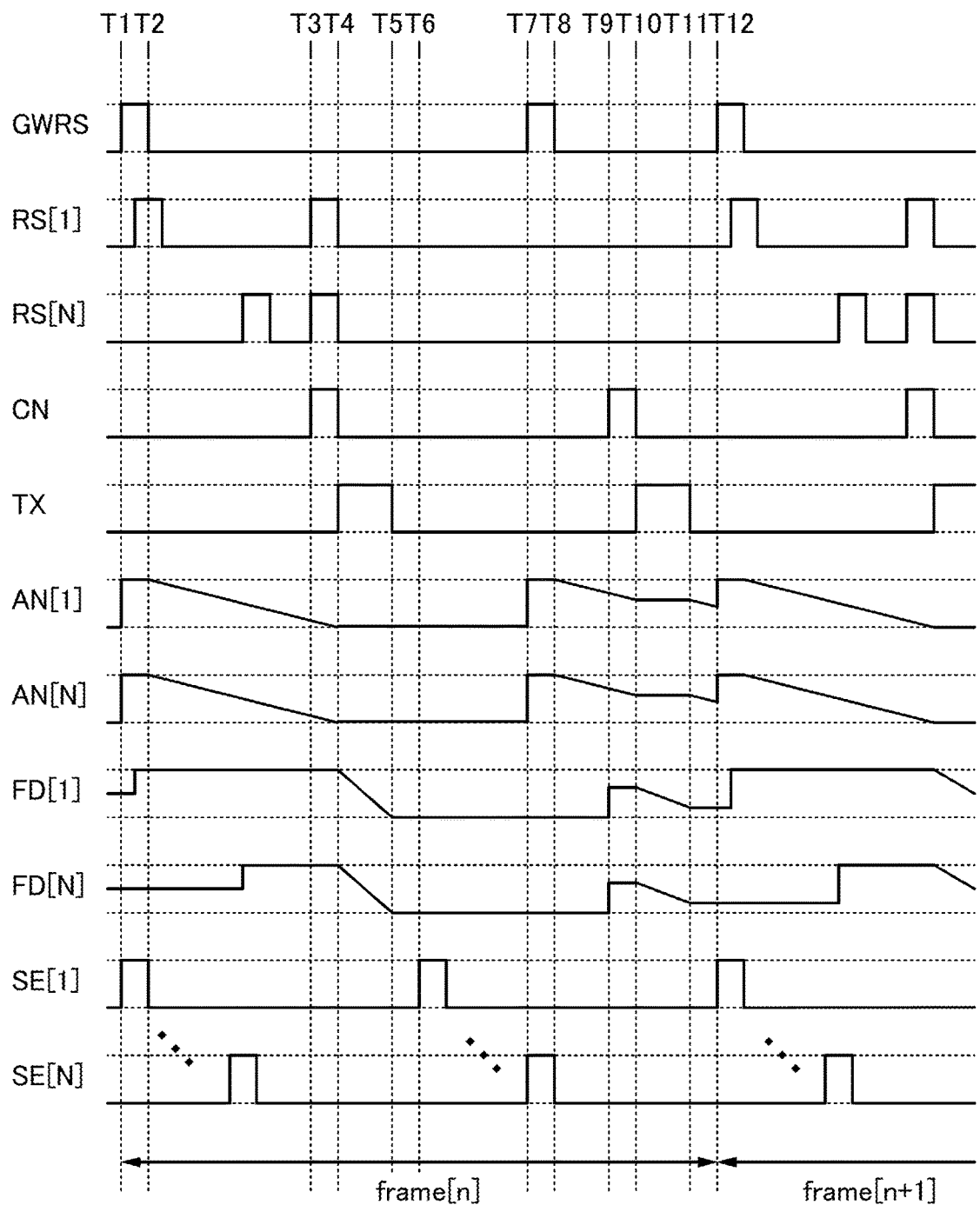
FIG. 6 is a timing chart showing an operation of an imaging device.

In FIG. 5 and FIG. 6, the n-th frame, a given frame, is used as a reference for the description. The wiring 71 (VPD) and the wiring 73 (VSS) are set at a low potential ("L"), and the wiring 72 (VRS) and the wiring 74 (VPI) are set at a high potential ("H").

In FIG. 6, GWRS refers to the potential of the wiring 62 (GWRS), RS[1] refers to the potential of the wiring 63 (RS) in the specific pixel 10 in the first row, RS[N] refers to the potential of the wiring 63 (RS) in the specific pixel 10 in the last row, CN refers to the potential of the wiring 64 (CN), TX refers to the potential of the wiring 61 (TX), AN[1] refers to the potential of the node AN in the specific pixel 10 in the first row, AN[N] refers to the potential of the node AN in the specific pixel 10 in the last row, FD[1] refers to the potential of the node FD in the specific pixel 10 in the first row, and FD[N] refers to the potential of the node FD in the specific pixel 10 in the last row.

First, the capture of the first imaging data and the reading of the imaging data captured in the previous frame will be described.

The length of time for light exposure in the mode for capturing the first imaging data is relatively long, and an image with a wide dynamic range is obtained in an environment with low illuminance. However, the node FD is saturated with electrons in an environment with high illuminance because of the relatively long light exposure time. In the example of the timing chart in FIG. 6, the node FD is saturated with electrons, which is determined with the use of the first imaging data.

At Time T1, GWRS is set at "H", and thus AN[1:N] are reset to "H" (the potential of the wiring 72 (VRS)) (S1).

At Time T2, GWRS is set at "L", and thus AN[1:N] start decreasing depending on illuminance (first-time light exposure, S2).

At Time T3, RS[1:N] are set at "H" and CN is set at "H", and thus FD[1:N] are reset to "H" (the potential of the wiring 72 (VRS)) (S3). At this time, the capacitor C2 is electrically connected to the node FD through the transistor 44.

At Time T4, RS[1:N] are set at "L", CN is set at "L", and TX is set at "H"; thus, the electrical connection between the node FD and the capacitor C2 is cut, and the reset potential of the node FD is held in the capacitor C2. The potential of the node AN is transferred to the node FD, so that the potential of the node FD starts decreasing (S4).

At Time T5, TX is set at "L", and thus FD[1:N] are held. The steps up to here correspond to the operation of capturing the first imaging data.

Here, during a period from Time T1 to Time T3, SE[1] to SE[N] are sequentially set at "H" for a certain period, and imaging data which has been determined in the (n−1)-th frame is read out (S10'). In other words, the operation of capturing the first imaging data in the n-th frame and the operation of reading the imaging data which has been determined in the (n−1)-th frame are performed concurrently. In this manner, imaging data is read out in the following frame, whereby the length of time for light exposure can be long even in a global shutter system. Therefore, an image with a wide dynamic range and little noise can be obtained even under low illuminance.

Figure 7A:
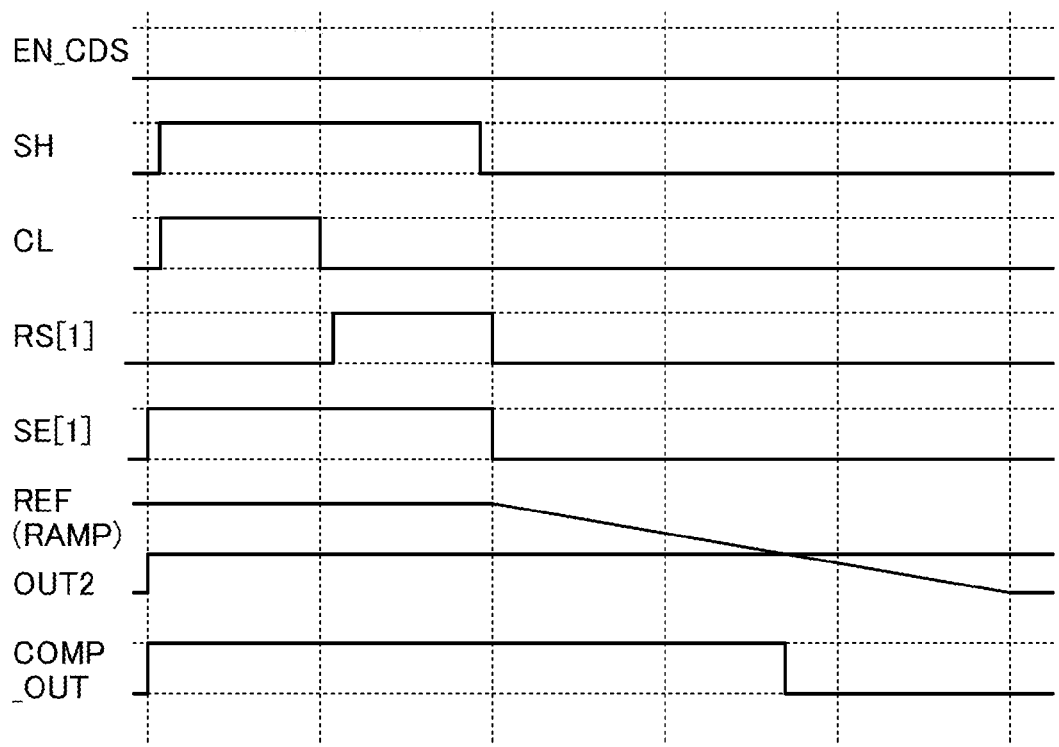
FIGS. 7A and 7B are timing charts showing operations of a CDS circuit and a comparator circuit.

FIG. 7A is a timing chart showing the operation of reading imaging data in the first row. Note that SH refers to the potential supplied to a gate of the transistor 52 in the circuit 13, CL refers to the potential supplied to a gate of the transistor 51 in the circuit 13, REF (RAMP) refers to the reference potential supplied to the comparator circuit 17, OUT2 refers to the potential of the wiring 92 (OUT2), and COMP_OUT refers to the potential of the output terminal of the compactor circuit 17.

In FIG. 6, RS[1] to RS[N] are sequentially set at "H" for a certain period before Time T3 and thus the potential of the node FD is reset; this operation accompanies the operation of the circuit 13 illustrated in FIG. 7A.

Next, the determination using the first imaging data and the operation based on the determination result will be described.

During a period from Time T6 to Time T8, SE[1] to SE[N] are sequentially set at "H" for a certain period: thus, the first imaging data is read out on a row basis, and whether the node FD is saturated with electrons is determined in each of the pixels that can be effectively used (S5).

Figure 7B:
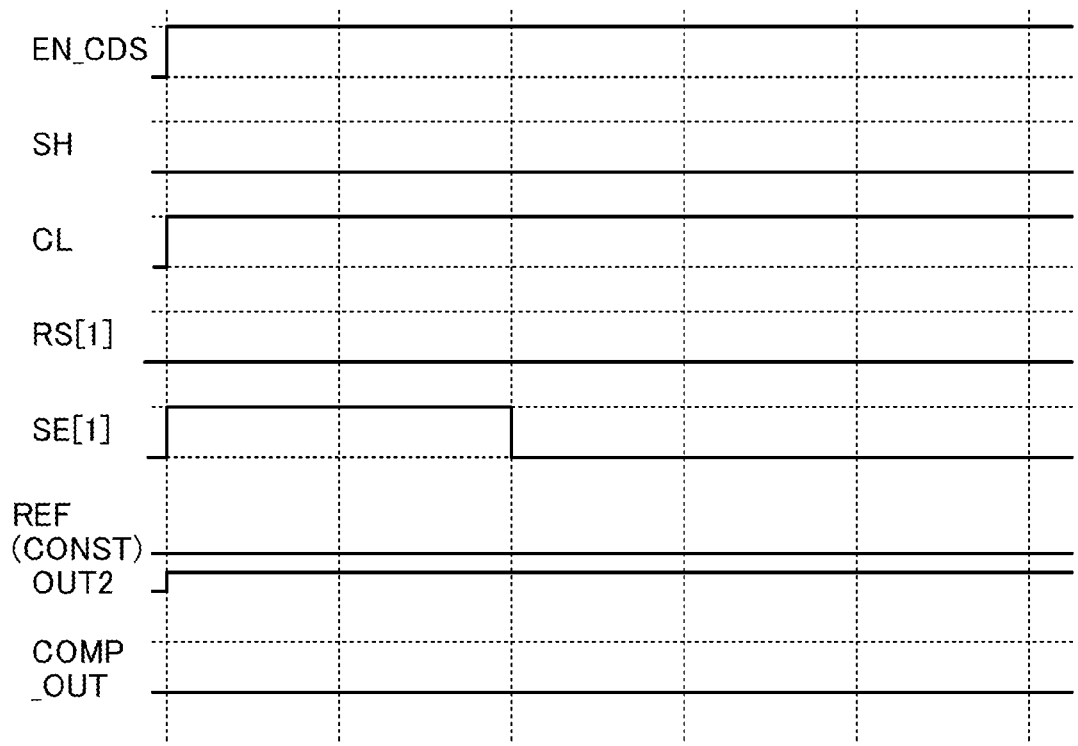

FIG. 7B is a timing chart showing the operation of reading the first imaging data in the period from Time T6 to Time T8. In the period during which the first imaging data is read out, EN_CDS is set at "H" and CL is set at "H"; thus, a signal output from the pixel 10 bypasses the circuit 13 to be input to the comparator circuit 17. Note that REF (CONST) is made constant, which is slightly higher than the potential output to the wiring 91 (OUT1) when the node FD is saturated with electrons. With such an operation, whether the node FD is saturated with electrons can be determined on the basis of the output from the comparator circuit 17. In the example of FIG. 7B, the node FD in the specific pixel 10 that is selected is saturated with electrons, and "L" is output from the output terminal of the comparator circuit 17. Note that EN_CDS may be set at "L" so that the first imaging data is read out without the signal output from the pixel 10 bypassing the circuit 13. In this case, "H" is output from the output terminal of the comparator circuit 17.

At this time, the first imaging data is used for determining whether the node FD is saturated with electrons, and is not output to the outside. Therefore, the operation of an output circuit such as the circuit 15 (column driver) needed for external output may be stopped.

The determination result using the first imaging data is output to the circuit 16 through the determination output circuit 18. Here, the output terminal of the determination output circuit 18 in each column is connected to the wiring 93 (OUT3); thus, in the case where it is determined that the node FD in at least one of all the pixels 10 is saturated with electrons, CN and TX in the circuit 16 are set at "H" at a specified time and the operation for capturing the second imaging data starts. The steps up to here correspond to the operation of determining using the first imaging data and the operation based on the determination result.

Next, the capture of the second imaging data will be described. Note that the light exposure time in the mode for capturing the second imaging data is relatively short, and an image with a wide dynamic range can be obtained in an environment with high illuminance.

The light exposure for capturing the second imaging data may be performed regardless of the determination result using the first imaging data or before all the determination results are obtained. For example, as shown in FIG. 6, GWRS is set at "H", and AN[1:N] are reset at Time T7 (S6). Then, GWRS is set at "L" at Time T8, and second-time light exposure is performed before Time T10 (S7). In order to prevent the node FD from being saturated with electrons, the length of time for the second-time light exposure is made shorter than that for the first-time light exposure.

At Time T9 before the completion of the second-time light exposure, CN is set at "H" by the operation of the circuit 16; thus, the transistor 44 is turned on and the node FD and the capacitor C2 are electrically connected to each other again.

Just before Time T9, the node FD is saturated with electrons, that is, the voltage is 0 V; however, at Time T9, the capacitor C2 holding the reset potential of the node FD is electrically connected to the node FD, and thus the accumulated electrons are divided so that the potential of the node FD is increased (S8).

At Time T10, CN is set at "L" and TX is set at "H" by the operation of the circuit 16; thus, the potential of the node AN is transferred to the node FD (S9).

At Time T11, TX is set at "L", and thus FD[1:N] are held. The steps up to here correspond to the operation of capturing the second imaging data. Note that the second imaging data is read out as n-th frame imaging data in the (n+1)-th frame (S10).

Figure 8:
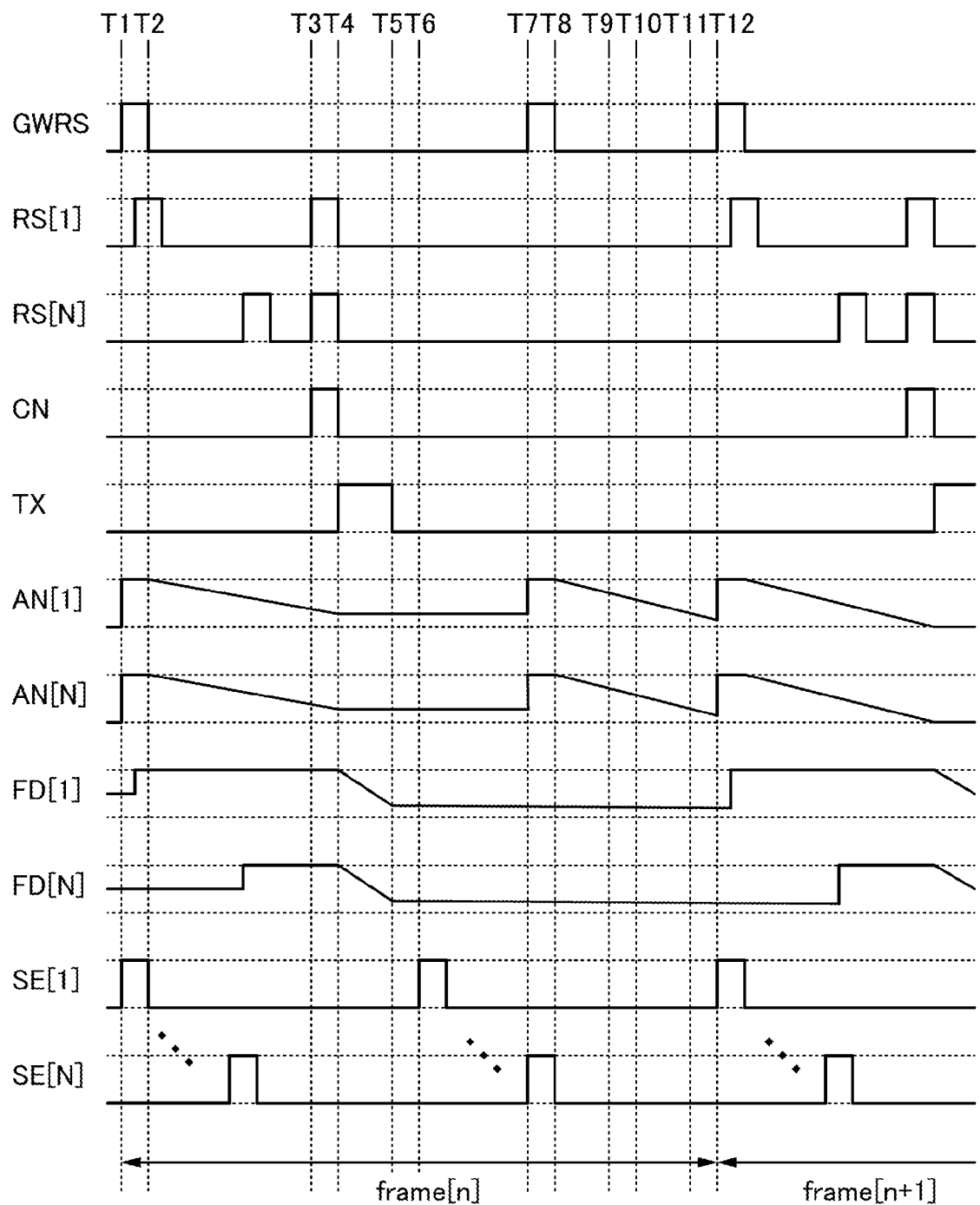
FIG. 8 is a timing chart showing an operation of an imaging device.

FIG. 8 is a timing chart showing the case where it is determined that the node FD is not saturated with electrons with the use of the first imaging data. In the case where the node FD is not saturated with electrons in each of the pixels 10, the circuit 16 does not perform the operation of setting CN and TX at "H". That is, the operation for capturing the second imaging data does not start. Therefore, data captured as the first imaging data is read out as it is. In the case where it is determined that the node FD is not saturated with electrons, the operation of setting GWRS at "H" during a period from Time T7 to Time T8 may be made void in order that the second-time light exposure is not performed.

As described above, the imaging device of one embodiment of the present invention operates in a global shutter system. Therefore, in the case where it is determined that the node FD in at least one of all the pixels 10 is saturated with electrons, the operation for capturing the second imaging data starts and thus the second imaging data is captured in all the pixels 10.

With the above operation, the second imaging data can be automatically captured as needed; even in the case of imaging with a view where brightness and darkness are mixed, the gray level of a bright portion can be kept. That is, an image with a wide dynamic range can be obtained. Furthermore, even under low illuminance, an image with little noise and a wide dynamic range can be obtained because the gray level can be kept.

Figure 9:
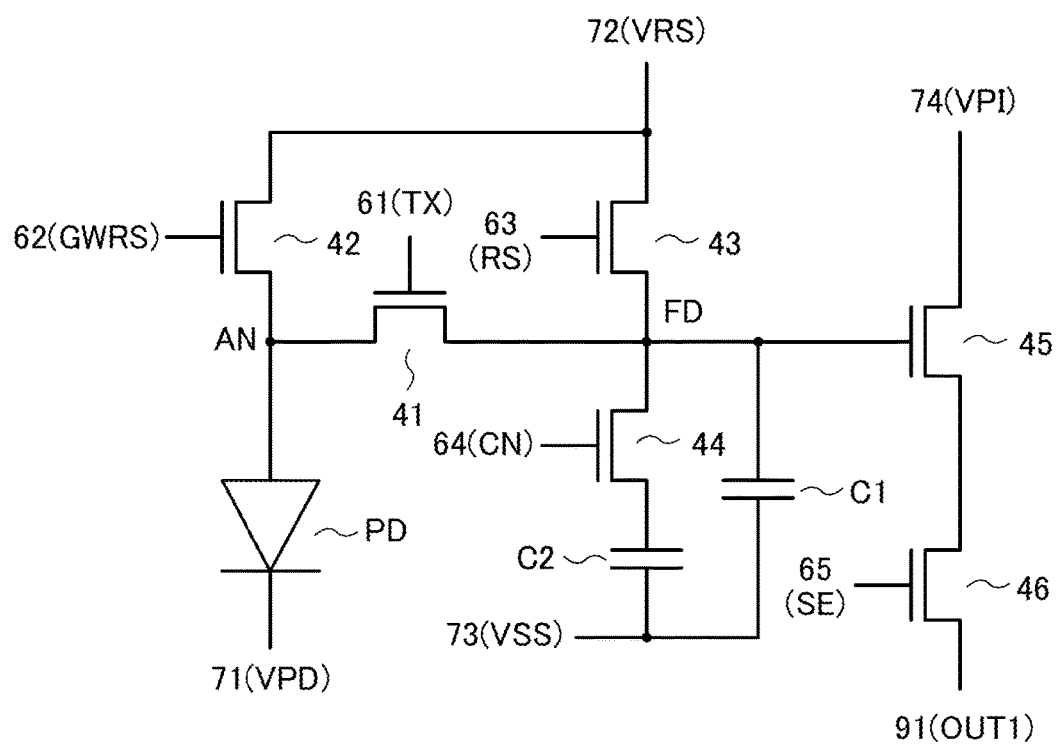
FIG. 9 illustrates a pixel circuit.
Figure 11:
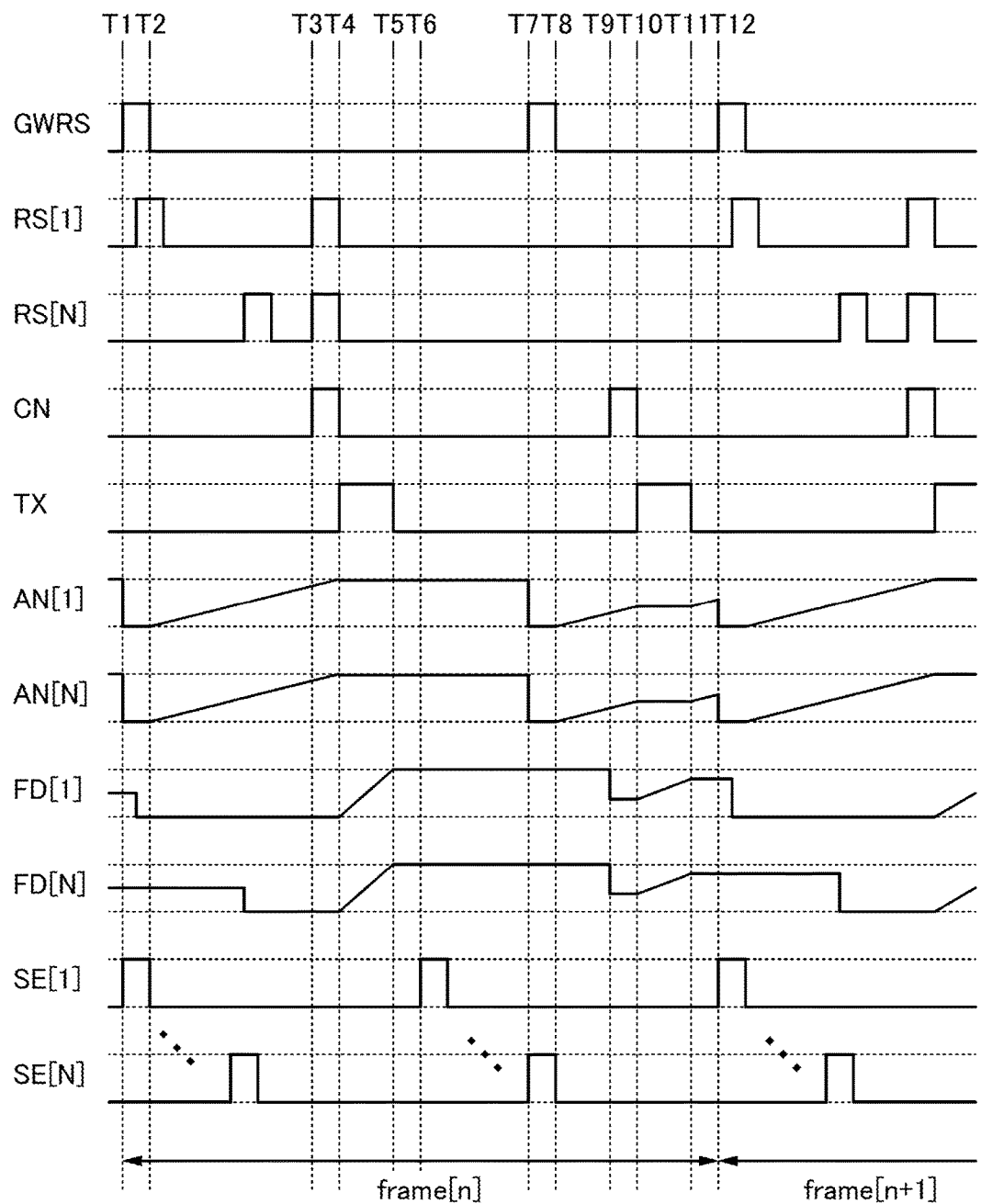
FIG. 11 is a timing chart showing an operation of an imaging device.

The pixel 10 may have a configuration illustrated in FIG. 9. The pixel 10 illustrated in FIG. 9 is different from that illustrated in FIG. 1 in the connection direction of the photoelectric conversion element PD. The pixel 10 illustrated in FIG. 9 can operate according to a timing chart of FIG. 11 (with the operation of capturing the second imaging data) or FIG. 12 (without the operation of capturing the second imaging data). In this case, the wiring 71 (VPD) and the wiring 74 (VPI) are each set at a high potential ("H"), and the wiring 72 (VRS) and the wiring 73 (VS S) are each set at a low potential ("L").

In this case, the node AN and the node FD are saturated with electrons when the potentials are reset, and they are insufficient in electrons under high illuminance. Therefore, the potentials of the node AN and the node FD are changed so as to be inverted to those in the above operation of the pixel 10 illustrated in FIG. 1.

Figure 10A:
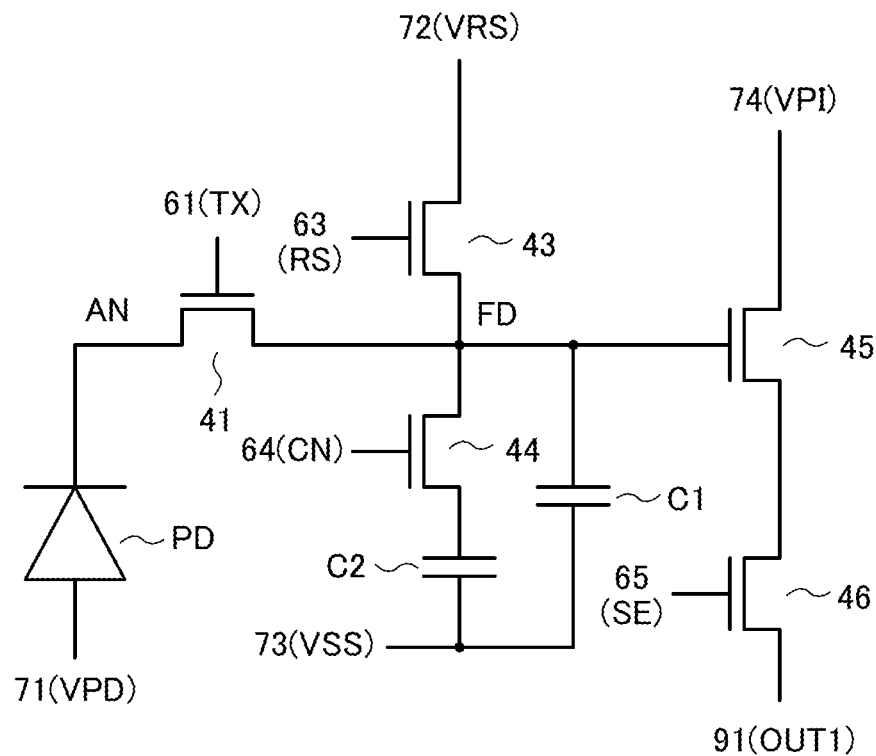
FIGS. 10A and 10B each illustrate a pixel circuit.
Figure 10B:
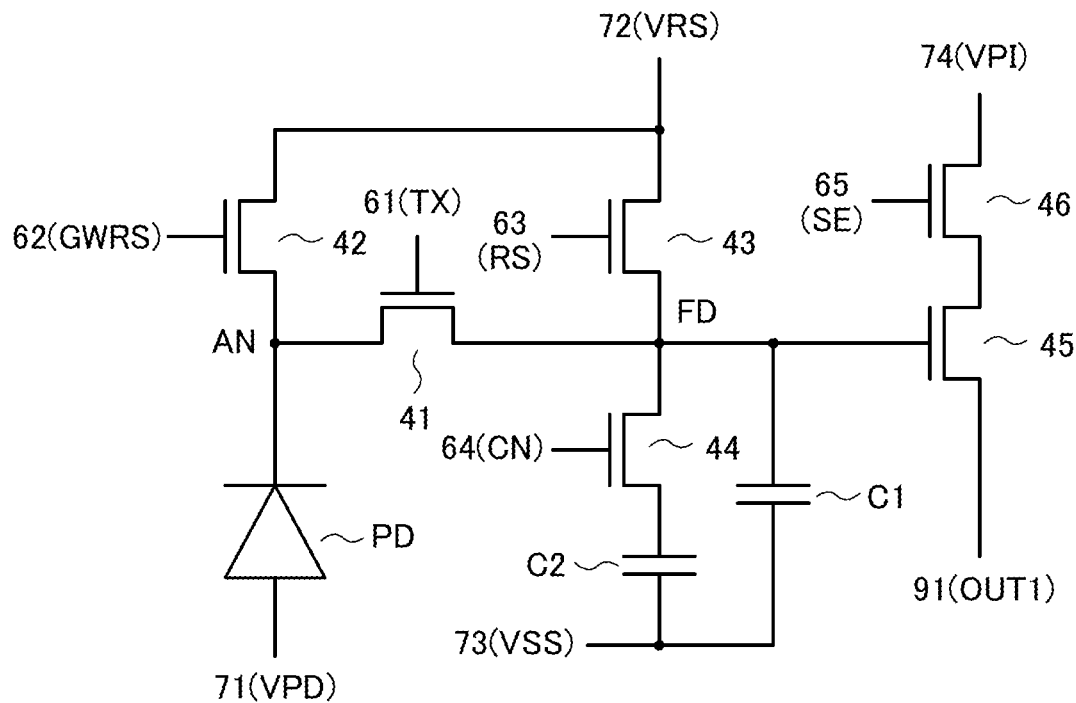

Alternatively, the pixel 10 may have a configuration illustrated in FIG. 10A or FIG. 10B. In the configuration of FIG. 10A, the transistor 42 is not provided. In this configuration, the wiring 71 (VPD) is set at a high potential, whereby the potential of the node AN can be reset. In the configuration of FIG. 10B, one of the source and the drain of the transistor 45 is connected to the wiring 91 (OUT).

Figure 13A:
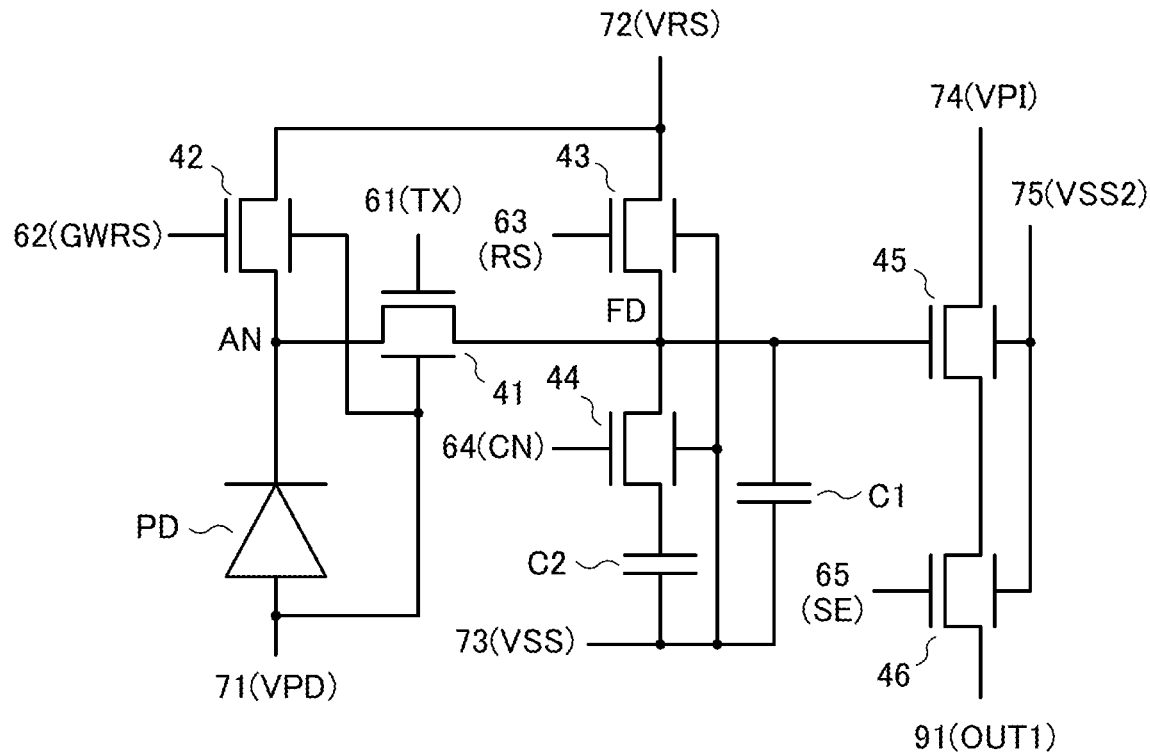
FIGS. 13A and 13B each illustrate a pixel circuit.
Figure 13B:
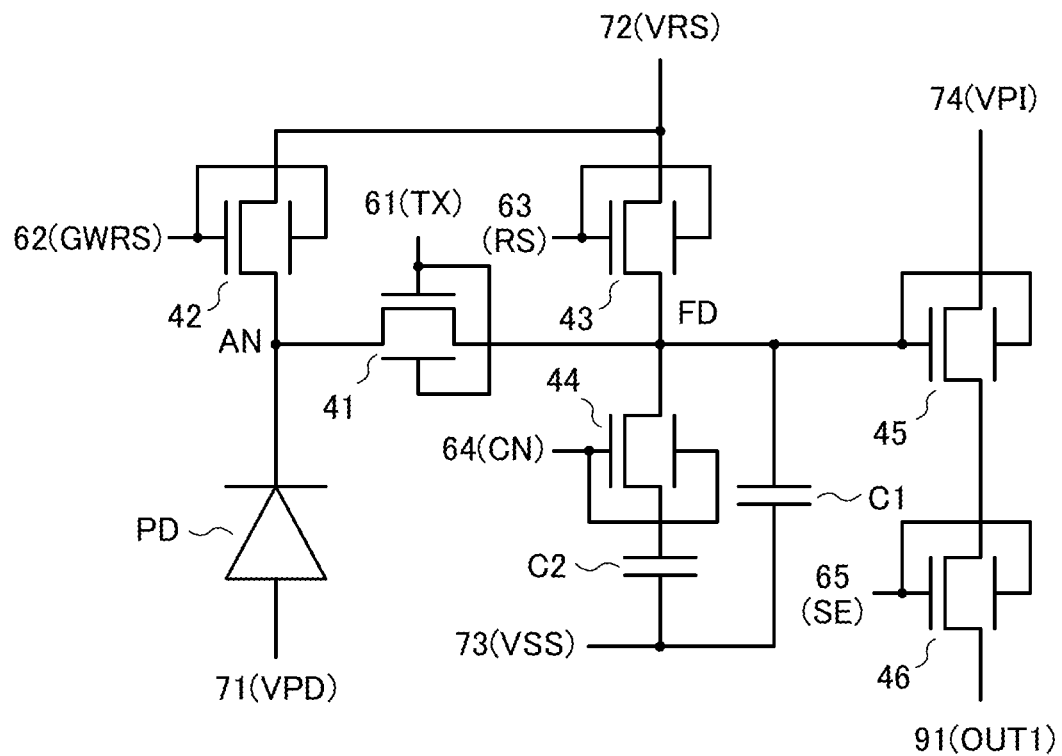

The transistors 41 to 46 in the pixel 10 may each have a back gate as illustrated in FIGS. 13A and 13B. FIG. 13A illustrates a configuration in which a constant potential is applied to the back gates, which enables control of the threshold voltages. The back gates are connected to the wiring 71 (VPD), the wiring 73 (VSS), and a wiring 75 (VSS2) through which a low potential is supplied in the example of FIG. 13A, but may be connected to one of them. FIG. 13B illustrates a configuration in which the same potential is applied to the front gate and the back gate, which enables an increase in on-state current and a decrease in off-state current. The configurations of FIGS. 13A and 13B and the like may be combined such that desired transistors can have appropriate electrical characteristics. Note that a transistor without a back gate may be provided. Note that any of the configurations of FIG. 9, FIGS. 10A and 10B, and FIGS. 13A and 13B can be combined as necessary.

Figure 14:
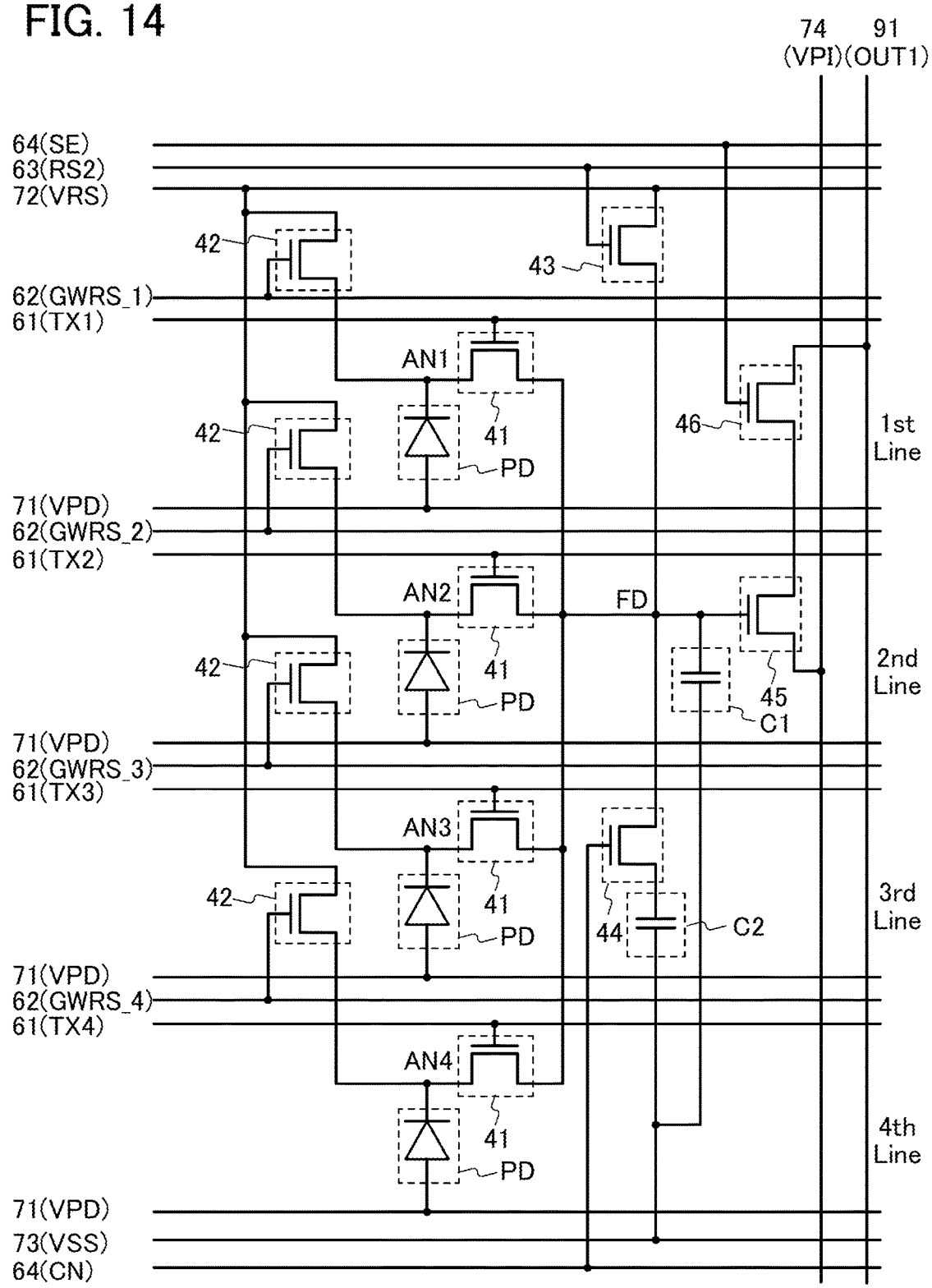
FIG. 14 illustrates a pixel circuit.

Note that the pixel 10 may have a configuration in which the transistors 43 to 46 are shared among a plurality of pixels as illustrated in FIG. 14. FIG. 14 illustrates a configuration in which the transistors 43 to 46 are shared among a plurality of pixels in the perpendicular direction; however, the transistors 43 to 46 may be shared among a plurality of pixels in the horizontal direction or in the horizontal and perpendicular directions. With such a configuration, the number of transistors included in one pixel can be reduced.

Although FIG. 14 illustrates a configuration in which the transistors 43 to 46 are shared among four pixels, the transistors 43 to 46 may be shared among two pixels, three pixels, or five or more pixels. Note that this configuration can be optionally combined with any of the configurations in FIG. 9, FIGS. 10A and 10B, and FIGS. 13A and 13B.

Figure 15A:
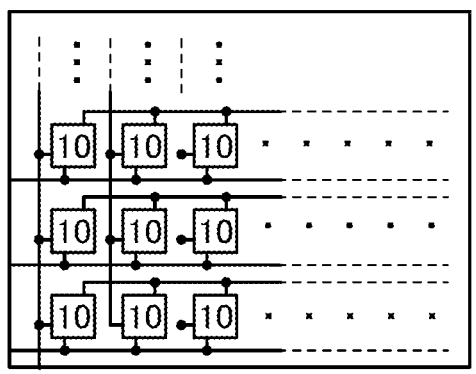
FIGS. 15A to 15C are top views and a front view illustrating a structure of an imaging device.
Figure 15B:
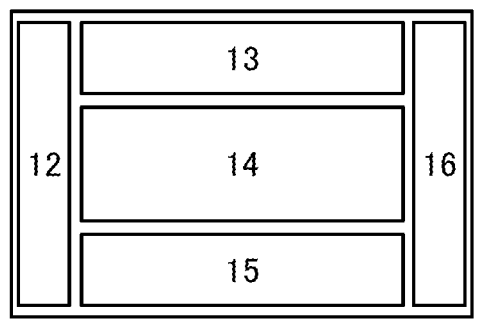
Figure 15C:
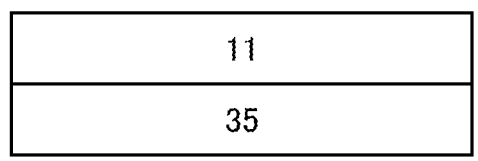

In an imaging device of one embodiment of the present invention, a layered structure of the pixel array 11 and a substrate 35 provided with the circuits 12 to 16 can be employed. For example, such a layered structure of the pixel array 11 and the substrate 35 as is illustrated in the front view of FIG. 15C can be employed; the pixel array 11 has the top view of FIG. 15A, and the substrate 35 has the top view of FIG. 15B. With such a structure, transistors suitable for respective elements can be used, and the area of an imaging device can be small. Note that the layout of the circuit in FIG. 15B is one example, and another layout may be used.

The circuits 12 to 16 are preferably formed using transistors including silicon (hereinafter referred to as Si transistors) in order to achieve both high-speed operation and the structure of a CMOS circuit. For example, a silicon substrate is used as the substrate 35, over which the above circuits are formed. The pixel array 11 is preferably formed using transistors including an oxide semiconductor (hereinafter referred to as OS transistors). Note that some of the transistors included in the circuits 12 to 16 may be provided on the same surface as the pixel array 11.

Figure 16A:
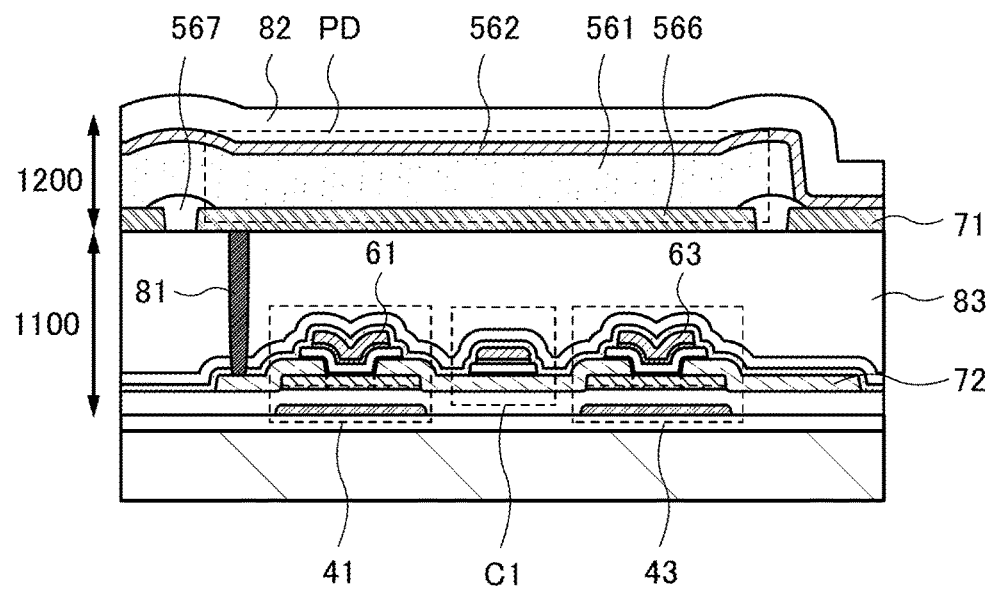
FIGS. 16A to 16C are cross-sectional views illustrating structures of an imaging device.

Next, specific structure examples of an imaging device of one embodiment of the present invention are described below with reference to drawings. A cross-sectional view of FIG. 16A illustrates an example of specific connection between the photoelectric conversion element PD, the transistors 41 and 43, and the capacitor C1 which are included in the pixel 10 in FIG. 1. Note that the transistors 42, 44, 45, and 46 and the capacitor C2 are not illustrated in FIG. 16A. The transistors 41 to 46 and the capacitors C1 and C2 can be provided in a layer 1100, and the photoelectric conversion element PD can be provided in a layer 1200.

Although the wirings, the electrodes, and contact plugs (conductors 81) are illustrated as independent components in cross-sectional views in this embodiment, some of them are provided as one component in some cases when they are electrically connected to each other. In addition, a structure in which the wiring is connected to the electrode through the conductor 81 is only an example, and the wiring may be directly connected to the electrode.

Insulating layers 82 and 83 and the like that function as protective films, interlayer insulating films, or planarization films are provided over the components. For example, an inorganic insulating film such as a silicon oxide film or a silicon oxynitride film can be used as each of the insulating layers 82 and 83 and the like. Alternatively, an organic insulating film such as an acrylic resin film or a polyimide resin film may be used. Top surfaces of the insulating layers 82 and 83 and the like are preferably planarized by chemical mechanical polishing (CMP) or the like as necessary.

In some cases, one or more of the wirings and the like illustrated in the drawing are not provided or a wiring, a transistor, or the like that is not illustrated in the drawing is included in each layer. In addition, a layer that is not illustrated in the drawing might be included. Furthermore, one or more of the layers illustrated in the drawing are not included in some cases.

It is preferable that OS transistors with low off-state current be used for the transistors 41 to 46 which are components of the pixel 10. Extremely low off-state current characteristics of the OS transistor can widen the dynamic range of imaging. In the circuit configuration of the pixel 10 illustrated in FIG. 1, an increase in the intensity of light entering the photoelectric conversion element PD reduces the potentials of the nodes AN and FD. Since the OS transistor has extremely low off-state current, a current based on a gate potential can be accurately output even when the gate potential is extremely low. Thus, it is possible to widen the detection range of illuminance, i.e., the dynamic range.

A period during which charge can be held in the nodes AN and FD can be extremely long owing to the low off-state current characteristics of the transistors 41 to 44. Therefore, a global shutter system in which accumulation operation is performed in all the pixels at the same time can be used without a complicated circuit structure and operation method. Note that the imaging device of one embodiment of the present invention can also operate in a rolling shutter system.

The method of operating an imaging device is described with reference to FIGS. 17A to 17C. Note that in FIGS. 17A to 17C, "E" represents a period during which light exposure operation is performed and "R" represents a period during which reading operation is performed. Furthermore, n represents an n-th frame (n is a natural number of two or more). Moreover, n−1 represents a frame previous to the n-th frame, and n+1 represents a frame following the n-th frame. Line[1] represents a first row of the pixel array 11, and Line[M] represents an M-th row of the pixel array 11 (M is a natural number of four or more in FIGS. 17A to 17C).

Figure 17A:
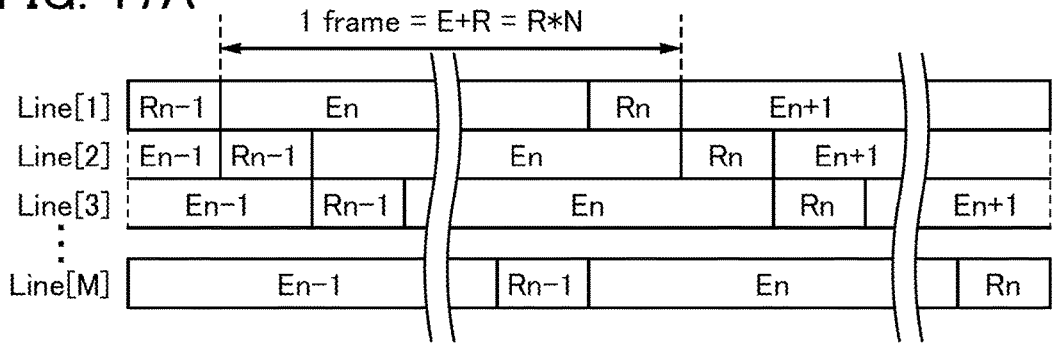
FIGS. 17A to 17C each show an operation of an imaging device.

FIG. 17A is a schematic view showing the operation method of a rolling shutter system. In the rolling shutter system, light exposure and data reading are performed row by row. Since imaging cannot be simultaneously performed on all pixels, distortion is caused to an image when a moving object is imaged.

Figure 17B:
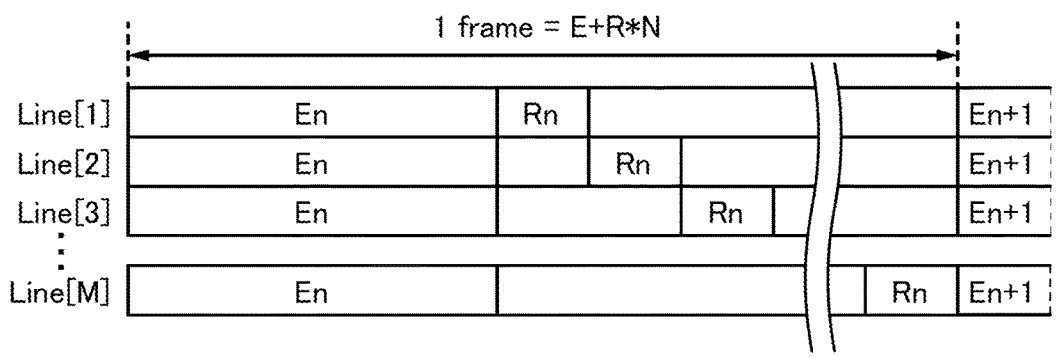

FIG. 17B is a schematic view showing the operation method of a normal global shutter system. In the global shutter system, light exposure is simultaneously performed on all pixels, and then data reading is performed row by row. Thus, an image without distortion can be obtained even when a moving object is imaged.

Figure 17C:
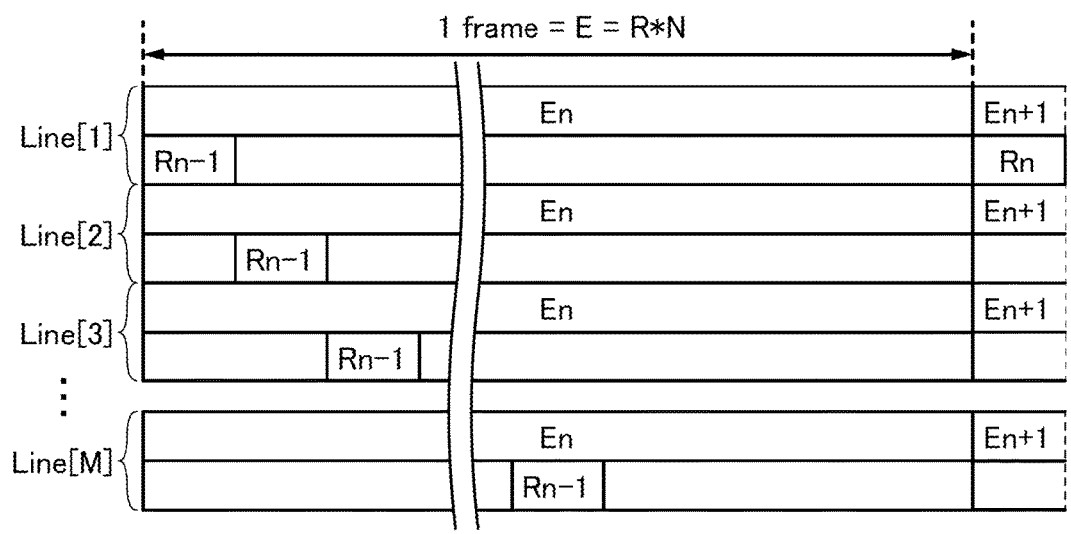

FIG. 17C is a schematic view showing an operation method applied to the imaging device of one embodiment of the present invention. In this operation method, light exposure is simultaneously performed on all pixels in the n-th frame, and data obtained in the n-th frame is read out in the (n+1)-th frame. Therefore, in one frame period, light exposure and data reading of one frame are not performed; thus, unlike in a conventional global shutter system, an increase in data reading time does not decrease light exposure time. That is, light exposure time can be long.

The OS transistor has lower temperature dependence of change in electrical characteristics than a transistor including silicon in an active region or an active layer, and thus can be used in an extremely wide range of temperatures. Therefore, an imaging device and a semiconductor device that include OS transistors are suitable for use in automobiles, aircrafts, and spacecrafts.

Moreover, the OS transistor has higher drain breakdown voltage than the Si transistor. A photoelectric conversion element including a selenium-based material in a photoelectric conversion layer preferably operates with the application of a relatively high voltage (e.g., 10 V or more) to utilize avalanche multiplication. Therefore, by combination of the OS transistor and the photoelectric conversion element including a selenium-based material in the photoelectric conversion layer, a highly reliable imaging device can be obtained.

Figure 16B:
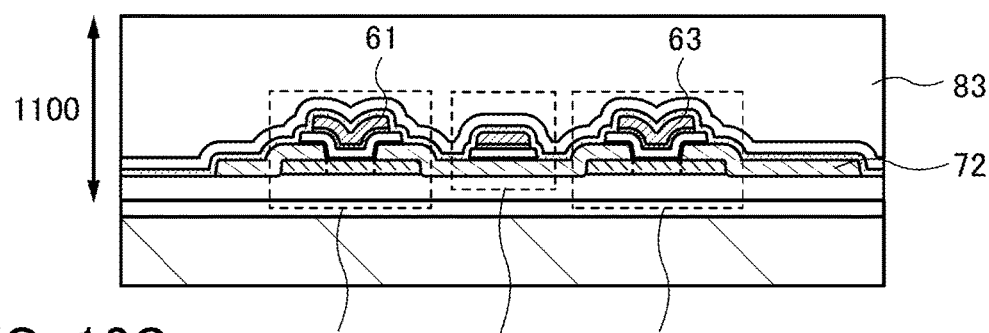
Figure 16C:
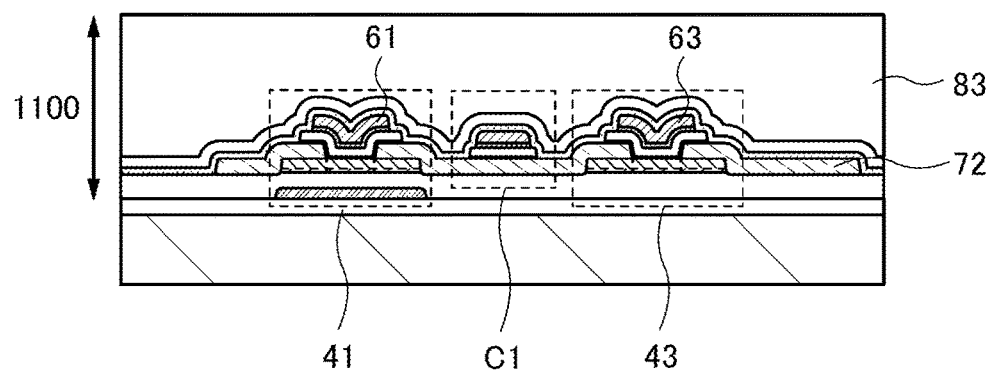

Note that although each transistor includes a back gate in FIG. 16A, each transistor does not necessarily include a back gate as illustrated in FIG. 16B. Alternatively, as illustrated in FIG. 16C, one or more transistors, for example, only the transistor 41 may include a back gate. The back gate might be electrically connected to a front gate of the transistor, which is provided to face the back gate. Alternatively, different fixed potentials might be supplied to the back gate and the front gate. Note that the presence or absence of the back gate can also be applied to another pixel described in this embodiment.

A variety of elements can be used as the photoelectric conversion element PD provided in the layer 1200. FIG. 16A illustrates the photoelectric conversion element PD including a selenium-based material for a photoelectric conversion layer 561. The photoelectric conversion element PD including a selenium-based material has high external quantum efficiency with respect to visible light. Furthermore, the selenium-based material has a high light-absorption coefficient, making the photoelectric conversion layer 561 thin easily. The photoelectric conversion element PD including a selenium-based material can be a highly sensitive sensor in which the amount of amplification of electrons is large because of avalanche multiplication. In other words, the use of a selenium-based material for the photoelectric conversion layer 561 allows a sufficient amount of photocurrent to be obtained even when the pixel area is reduced. Thus, the photoelectric conversion element PD including a selenium-based material is also suitable for imaging in a low-illuminance environment.

Amorphous selenium or crystalline selenium can be used as the selenium-based material. Crystalline selenium can be obtained by, for example, depositing amorphous selenium and then performing heat treatment. When the crystal grain size of crystalline selenium is smaller than a pixel pitch, variation in characteristics between pixels can be reduced. Moreover, crystalline selenium has higher spectral sensitivity to and a higher absorption coefficient for visible light than amorphous selenium.

Figure 18A:
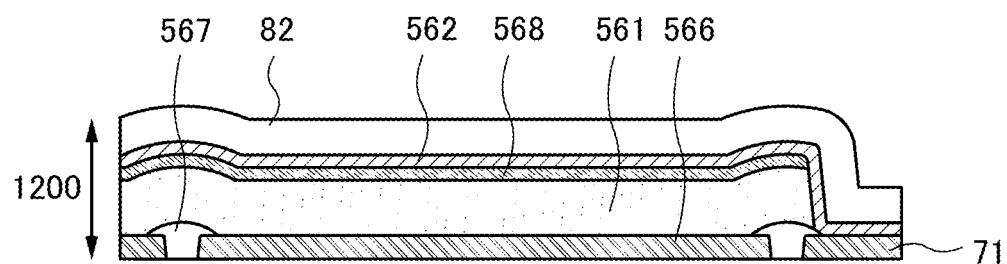
FIGS. 18A to 18C are cross-sectional views each illustrating a structure of a photoelectric conversion element.
Figure 18B:
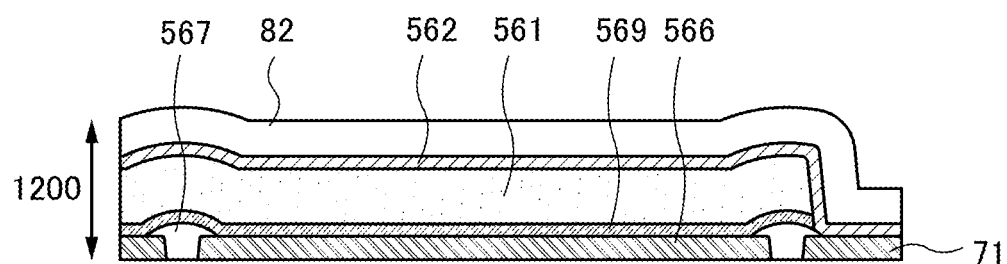
Figure 18C:
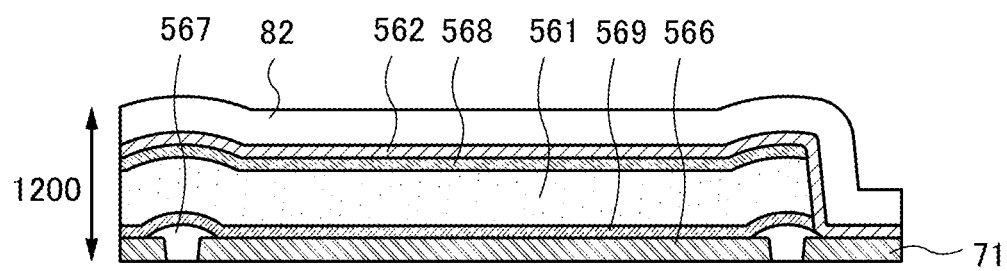

Although the photoelectric conversion layer 561 is illustrated as a single layer in FIG. 16A, gallium oxide, cerium oxide, an In—Ga—Zn oxide, or the like may be provided as a layer 568 for blocking hole injection on the light reception side as illustrated in FIG. 18A. Alternatively, as illustrated in FIG. 18B, nickel oxide, antimony sulfide, or the like may be provided as a layer 569 for blocking electron injection on an electrode 566 side. Further alternatively, as illustrated in FIG. 18C, the layer 568 for blocking hole injection and the layer 569 for blocking electron injection may be provided. The configurations illustrated in FIG. 1 and FIG. 9 are different from each other in the connection direction of the photoelectric conversion element PD; both of the configurations can be employed for the pixel 10. Thus, the layer 568 for blocking hole injection and the layer 569 for blocking electron injection in FIGS. 18A to 18C may be replaced with each other.

The photoelectric conversion layer 561 may be a layer including a compound of copper, indium, and selenium (CIS). Alternatively, a layer including a compound of copper, indium, gallium, and selenium (CIGS) may be used. A photoelectric conversion element including the CIS layer or the CIGS layer can also utilize avalanche multiplication like the photoelectric conversion element including a layer of selenium alone.

In the photoelectric conversion element PD using the selenium-based material, for example, the photoelectric conversion layer 561 can be provided between a light-transmitting conductive layer 562 and the electrode 566 formed using a metal material or the like. Furthermore, CIS and CIGS are p-type semiconductors, and an n-type semiconductor such as cadmium sulfide or zinc sulfide may be provided in contact with the p-type semiconductor in order to form a junction.

Figure 19A:
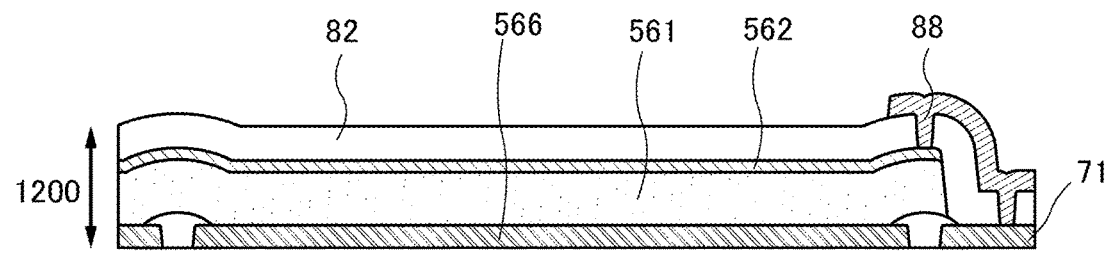
FIGS. 19A to 19D are cross-sectional views each illustrating connection of a photoelectric conversion element.
Figure 19B:
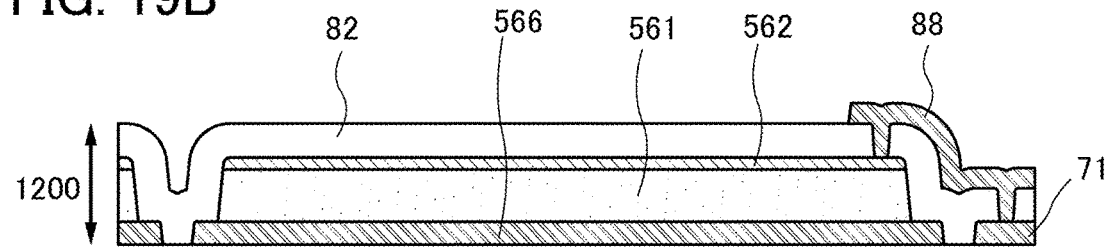
Figure 19C:
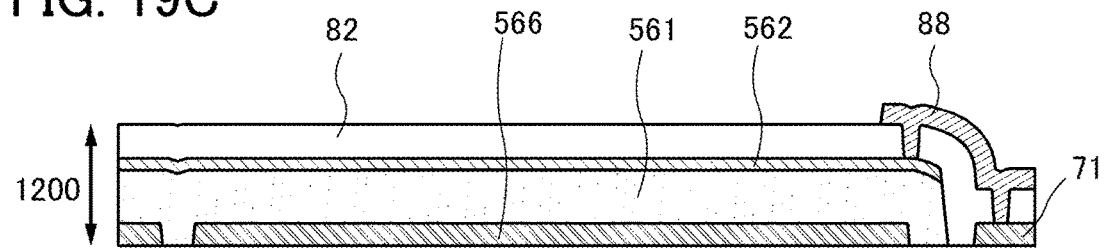
Figure 19D:
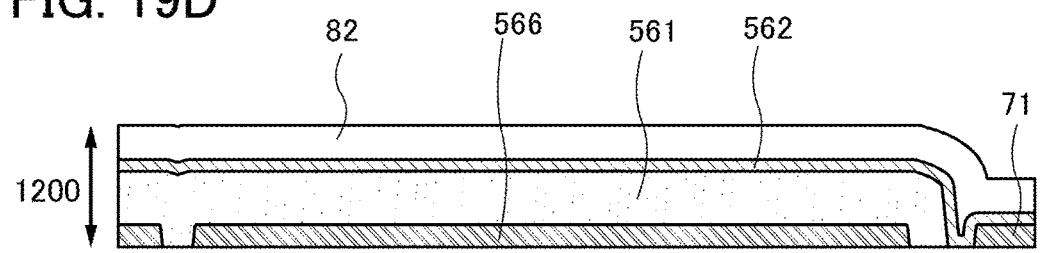

Although the light-transmitting conductive layer 562 is directly in contact with the wiring 71 in FIG. 16A, the light-transmitting conductive layer 562 may be in contact with the wiring 71 through a wiring 88 as illustrated in FIG. 19A. Although the photoelectric conversion layer 561 and the light-transmitting conductive layer 562 are not divided between pixel circuits in FIG. 16A, they may be divided between circuits as illustrated in FIG. 19B. In a region between pixels where the electrode 566 is not provided, a partition wall 567 formed of an insulator is preferably provided, thereby preventing generation of a crack in the photoelectric conversion layer 561 and the light-transmitting conductive layer 562. However, the partition wall 567 is not necessarily provided as illustrated in FIGS. 19C and 19D.

Figure 20A:
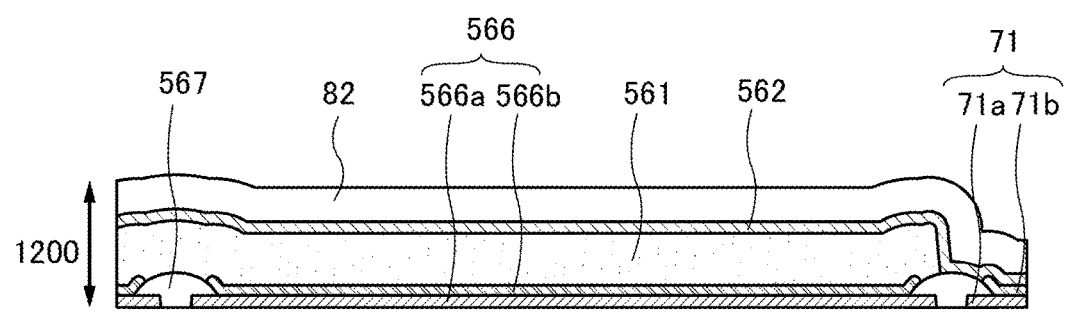
FIGS. 20A and 20B are cross-sectional views each illustrating connection of a photoelectric conversion element.

The electrode 566, the wiring 71, and the like may each be a multilayer. For example, as illustrated in FIG. 20A, the electrode 566 can include two conductive layers 566a and 566b and the wiring 71 can include two conductive layers 71a and 71b. In the structure in FIG. 20A, for example, the conductive layers 566a and 71a may be made of a low-resistance metal or the like, and the conductive layers 566b and 71b may be made of a metal or the like that exhibits an excellent contact property with the photoelectric conversion layer 561. Such a structure improves the electrical properties of the photoelectric conversion element PD. Furthermore, even when the conductive layer 71a contains a metal that causes electrolytic corrosion, which occurs when some kinds of metal are in contact with the light-transmitting conductive layer 562, the electrolytic corrosion can be prevented because the conductive layer 71b is between the conductive layer 71a and the light-transmitting conductive layer 562.

The conductive layers 566b and 71b can be formed using, for example, molybdenum, tungsten, or the like. The conductive layers 566a and 71a can be formed using, for example, aluminum, titanium, or a stack of titanium, aluminum, and titanium that are layered in that order.

Figure 20B:
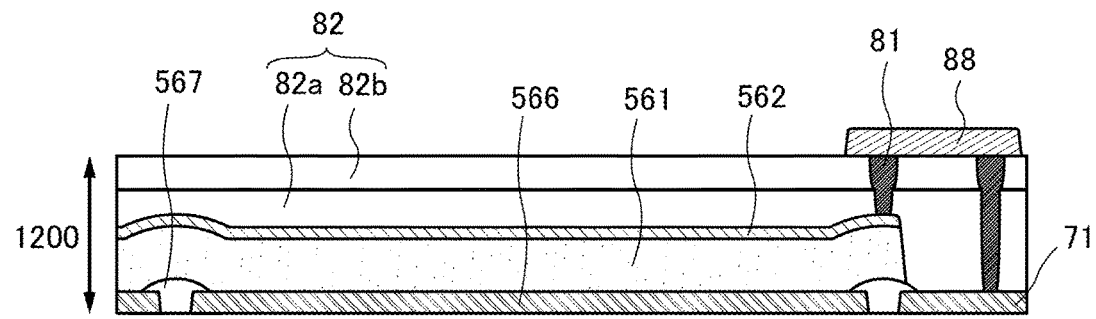

As illustrated in FIG. 20B, the light-transmitting conductive layer 562 may be connected to the wiring 71 through the conductor 81 and the wiring 88. The insulating layer 82 and the like may each be a multilayer. For example, as illustrated in FIG. 20B, the conductor 81 has a difference in level in the case where the insulating layer 82 includes insulating layers 82a and 82b that have different etching rates. In the case where another insulating layer used as an interlayer insulating film or a planarization film is a multilayer, the conductor 81 also has a difference in level. Although the insulating layer 82 is formed using two layers here, the insulating layer 82 and another insulating layer may each be formed using three or more layers.

The partition wall 567 can be formed using an inorganic insulator, an insulating organic resin, or the like. The partition wall 567 may be colored black or the like in order to shield the transistors and the like from light and/or to determine the area of a light-receiving portion in each pixel.

Alternatively, a PIN diode element formed using an amorphous silicon film, a microcrystalline silicon film, or the like may be used as the photoelectric conversion element PD.

Figure 21:
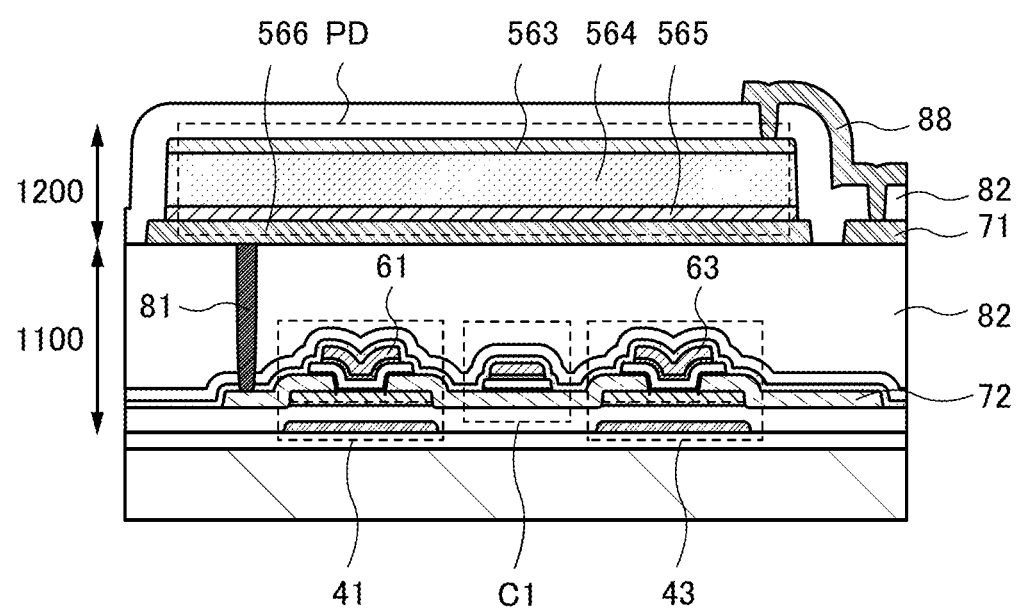
FIG. 21 is a cross-sectional view illustrating an imaging device.

FIG. 21 illustrates an example in which a thin film PIN photodiode is used as the photoelectric conversion element PD. In the photodiode, an n-type semiconductor layer 565, an i-type semiconductor layer 564, and a p-type semiconductor layer 563 are stacked in that order. The i-type semiconductor layer 564 is preferably formed using amorphous silicon. The p-type semiconductor layer 563 and the n-type semiconductor layer 565 can each be formed using amorphous silicon, microcrystalline silicon, or the like that includes a dopant imparting the corresponding conductivity type. A photodiode in which a photoelectric conversion layer is formed using amorphous silicon has high sensitivity in a visible light wavelength region, and therefore can easily sense weak visible light.

In the photoelectric conversion element PD in FIG. 21, the n-type semiconductor layer 565 functioning as a cathode is in contact with the electrode 566 that is electrically connected to the transistor 41. Furthermore, the p-type semiconductor layer 563 functioning as an anode is electrically connected to the wiring 71 through the wiring 88.

Note that when the anode and the cathode of the photoelectric conversion element PD are connected to the electrode layer and the wiring in a manner opposite to that in FIG. 1, the configuration corresponding to the circuit diagram in FIG. 9 can be employed.

In any case, the photoelectric conversion element PD is preferably formed so that the p-type semiconductor layer 563 serves as a light-receiving surface. When the p-type semiconductor layer 563 serves as a light-receiving surface, the output current of the photoelectric conversion element PD can be increased.

Figure 22A:
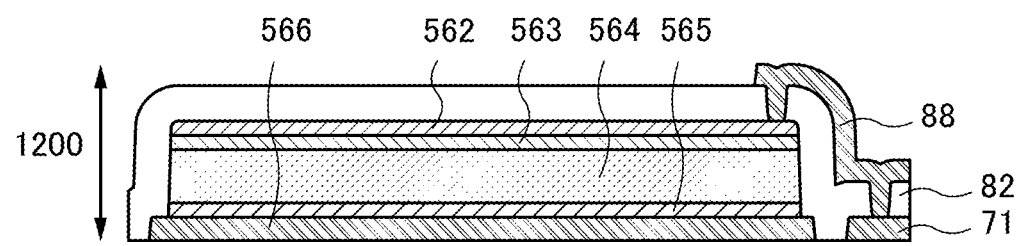
FIGS. 22A to 22C are cross-sectional views each illustrating connection of a photoelectric conversion element.
Figure 22B:
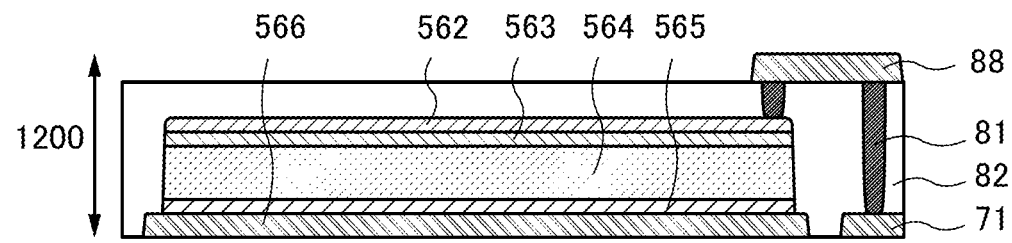
Figure 22C:
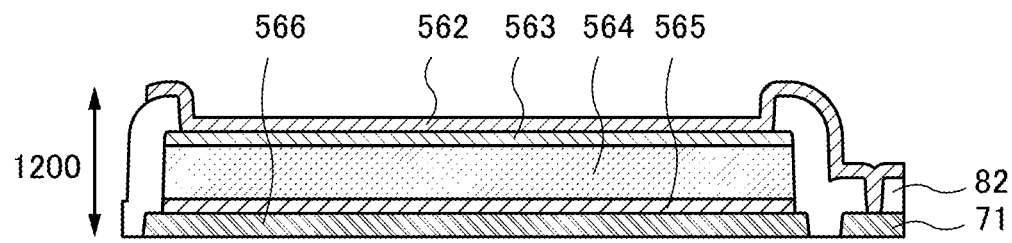

FIGS. 22A to 22C show other examples of the structure of the photoelectric conversion element PD having a configuration of a PIN thin film photodiode and the connection between the photoelectric conversion element PD and the wirings. Note that the structure of the photoelectric conversion element PD and the connection between the photoelectric conversion element PD and the wirings are not limited thereto, and other configurations may be applied.

FIG. 22A illustrates a structure of the photoelectric conversion element PD that includes the light-transmitting conductive layer 562 in contact with the p-type semiconductor layer 563. The light-transmitting conductive layer 562 serves as an electrode and can increase the output current of the photoelectric conversion element PD.

For the light-transmitting conductive layer 562, the following can be used: indium tin oxide; indium tin oxide containing silicon; indium oxide containing zinc; zinc oxide; zinc oxide containing gallium; zinc oxide containing aluminum; tin oxide; tin oxide containing fluorine; tin oxide containing antimony; graphene; graphene oxide; or the like. The light-transmitting conductive layer 562 is not limited to a single layer, and may be a stacked layer of different films.

In the structure of FIG. 22B, the light-transmitting conductive layer 562 and the wiring 71 are connected to each other through the conductor 81 and the wiring 88. Note that the p-type semiconductor layer 563 of the photoelectric conversion element PD and the wiring 71 may be connected to each other through the conductor 81 and the wiring 88. In the structure of FIG. 22B, the light-transmitting conductive layer 562 is not necessarily provided.

FIG. 22C illustrates a structure in which an opening exposing the p-type semiconductor layer 563 is provided in an insulating layer covering the photoelectric conversion element PD, and the light-transmitting conductive layer 562 that covers the opening is electrically connected to the wiring 71.

Figure 23:
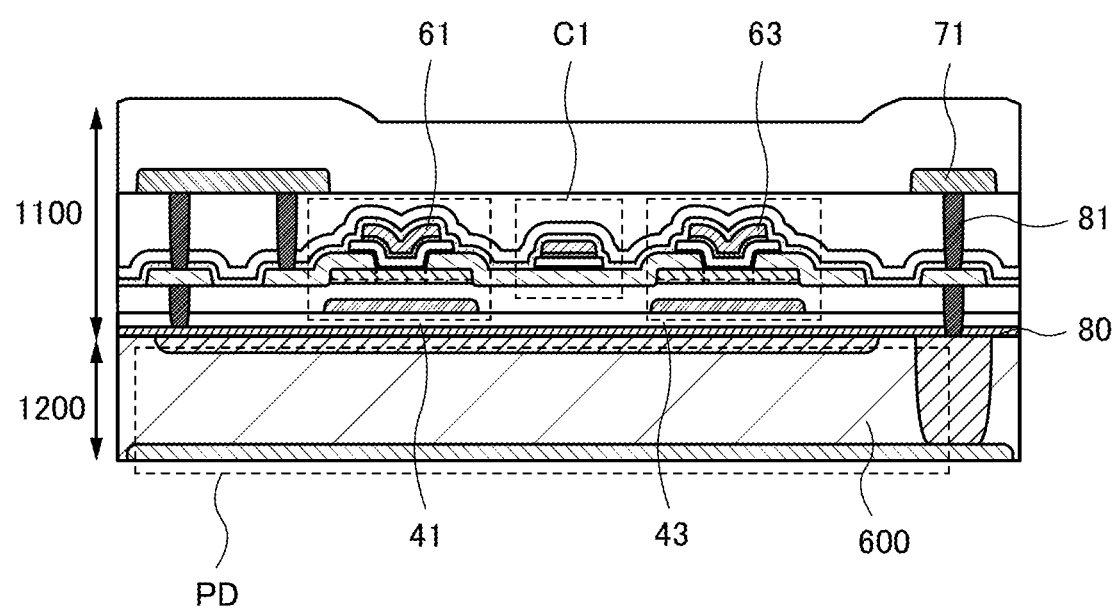
FIG. 23 is a cross-sectional view illustrating an imaging device.

Alternatively, as illustrated in FIG. 23, the photoelectric conversion element PD may be a photodiode including a silicon substrate 600 as a photoelectric conversion layer.

The photoelectric conversion element PD including the aforementioned selenium-based material, amorphous silicon, or the like can be formed through general semiconductor manufacturing processes such as a deposition process, a lithography process, and an etching process. In addition, because the resistance of the selenium-based material is high, the photoelectric conversion layer 561 does not need to be divided between circuits as illustrated in FIG. 16A. Therefore, the imaging device of one embodiment of the present invention can be manufactured with a high yield at low cost. In contrast, a photodiode including the silicon substrate 600 as the photoelectric conversion layer requires difficult processes such as a polishing process and a bonding process.

Figure 24A:
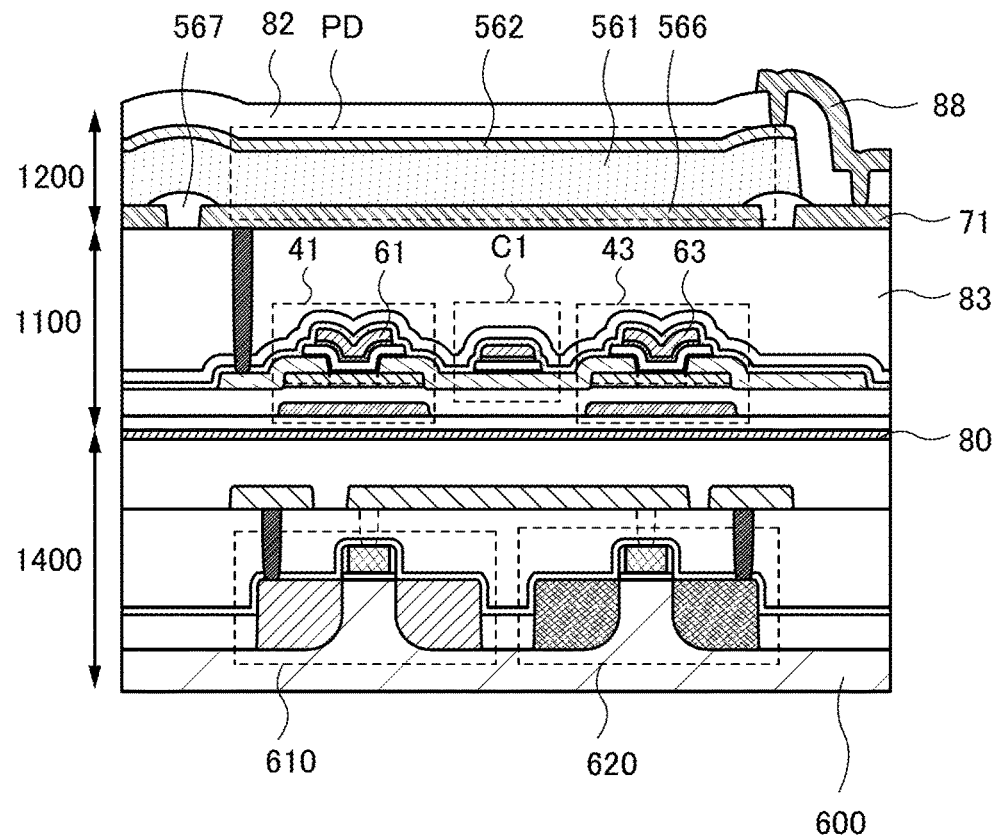
FIGS. 24A and 24B are cross-sectional views illustrating an imaging device.
Figure 24B:
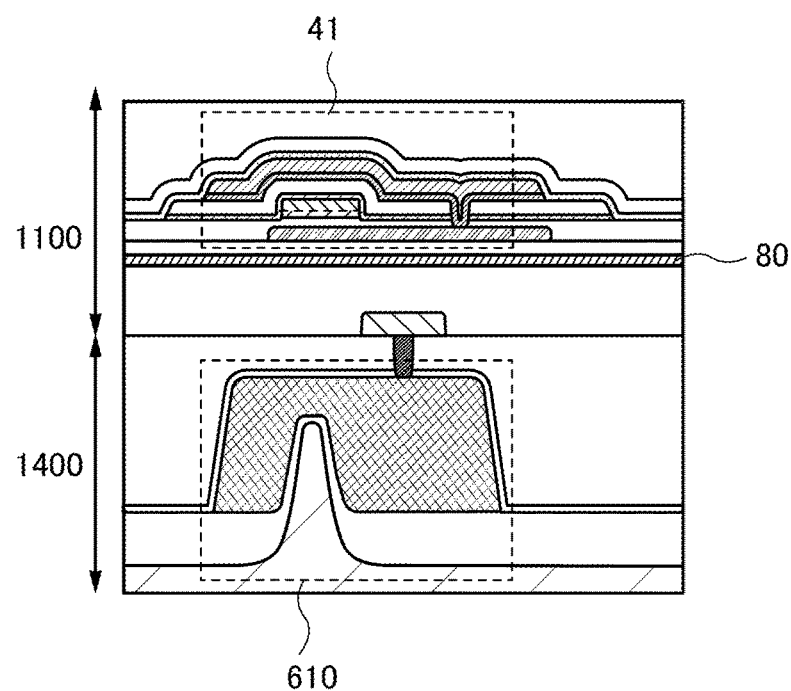

Furthermore, in the imaging device of one embodiment of the present invention, a stack including the silicon substrate 600 in which a circuit is formed may be used. For example, as illustrated in FIG. 24A, the pixel circuit may overlap with a layer 1400 that includes transistors 610 and 620 whose active regions are formed in the silicon substrate 600. FIG. 24B is a cross-sectional view illustrating the transistors in the channel width direction.

Figure 25A:
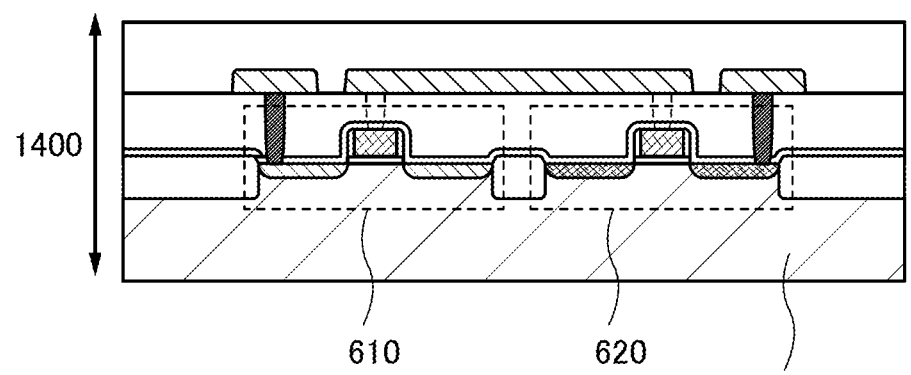
FIGS. 25A to 25C are cross-sectional views and a circuit diagram illustrating imaging devices.
Figure 25B:
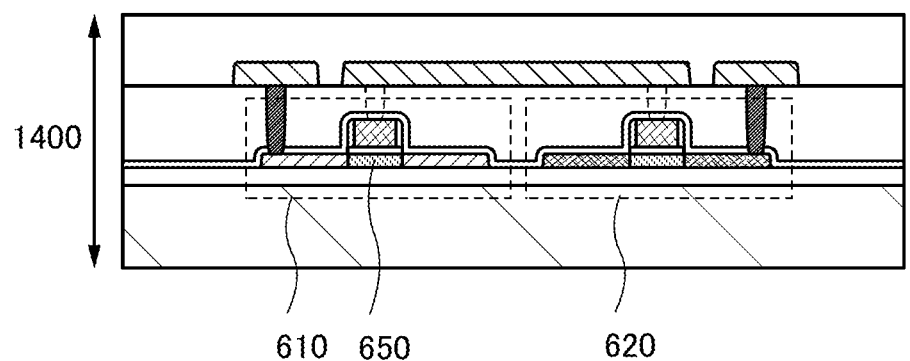

Although FIGS. 24A and 24B show the Si transistors of a fin type, the transistors may be of a planar type as illustrated in FIG. 25A. Alternatively, as illustrated in FIG. 25B, they may be transistors each including an active layer 650 formed using a silicon thin film. The active layer 650 can be formed using polycrystalline silicon or single crystal silicon of a silicon-on-insulator (SOI) structure.

Figure 25C:
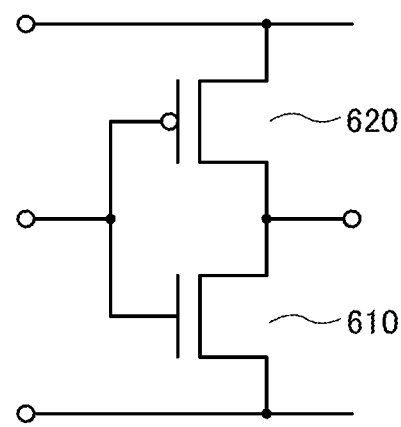

The circuit formed on the silicon substrate 600 is capable of reading a signal output from the pixel circuit and converting the signal; for example, the circuit may include a CMOS inverter illustrated in the circuit diagram in FIG. 25C. A gate of the transistor 610 (n-channel transistor) is electrically connected to a gate of the transistor 620 (p-channel transistor). One of a source and a drain of one of the transistors 610 and 620 is electrically connected to one of a source and a drain of the other transistor. The other of the source and the drain of the one transistor is electrically connected to a wiring and the other of the source and the drain of the other transistor is electrically connected to another wiring.

The circuit formed on the silicon substrate 600 corresponds to each of the circuit 12, the circuit 13, the circuit 14, the circuit 15, the circuit 16, and the like illustrated in FIG. 2A and FIG. 15B, for example.

The silicon substrate 600 is not limited to a bulk silicon substrate and can be a substrate made of germanium, silicon germanium, silicon carbide, gallium arsenide, aluminum gallium arsenide, indium phosphide, gallium nitride, or an organic semiconductor.

Here, as illustrated in FIG. 23 and FIGS. 24A and 24B, an insulating layer 80 is provided between a region including an oxide semiconductor transistor and a region including a Si device (a Si transistor or a Si photodiode).

Dangling bonds of silicon are terminated with hydrogen in insulating layers provided in the vicinities of the active regions of the transistors 610 and 620. Therefore, hydrogen has an effect of improving the reliability of the transistors 610 and 620. Meanwhile, hydrogen in insulating layers provided in the vicinity of the oxide semiconductor layer that is the active layer of the transistor 41 or the like causes generation of carriers in the oxide semiconductor layer, and therefore may reduce the reliability of the transistor 41 or the like. Thus, the insulating layer 80 having a function of preventing diffusion of hydrogen is preferably provided between one layer including the transistor using a silicon-based semiconductor material and another layer stacked thereon that includes the transistor using an oxide semiconductor. Hydrogen is confined in the one layer by the insulating layer 80, so that the reliability of the transistors 610 and 620 can be improved. Furthermore, diffusion of hydrogen from the one layer to the other layer is inhibited, so that the reliability of the transistor 41 or the like can also be improved.

The insulating layer 80 can be formed using, for example, aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

As illustrated in FIGS. 24A and 24B, a circuit (e.g., a driver circuit) formed on the silicon substrate 600, the transistor 41 or the like, and the photoelectric conversion element PD can overlap with each other; thus, the integration degree of pixels can be increased. In other words, the resolution of the imaging device can be increased. Such a structure is suitable for an imaging device with, for example, 4K2K, 8K4K, or 16K8K pixels. Note that a structure may be employed in which a Si transistor is formed as the transistors 45 and 46 included in the pixel 10 so as to overlap with the transistor 41, the transistor 42, the transistor 43, the transistor 44, the photoelectric conversion element PD, and the like.

Figure 26:
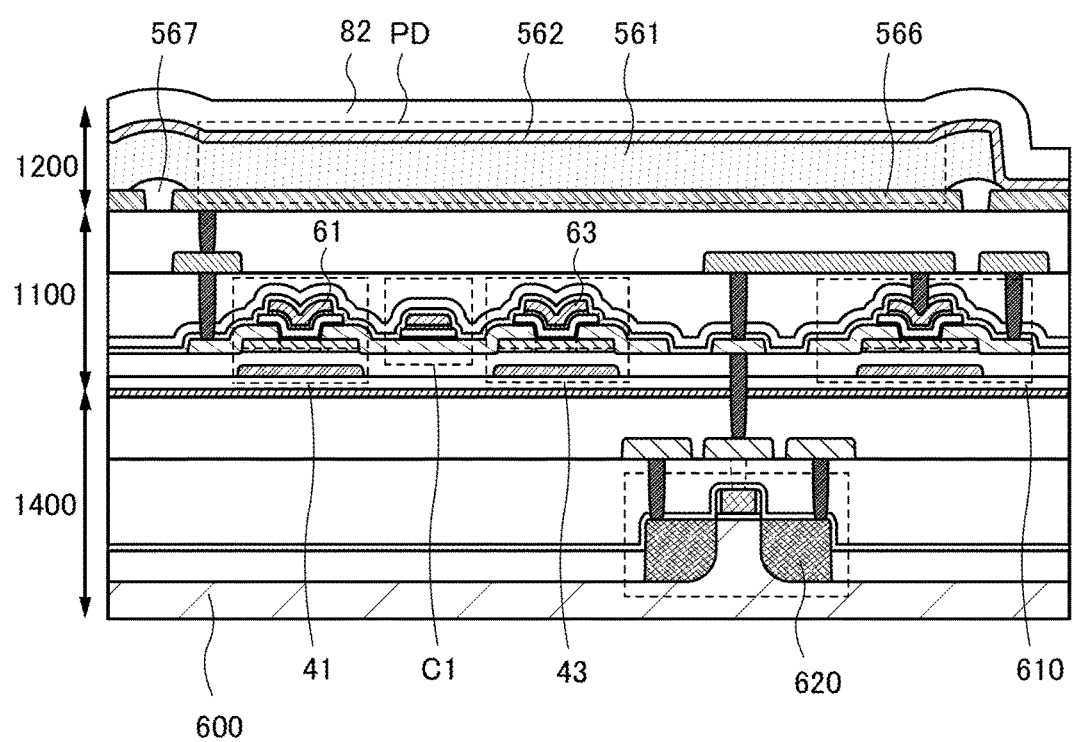
FIG. 26 is a cross-sectional view illustrating an imaging device.

An imaging device of one embodiment of the present invention can also have a structure in FIG. 26. The imaging device in FIG. 26 is a modification example of the imaging device in FIG. 24A. A CMOS inverter is formed using an OS transistor and a Si transistor.

Here, the transistor 620 is a p-channel Si transistor provided in the layer 1400, and the transistor 610 is an n-channel OS transistor provided in the layer 1100. When only the p-channel transistor is provided on the silicon substrate 600, a step of forming a well, an n-type impurity layer, or the like can be skipped.

Although selenium or the like is used for the photoelectric conversion element PD in the imaging device in FIG. 26, a PIN thin film photodiode may be used as in FIG. 21.

In the imaging device in FIG. 26, the transistor 610 can be formed through the same process as the transistors 41 and 43 formed in the layer 1100. Thus, the manufacturing process of the imaging device can be simplified.

Figure 27:
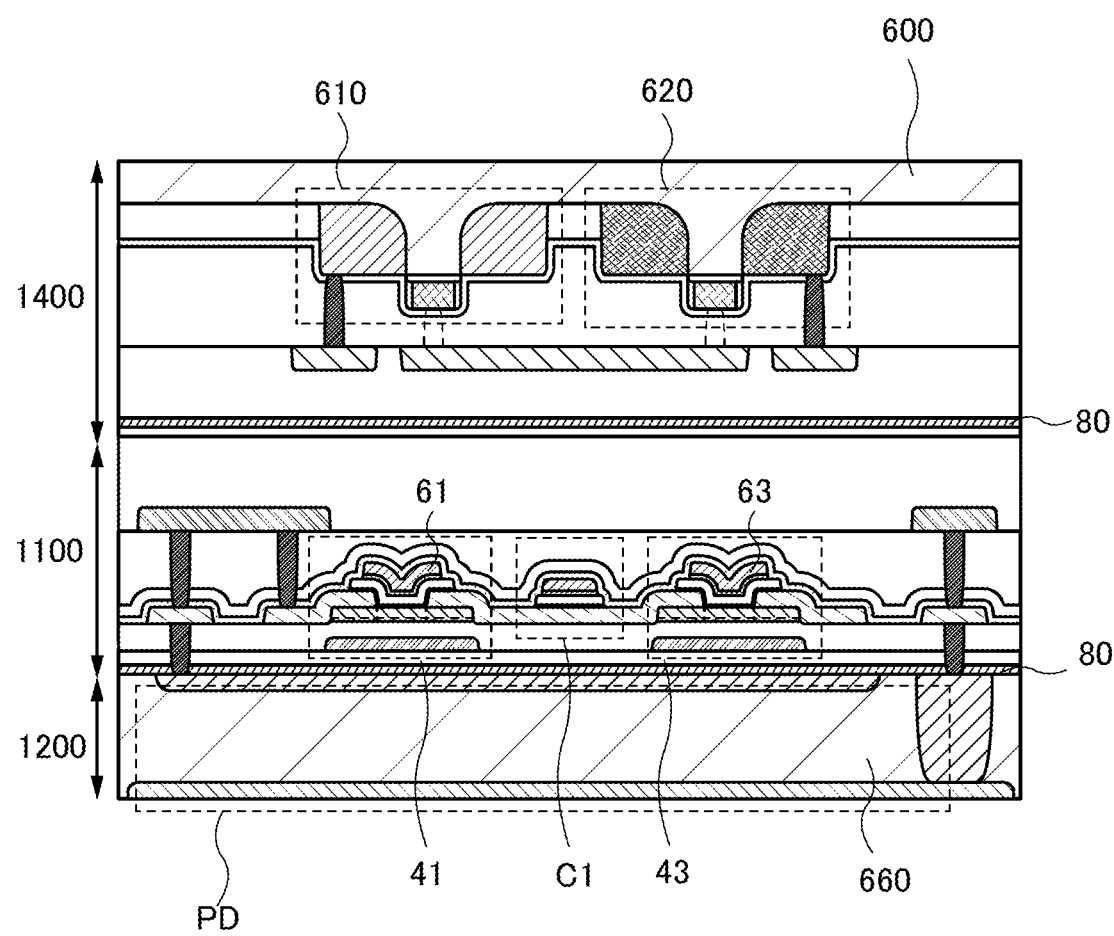
FIG. 27 is a cross-sectional view illustrating an imaging device.

As illustrated in FIG. 27, an imaging device of one embodiment of the present invention may have a structure where a pixel includes the photoelectric conversion element PD formed on a silicon substrate 660 and OS transistors formed over the photoelectric conversion element PD and the pixel and the silicon substrate 600 on which the circuit is formed are attached to each other. Such a structure is suitable for increasing the effective area of the photoelectric conversion element PD formed on the silicon substrate 660. Furthermore, the integration degree of the circuit formed on the silicon substrate 600 can be improved using miniaturized Si transistors; thus, a high-performance semiconductor device can be provided.

Figure 28:
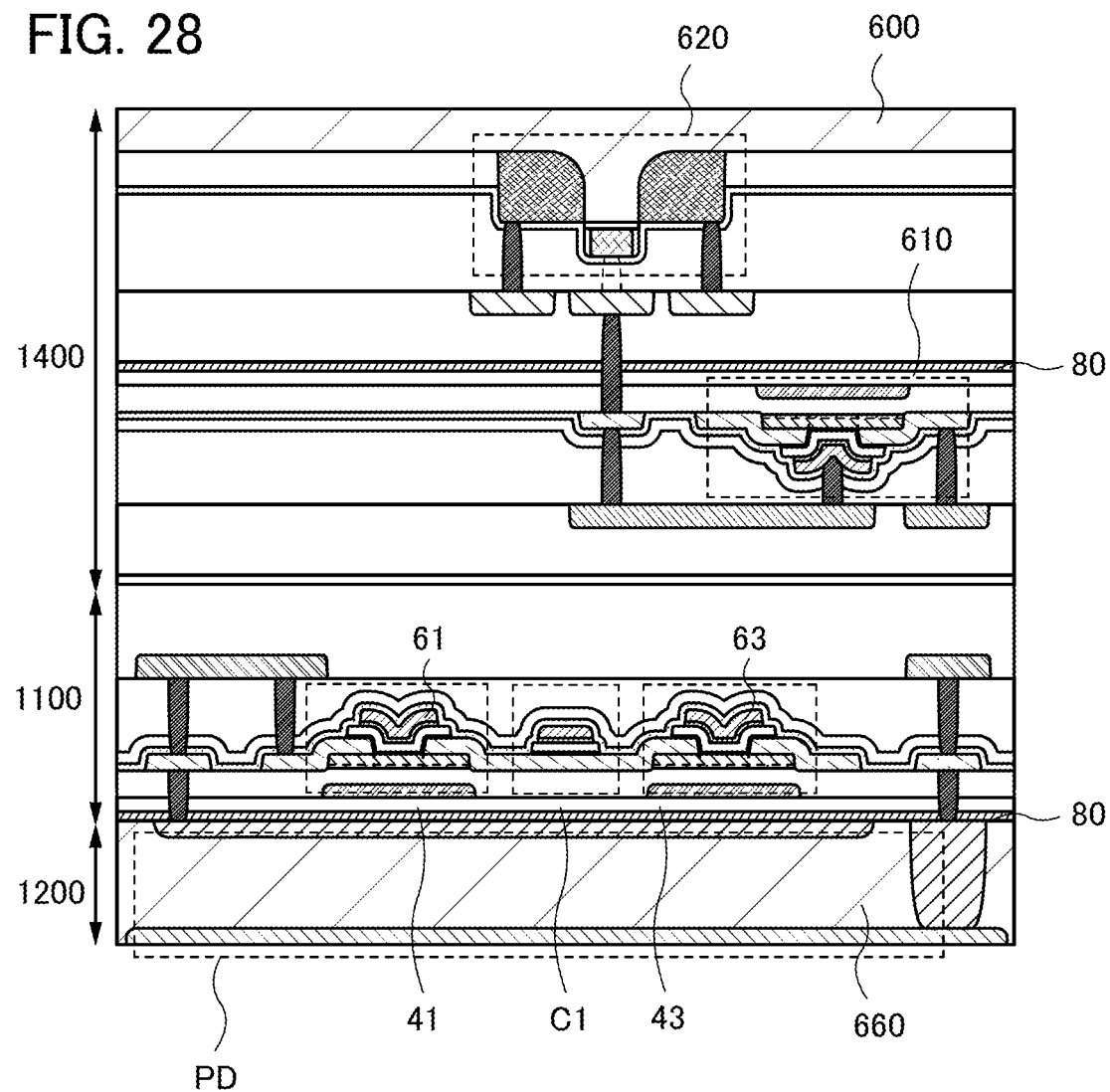
FIG. 28 is a cross-sectional view illustrating an imaging device.

FIG. 28 shows a modification example of FIG. 27, in which a circuit includes an OS transistor and a Si transistor. Such a structure is suitable for increasing the effective area of the photoelectric conversion element PD formed on the silicon substrate 660. Furthermore, the integration degree of the circuit formed on the silicon substrate 600 can be improved using miniaturized Si transistors; thus, a high-performance semiconductor device can be provided.

In the case of the structure illustrated in FIG. 28, a CMOS circuit can be formed using the Si transistor on the silicon substrate 600 and the OS transistor thereon. Since the off-state current of the OS transistor is extremely low, the static leakage current of the CMOS circuit can be extremely low.

Note that the structure of the transistor and the photoelectric conversion element included in each of the imaging devices described in this embodiment is only an example. Therefore, for example, one or more of the transistors 41 to 46 may include silicon or the like in an active region or an active layer. Furthermore, one of or both the transistors 610 and 620 may include an oxide semiconductor layer as an active layer.

Figure 29A:
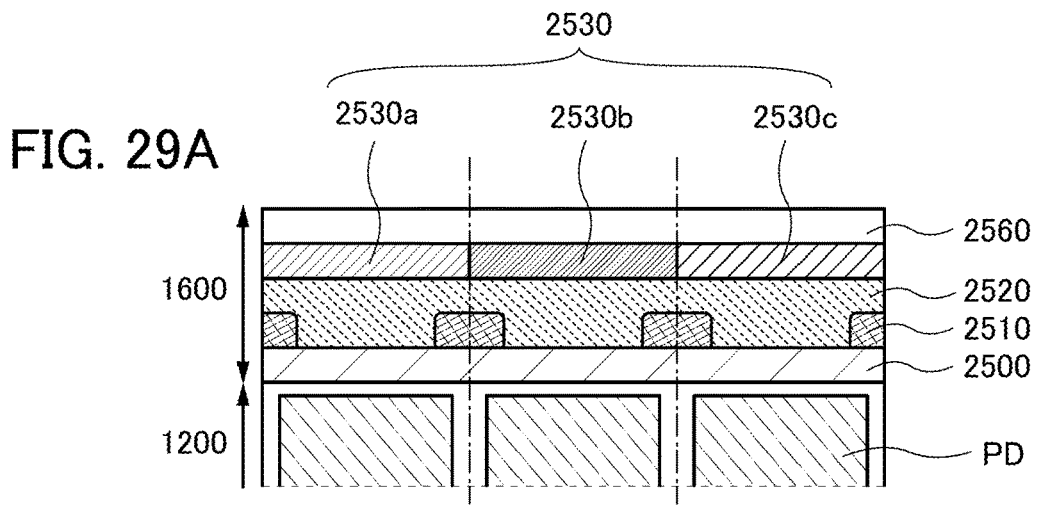
FIGS. 29A to 29D are cross-sectional views each illustrating a structure of an imaging device.

FIG. 29A is a cross-sectional view of an example of a mode in which a color filter and the like are added to the imaging device. The cross-sectional view illustrates part of a region including pixel circuits for three pixels. An insulating layer 2500 is formed over the layer 1200 where the photoelectric conversion element PD is formed. As the insulating layer 2500, for example, a silicon oxide film with a high visible-light transmitting property can be used. In addition, a silicon nitride film may be stacked as a passivation film. In addition, a dielectric film of hafnium oxide or the like may be stacked as an anti-reflection film.

A light-blocking layer 2510 may be formed over the insulating layer 2500. The light-blocking layer 2510 has a function of inhibiting color mixing of light passing through the color filter. The light-blocking layer 2510 can be formed of a metal layer of aluminum, tungsten, or the like, or a stack including the metal layer and a dielectric film functioning as an anti-reflection film.

An organic resin layer 2520 can be formed as a planarization film over the insulating layer 2500 and the light-blocking layer 2510. A color filter 2530 (a color filter 2530a, a color filter 2530b, or a color filter 2530c) is formed in each pixel. For example, the color filter 2530a, the color filter 2530b, and the color filter 2530c each have a color of red (R), green (G), blue (B), yellow (Y), cyan (C), magenta (M), or the like, so that a color image can be obtained.

A light-transmitting insulating layer 2560 or the like can be provided over the color filter 2530.

Figure 29B:
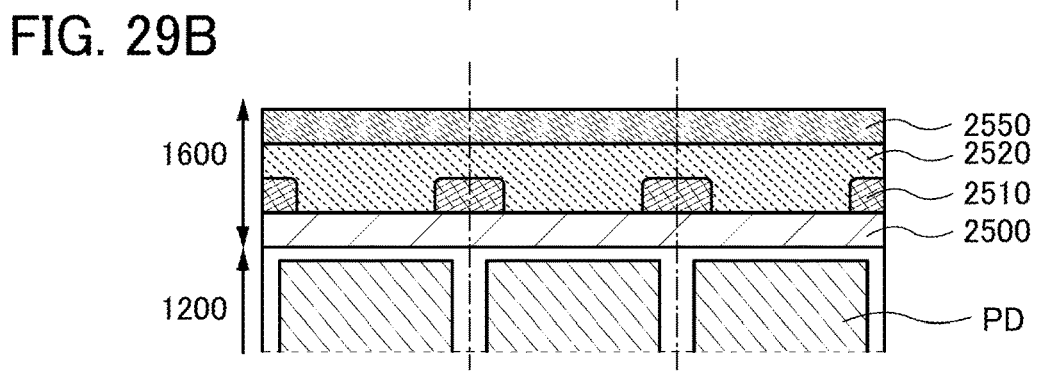

As illustrated in FIG. 29B, an optical conversion layer 2550 may be used instead of the color filter 2530. Such a structure enables the imaging device to take images in various wavelength regions.

For example, when a filter that blocks light having a wavelength shorter than or equal to that of visible light is used as the optical conversion layer 2550, an infrared imaging device can be obtained. When a filter that blocks light having a wavelength shorter than or equal to that of near infrared light is used as the optical conversion layer 2550, a far infrared imaging device can be obtained. When a filter that blocks light having a wavelength longer than or equal to that of visible light is used as the optical conversion layer 2550, an ultraviolet imaging device can be obtained.

Furthermore, when a scintillator is used as the optical conversion layer 2550, an imaging device that takes an image visualizing the intensity of radiation and is used for an X-ray imaging device or the like can be obtained. Radiation such as X-rays passes through a subject to enter a scintillator, and then is converted into light (fluorescence) such as visible light or ultraviolet light owing to a phenomenon known as photoluminescence. Then, the photoelectric conversion element PD detects the light to obtain image data.

Furthermore, the imaging device having the structure may be used in a radiation detector or the like.

A scintillator includes a substance that, when irradiated with radiation such as X-rays or gamma-rays, absorbs energy of the radiation to emit visible light or ultraviolet light. For example, a resin or ceramics in which any of $Gd_2O_2S$:Tb, $Gd_2O_2S$:Pr, $Gd_2O_2S$:Eu, BaFCl:Eu, NaI, CsI, $CaF_2$, $BaF_2$, $CeF_3$, LiF, LiI, and ZnO is dispersed can be used.

In the photoelectric conversion element PD using a selenium-based material, radiation such as X-rays can be directly converted into charge; thus, the scintillator is not necessarily used.

Figure 29C:
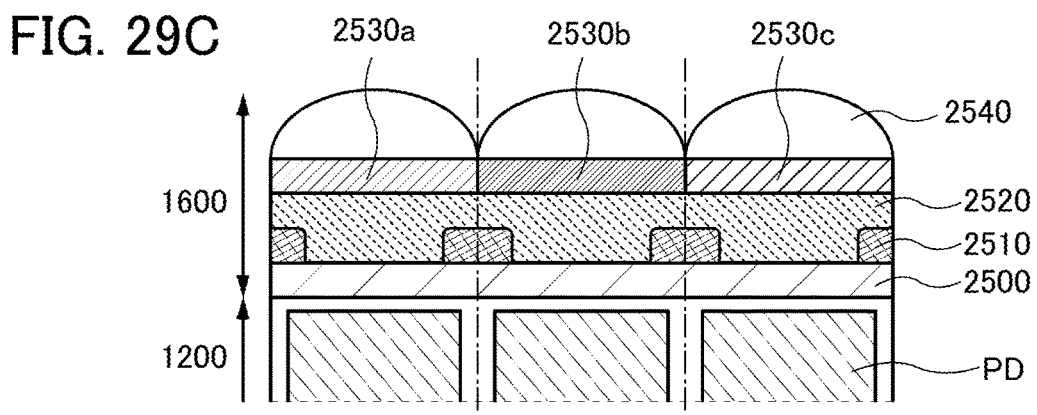
Figure 29D:
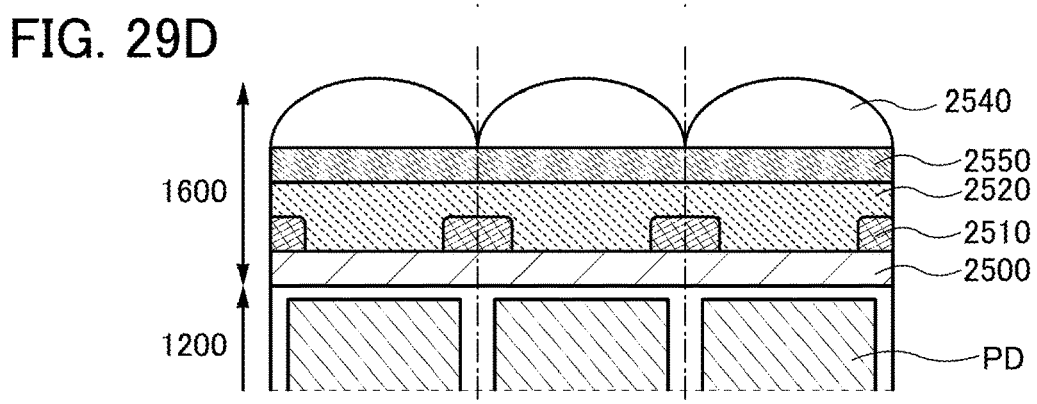

Alternatively, as illustrated in FIG. 29C, a microlens array 2540 may be provided over the color filters 2530a, 2530b, and 2530c. Light penetrating lenses included in the microlens array 2540 goes through the color filters positioned thereunder to reach the photoelectric conversion element PD. Alternatively, as illustrated in FIG. 29D, the microlens array 2540 may be provided over the optical conversion layer 2550. Note that a region other than the layer 1200 in FIGS. 29A to 29D is referred to as a layer 1600.

Figure 30:
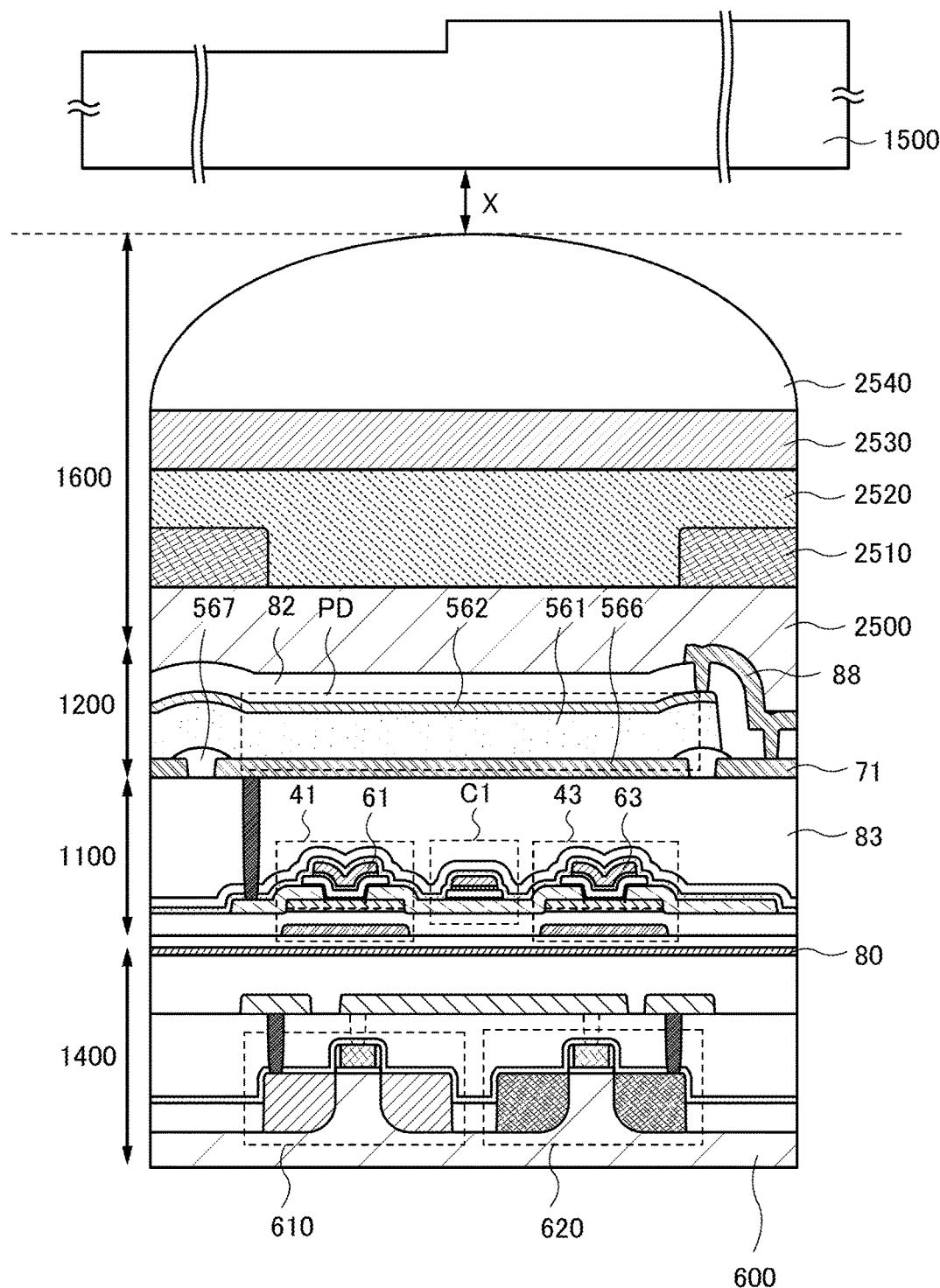
FIG. 30 is a cross-sectional view illustrating a structure of an imaging device.

FIG. 30 illustrates a specific example of a layered structure including the pixel 10 of one embodiment of the present invention, the microlens array 2540 illustrated in FIG. 29C, and the like. In the example illustrated in FIG. 30, the structure of the pixel illustrated in FIG. 24A is used. In the example illustrated in FIG. 31, the structure of the pixel illustrated in FIG. 28 is used.

The photoelectric conversion element PD, the circuit of the pixel 10, and the driver circuit can be positioned so as to overlap with each other in this manner, leading to a reduction in the size of the imaging device.

Figure 31:
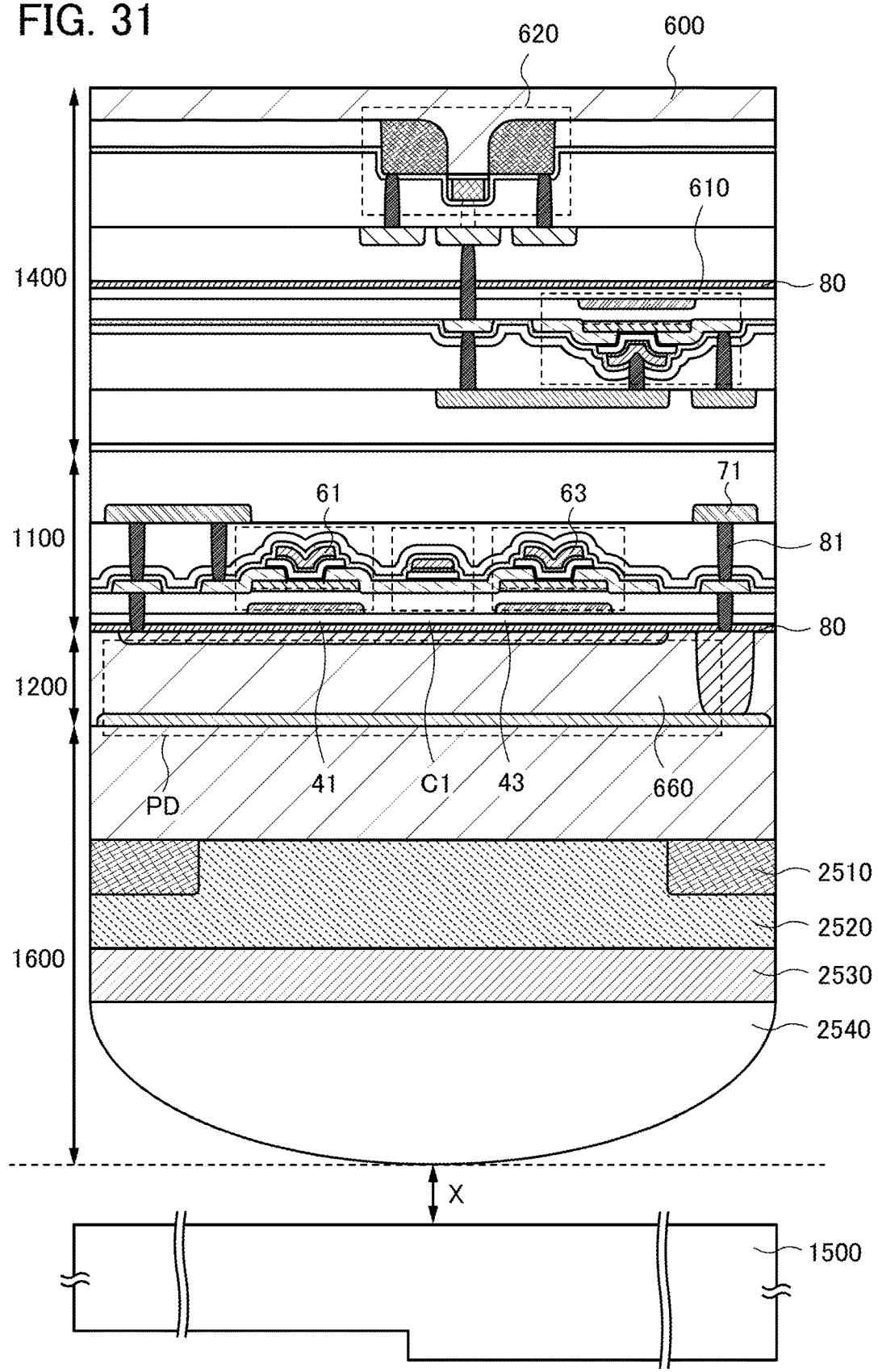
FIG. 31 is a cross-sectional view illustrating a structure of an imaging device.

As illustrated in FIG. 30 and FIG. 31, a diffraction grating 1500 may be provided above the microlens array 2540. An image of an object through the diffraction grating 1500 (i.e., a diffraction pattern) can be scanned into a pixel, and an input image (an object image) can be formed from a captured image in the pixel by arithmetic processing. In addition, the use of the diffraction grating 1500 instead of a lens can reduce the cost of the imaging device.

The diffraction grating 1500 can be formed using a light-transmitting material. An inorganic insulating film such as a silicon oxide film or a silicon oxynitride film can be used, for example. Alternatively, an organic insulating film such as an acrylic resin film or a polyimide resin film may be used. Alternatively, a stack of the inorganic insulating film and the organic insulating film may be used.

In addition, the diffraction grating 1500 can be formed by a lithography process using a photosensitive resin or the like. Alternatively, the diffraction grating 1500 can be formed by a lithography process and an etching process. Alternatively, the diffraction grating 1500 can be formed by nanoimprint lithography, laser scribing, or the like.

Note that a space X may be provided between the diffraction grating 1500 and the microlens array 2540. The space X can be less than or equal to 1 mm, preferably less than or equal to 100 μm. The space may be an empty space or may be a sealing layer or an adhesion layer formed using a light-transmitting material. For example, an inert gas such as nitrogen or a rare gas can be sealed in the space. Alternatively, an acrylic resin, an epoxy resin, a polyimide resin, or the like may be provided in the space. Alternatively, a liquid such as silicone oil may be provided. Even in the case where the microlens array 2540 is not provided, the space X may be provided between the color filter 2530 and the diffraction grating 1500.

As illustrated in FIGS. 32A1 and 32B1, the imaging device may be bent. FIG. 32A1 illustrates a state in which the imaging device is bent in the direction of dashed-two dotted line X1-X2. FIG. 32A2 is a cross-sectional view illustrating a portion indicated by dashed-two dotted line X1-X2 in FIG. 32A1. FIG. 32A3 is a cross-sectional view illustrating a portion indicated by dashed-two dotted line Y1-Y2 in FIG. 32A1.

FIG. 32B1 illustrates a state where the imaging device is bent in the direction of dashed-two dotted line X3-X4 and the direction of dashed-two dotted line Y3-Y4. FIG. 32B2 is a cross-sectional view illustrating a portion indicated by dashed-two dotted line X3-X4 in FIG. 32B1. FIG. 32B3 is a cross-sectional view illustrating a portion indicated by dashed-two dotted line Y3-Y4 in FIG. 32B1.

Bending the imaging device can reduce field curvature and astigmatism. Thus, the optical design of lens and the like, which is used in combination of the imaging device, can be facilitated. For example, the number of lenses used for aberration correction can be reduced; accordingly, the size or weight of semiconductor devices including the imaging device can be easily reduced. In addition, the quality of a captured image can be improved.

In Embodiment 1, one embodiment of the present invention has been described. Other embodiments of the present invention will be described in Embodiments 2 to 7. Note that one embodiment of the present invention is not limited thereto. In other words, various embodiments of the invention are described in this embodiment and the other embodiments, and one embodiment of the present invention is not limited to a particular embodiment. Although an example in which one embodiment of the present invention is applied to an imaging device is described, one embodiment of the present invention is not limited thereto. Depending on circumstances or conditions, one embodiment of the present invention is not necessarily applied to an imaging device. One embodiment of the present invention may be applied to a semiconductor device with another function, for example. Although an example in which a channel formation region, a source region, a drain region, or the like of a transistor includes an oxide semiconductor is described as one embodiment of the present invention, one embodiment of the present invention is not limited thereto. Depending on circumstances or conditions, various transistors or a channel formation region, a source region, a drain region, or the like of a transistor in one embodiment of the present invention may include various semiconductors. Depending on circumstances or conditions, various transistors or a channel formation region, a source region, a drain region, or the like of a transistor in one embodiment of the present invention may include, for example, at least one of silicon, germanium, silicon germanium, silicon carbide, gallium arsenide, aluminum gallium arsenide, indium phosphide, gallium nitride, and an organic semiconductor. Alternatively, for example, depending on circumstances or conditions, various transistors or a channel formation region, a source region, a drain region, or the like of a transistor in one embodiment of the present invention does not necessarily include an oxide semiconductor.

This embodiment can be implemented in appropriate combination with any of the structures described in the other embodiments.

Embodiment 2

In this embodiment, an imaging device different from that in Embodiment 1 will be described with reference to drawings. Note that the detailed description of portions which are similar to those described in Embodiment 1 is omitted.

One embodiment of the present invention is a circuit configuration and an operation method of an imaging device in which whether a charge detection portion provided in a pixel is saturated with electrons is determined and an operation mode is changed depending on the determination result. First imaging data is captured first, and the capacitance value of a charge detection portion is controlled so as not to be changed in the case where the charge detection portion is not saturated with electrons. In the case where the charge detection portion is saturated with electrons, the capacitance value of the charge detection portion is controlled so as to be increased. Such a control is performed on all pixels individually, and then second imaging data is captured and read out. The second imaging data captured without the capacitance value of the charge detection portion being changed corresponds to data obtained under low illuminance. The second imaging data captured after the capacitance value of the charge detection portion is increased corresponds to data obtained under high illuminance.

With the above operation, even in the case of imaging in an environment with low illuminance, an image with little noise and a wide dynamic range can be obtained because the gray level can be kept. Furthermore, also in the case of imaging in an environment with high illuminance, the gray level of a bright portion can be kept; thus, an image with a wide dynamic range can be obtained.

Figure 33:
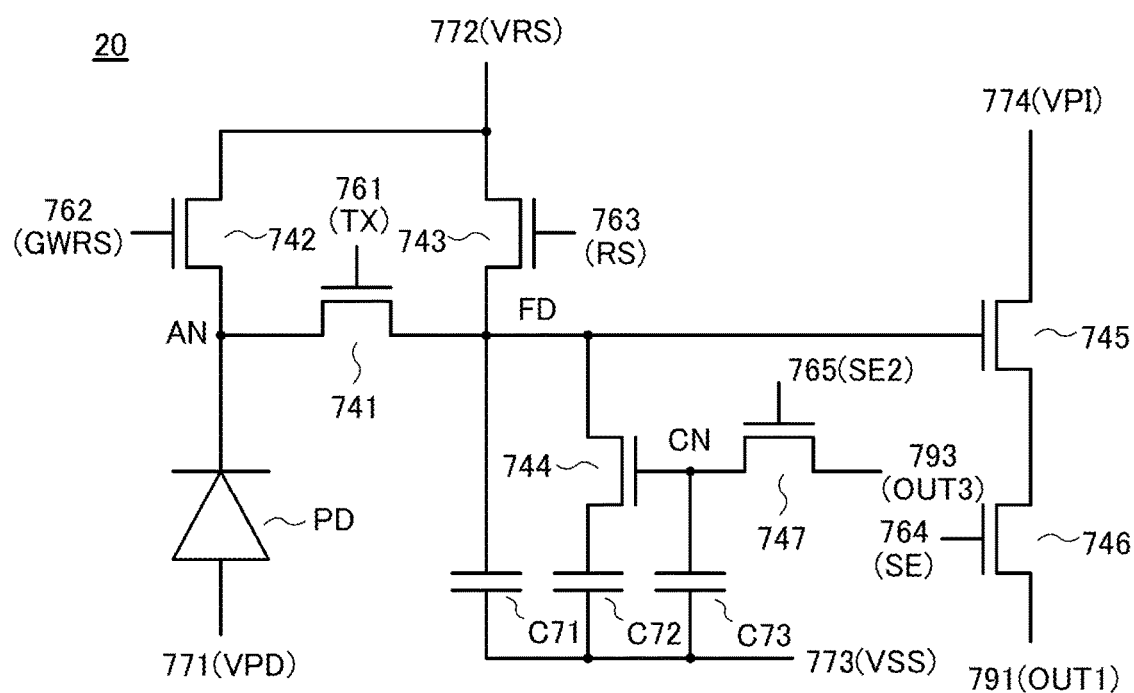
FIG. 33 is a circuit diagram illustrating a pixel.

FIG. 33 is a circuit diagram of a pixel 20 included in an imaging device of one embodiment of the present invention. Note that an example in which transistors are n-channel transistors is shown in FIG. 33 and the like; however, one embodiment of the present invention is not limited to this, and some transistors may be replaced with p-channel transistors.

In the pixel 20, one electrode of a photoelectric conversion element PD is electrically connected to one of a source and a drain of a transistor 741. The one of the source and the drain of the transistor 741 is electrically connected to one of a source and a drain of a transistor 742. The other of the source and the drain of the transistor 741 is electrically connected to one of a source and a drain of a transistor 743. The other of the source and the drain of the transistor 741 is electrically connected to one of a source and a drain of a transistor 744. The other of the source and the drain of the transistor 741 is electrically connected to a gate of a transistor 745. The other of the source and the drain of the transistor 741 is electrically connected to one electrode of a capacitor C71. The other of the source and the drain of the transistor 744 is electrically connected to one electrode of a capacitor C72. One of a source and a drain of the transistor 745 is electrically connected to one of a source and a drain of a transistor 746. A gate of the transistor 744 is electrically connected to one of a source and a drain of a transistor 747. The gate of the transistor 744 is electrically connected to one electrode of a capacitor C73.

Here, a node AN where the one electrode of the photoelectric conversion element PD, the one of the source and the drain of the transistor 741, and the one of the source and the drain of the transistor 742 are connected to each other is a charge accumulation portion. A node FD where the other of the source and the drain of the transistor 741, the one of the source and the drain of the transistor 743, the one of the source and the drain of the transistor 744, the gate of the transistor 745, and the one electrode of the capacitor C71 are connected to each other is a charge detection portion. A node CN where the gate of the transistor 744, the one of the source and the drain of the transistor 747, and the one electrode of the capacitor C73 are connected to each other is a signal holding portion.

The other electrode of the photoelectric conversion element PD is electrically connected to a wiring 771 (VPD). The other of the source and the drain of the transistor 742 and the other of the source and the drain of the transistor 743 are electrically connected to a wiring 772 (VRS). The other electrode of the capacitor C1, the other electrode of the capacitor C72, and the other electrode of the capacitor C73 are electrically connected to a wiring 773 (VSS). The other of the source and the drain of the transistor 745 is electrically connected to a wiring 774 (VPI). The other of the source and the drain of the transistor 746 is electrically connected to a wiring 791 (OUT1).

In the connection between the above components, a plurality of transistors or a plurality of capacitors are electrically connected to a wiring to share it; however, they may be electrically connected to different wirings.

The wiring 771 (VPD), the wiring 772 (VRS), the wiring 773 (VSS), and the wiring 774 (VPI) can function as power supply lines. For example, the wiring 771 (VPD) and the wiring 773 (VSS)) can function as low potential power supply lines. The wiring 772 (VRS) and the wiring 774 (VPI) can function as high potential power supply lines.

A gate of the transistor 741 is electrically connected to a wiring 761 (TX). A gate of the transistor 742 is electrically connected to a wiring 762 (GWRS). A gate of the transistor 743 is electrically connected to a wiring 763 (RS). A gate of the transistor 746 is electrically connected to a wiring 764 (SE). A gate of the transistor 747 is electrically connected to a wiring 765 (SE2). The other of the source and the drain of the transistor 747 is electrically connected to a wiring 793 (OUT3).

The wiring 761 (TX), the wiring 762 (GWRS), the wiring 763 (RS), the wiring 764 (SE), and the wiring 765 (SE2) can function as signal lines for controlling the conduction states of the transistors to which the respective wirings are connected. Note that the wiring 763 (RS), the wiring 764 (SE), and the wiring 765 (SE2) can control the transistors on a row basis.

The transistor 741 can function as a transistor for transferring the potential of the node AN to the node FD. The transistor 742 can function as a transistor for resetting the potential of the node AN. The transistor 743 can function as a transistor for resetting the potential of the node FD. The transistor 744 can function as a transistor for controlling the electrical connection between the node FD and the capacitor C72. The transistor 745 can function as a transistor for outputting a signal corresponding to the potential of the node FD. The transistor 746 can function as a transistor for selecting the pixel 20. The transistor 747 can function as a transistor for holding the potential of the node CN.

Note that the above structure of the pixel 20 is just an example, and some of the circuits, some of the transistors, some of the capacitors, some of the wirings, or the like might not be included. Alternatively, a circuit, a transistor, a capacitor, a wiring, or the like that is not included in the above structure might be included. Alternatively, connection between some wirings might be different from the above connection.

Figure 34A:
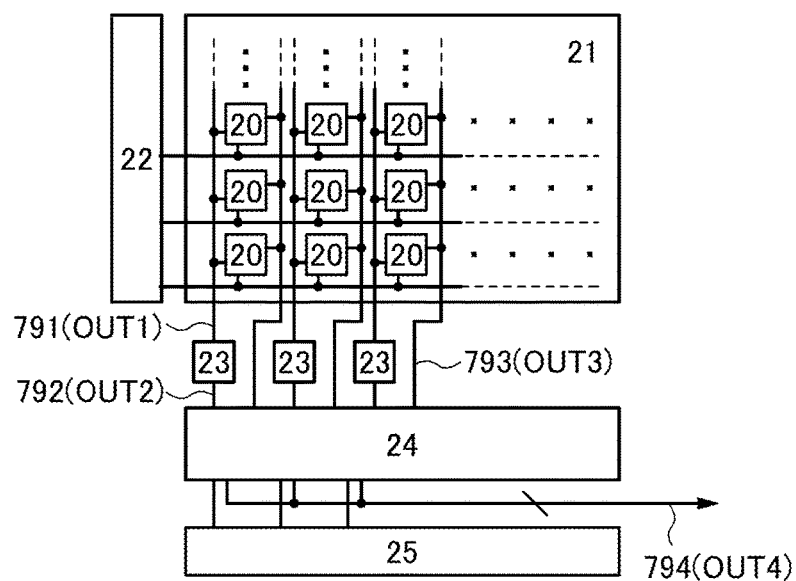
FIGS. 34A and 34B are a top view illustrating an imaging device, and a circuit diagram of a CDS circuit and a block diagram of an A/D converter circuit.

FIG. 34A illustrates an imaging device of one embodiment of the present invention. The imaging device includes a pixel array 21 including the pixels 20 arranged in a matrix, a circuit 22 (row driver) having a function of driving the pixels 20, a circuit 23 (CDS circuit) for performing correlated double sampling (CDS) on an output signal of the pixel 20, a circuit 24 (A/D converter circuit or the like) having a function of determining whether the node FD is saturated with electrons, a function of controlling the operation mode of the pixel 20 on the basis of the determination result, and a function of converting analog data output from the circuit 23 into digital data, and a circuit 25 (column driver) having a function of selecting and reading data converted by the circuit 24. Note that a configuration in which the circuit 23 is not provided can also be employed.

Figure 34B:
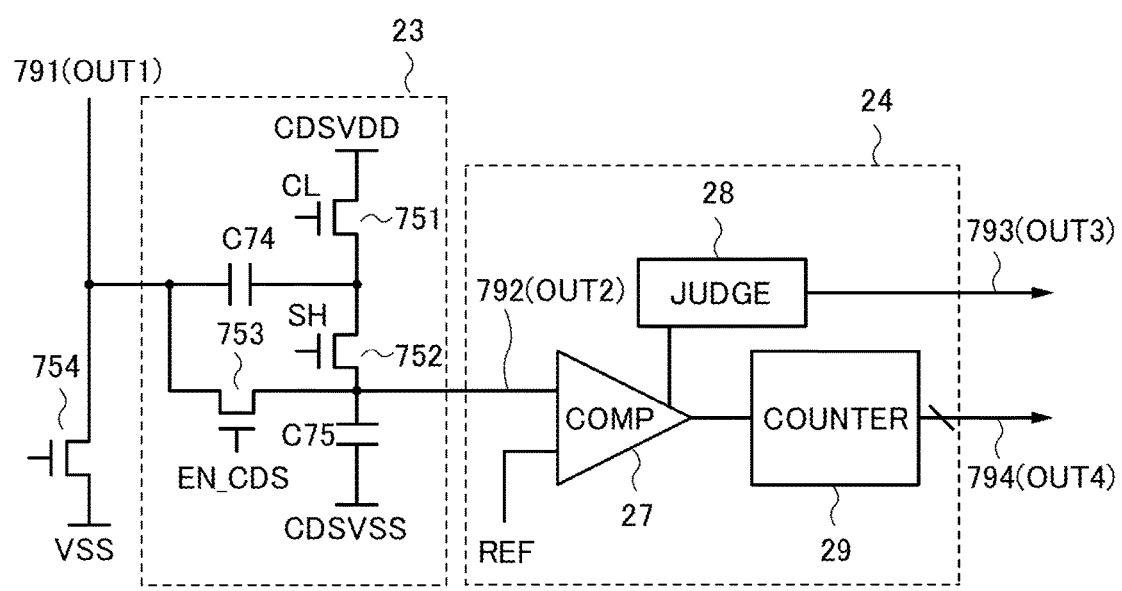

FIG. 34B shows a circuit diagram of the circuit 23 and a block diagram of the circuit 24; the circuit 23 and the circuit 24 are connected to one column of the pixel array 21. The circuit 23 can include a transistor 751, a transistor 752, a transistor 753, a capacitor C74, and a capacitor C75. The circuit 24 can include a comparator circuit 27, a determination output circuit 28, and a counter circuit 29.

A transistor 754 functions as a current supply circuit. One of a source and a drain of the transistor 754 is electrically connected to the wiring 791 (OUT1), and the other of the source and the drain of the transistor 754 is connected to a power supply line. The power supply line can function as a low potential power supply line, for example. To a gate of the transistor 754, a bias voltage is constantly applied.

In the circuit 23, one of a source and a drain of the transistor 751 is electrically connected to one of a source and a drain of the transistor 752. The one of the source and the drain of the transistor 751 is electrically connected to one electrode of the capacitor C74. The other of the source and the drain of the transistor 752 is electrically connected to one of a source and a drain of the transistor 753. The other of the source and the drain of the transistor 752 is electrically connected to one electrode of the capacitor C75. The other of the source and the drain of the transistor 752 is electrically connected to a wiring 792 (OUT2). The other of the source and the drain of the transistor 753 and the other electrode of the capacitor C74 are electrically connected to the wiring 791 (OUT1). The other of the source and the drain of the transistor 751 is electrically connected to a high potential power supply line (CDSVDD) through which a reference potential is supplied, for example. The other electrode of the capacitor C75 is electrically connected to a low potential power supply line (CDSVSS), for example.

An operation example of the circuit 23 connected to the pixel 20 illustrated in FIG. 33 will be described. First, the transistor 751 and the transistor 752 are turned on. Next, the potential of imaging data is output from the pixel 20 to the wiring 791 (OUT1), and the reference potential (CDSVDD) is held at the wiring 792 (OUT2). Then, the transistor 751 is turned off, and a reset potential (here, a potential higher than the potential of the imaging data; for example, a potential VDD) is output from the pixel 20 to the wiring 791 (OUT1). At this time, the potential of the wiring 792 (OUT2) is a value obtained by adding the absolute value of a difference between the potential of the imaging data and the reset potential to the reference potential (CDSVDD). Thus, a potential signal with little noise that is obtained by adding the net potential of the imaging data to the reference potential (CDSVDD) can be supplied to the circuit 24.

In the case where the reset potential is lower than the potential of the imaging data (for example, in the case where the reset potential is a potential GND or the like), the potential of the wiring 792 (OUT2) is a value obtained by subtracting the absolute value of the difference between the potential of the imaging data and the reset potential from the reference potential (CDSVDD).

When the transistor 753 is turned on, a bypass is formed; thus, the signal of the wiring 791 (OUT1) can be directly output to the wiring 792 (OUT2).

In the circuit 24, a signal potential input from the circuit 23 and a reference potential (REF) are compared in the comparator circuit 27. To the comparator circuit 27, the signal potential corresponding to first imaging data or second imaging data is input through the wiring 792 (OUT2). Here, the first imaging data is data of first-time light exposure, with which whether the node FD in the pixel 20 is saturated with electrons can be determined. The second imaging data is data of second-time light exposure, which is captured depending on the above determination.

First, the first imaging data is input to the comparator circuit 27, and then a determination result is output from the comparator circuit 27 to the determination output circuit 28. The determination output circuit 28 has a function of removing noise output from the comparator circuit 27 by adjusting an output timing.

In the comparator circuit 27, whether the node FD in the pixel 20 is saturated with electrons is determined with the use of the first imaging data. At this time, the reference potential (REF) input to the comparator circuit 27 is a constant potential at which the node FD is saturated with electrons; whether the node FD is saturated with electrons is determined by a comparison between the reference potential (REF) and a signal potential corresponding to the first imaging data. The signal potential corresponding to the first imaging data bypasses the circuit 23 to be input to the comparator circuit 27 in this embodiment, but may be input to the comparator circuit 27 without bypassing the circuit 23.

In the case where it is determined that the node FD is not saturated with electrons, the determination output circuit 28 outputs a signal for not changing the capacitance value of the node FD to the pixel. Specifically, a potential at which the transistor 744 is not turned on is output to the wiring 793 (OUT3) to be held in the node CN in the pixel 20. At this time, the capacitance value of the node FD is not changed.

In the case where it is determined that the node FD is saturated with electrons, the determination output circuit 28 outputs a signal for increasing the capacitance value of the node FD to the pixel. Specifically, a potential at which the transistor 744 is turned on is output to the wiring 793 (OUT3) to be held in the node CN in the pixel 20. At this time, the capacitor C72 is electrically connected to the node FD; thus, the capacitance value of the node FD is increased.

Such an operation is performed on all the pixels that can be effectively used. Then, the potential of the node FD is reset and second imaging data is captured. The signal potential corresponding to the second imaging data is input to the comparator circuit 27 through the circuit 23. At this time, the reference potential (REF) input to the comparator circuit 27 has a ramp wave, and the result of comparing the reference potential and the signal potential corresponding to the second imaging data is output to the counter circuit 29. Then, the counter circuit 29 outputs digital data corresponding to the second imaging data to a wiring 794 (OUT4).

Figure 35:
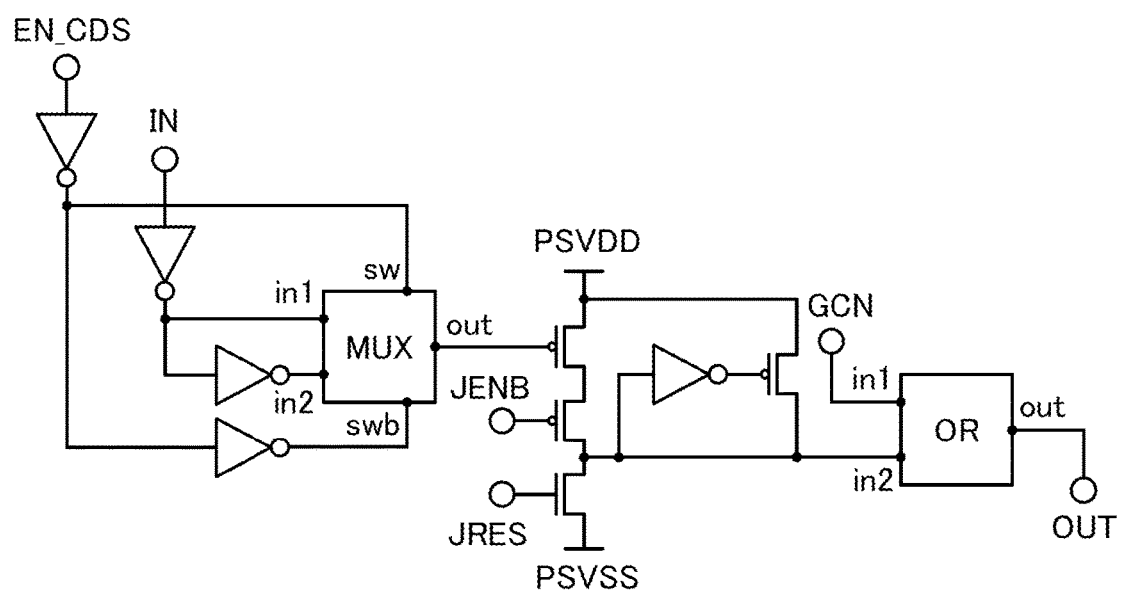
FIG. 35 is a circuit diagram of a determination output circuit.

As the determination output circuit 28, a circuit illustrated in FIG. 35 can be used, for example. To an input terminal (IN) of the circuit, an output terminal of the comparator circuit 27 is electrically connected. To an output terminal (OUT) of the circuit, the wiring 793 (OUT3) is electrically connected. The potential of the determination output circuit 28 is reset in response to a JRES signal on a selected row basis, and then the determination result of the comparator circuit 27 is output to the wiring 793 (OUT3). Note that a control signal may be input to a terminal GCN in order to fix a signal output to the wiring 793 (OUT3).

Figure 36:
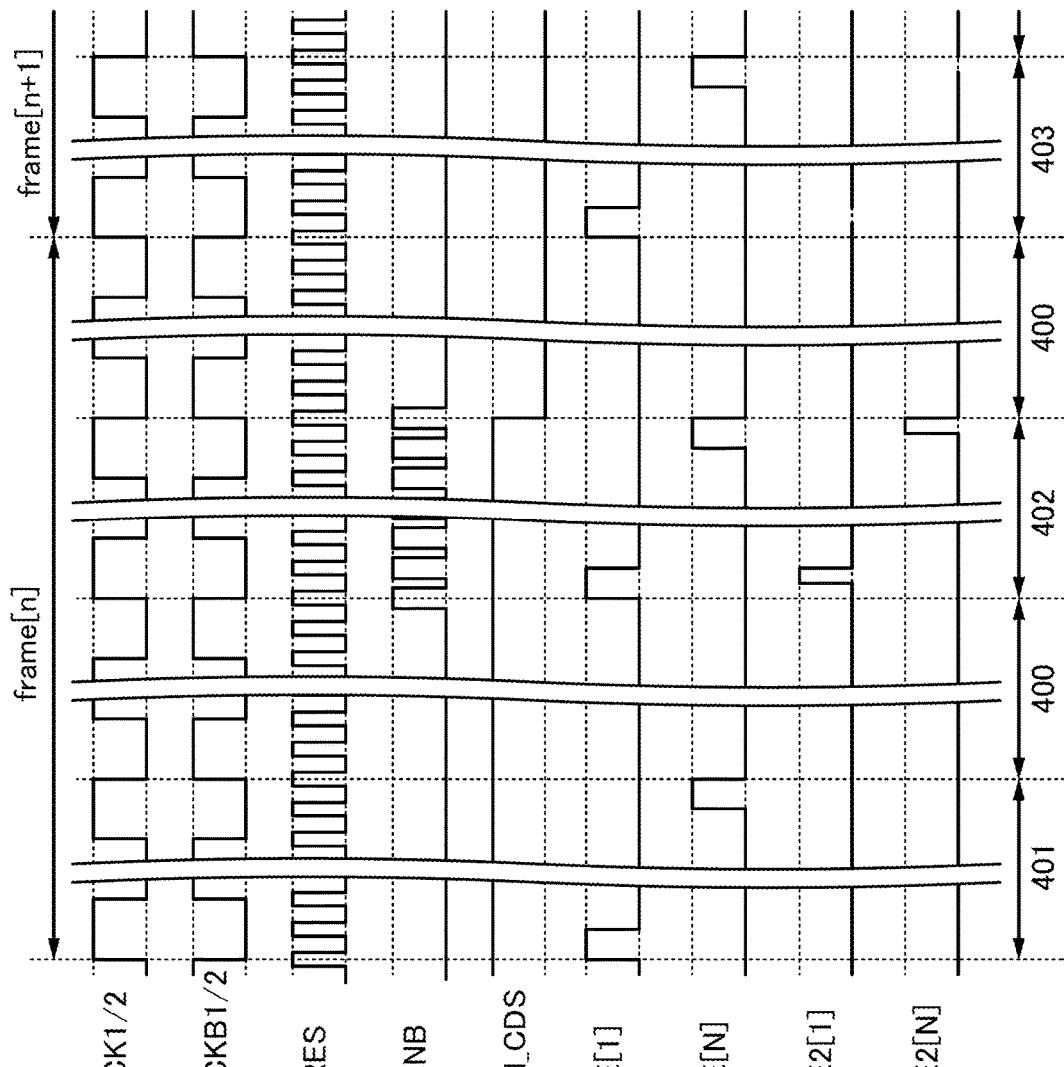
FIG. 36 is a timing chart showing an operation of a determination output circuit.

The circuit illustrated in FIG. 35 can be driven as shown in a timing chart of FIG. 36. In FIG. 36, RCK1/2 and RCKB1/2 refer to a clock signal and an inverted clock signal, respectively, that are input to the circuit 22 (row driver); JRES and JENB refer to signals input to the circuit illustrated in FIG. 35; EN_CDS refers to a signal input to a gate of the transistor 753 in the circuit 23; SE[1] refers to a signal input to the wiring 764 in the pixels 20 in the first row; SE[N] refers to a signal input to the wiring 764 in the pixels 20 in the last row; SE2[1] refers to a signal input to the wiring 765 in the pixels 20 in the first row; and SE2[N] refers to a signal input to the wiring 765 in the pixels 20 in the last row.

A period denoted by frame[n] corresponds to a period of an n-th (n is a natural number of 2 or more) frame. In the n-th frame, the period 401 corresponds to a period during which data of an (n−1)-th frame is read out, the period 402 corresponds to a period during which the first imaging data is read out and determination is performed, and the period 400 corresponds to a period during which the row driver does not operate. The period 403 in an (n+1)-th frame corresponds to a period during which data of the n-th frame is read out.

Next, the operation of the pixel 20 in FIG. 33 will be described with reference to a flow chart shown in FIG. 37 and a timing chart shown in FIG. 38. The imaging device of one embodiment of the present invention operates in a global shutter system. The operation in one frame is roughly divided into the capture of the first imaging data, the determination using the first imaging data, the capture of the second imaging data, and the reading of imaging data in the previous frame. Note that the capture of the first imaging data and the reading of the imaging data in the previous frame are performed concurrently.

Figure 37:
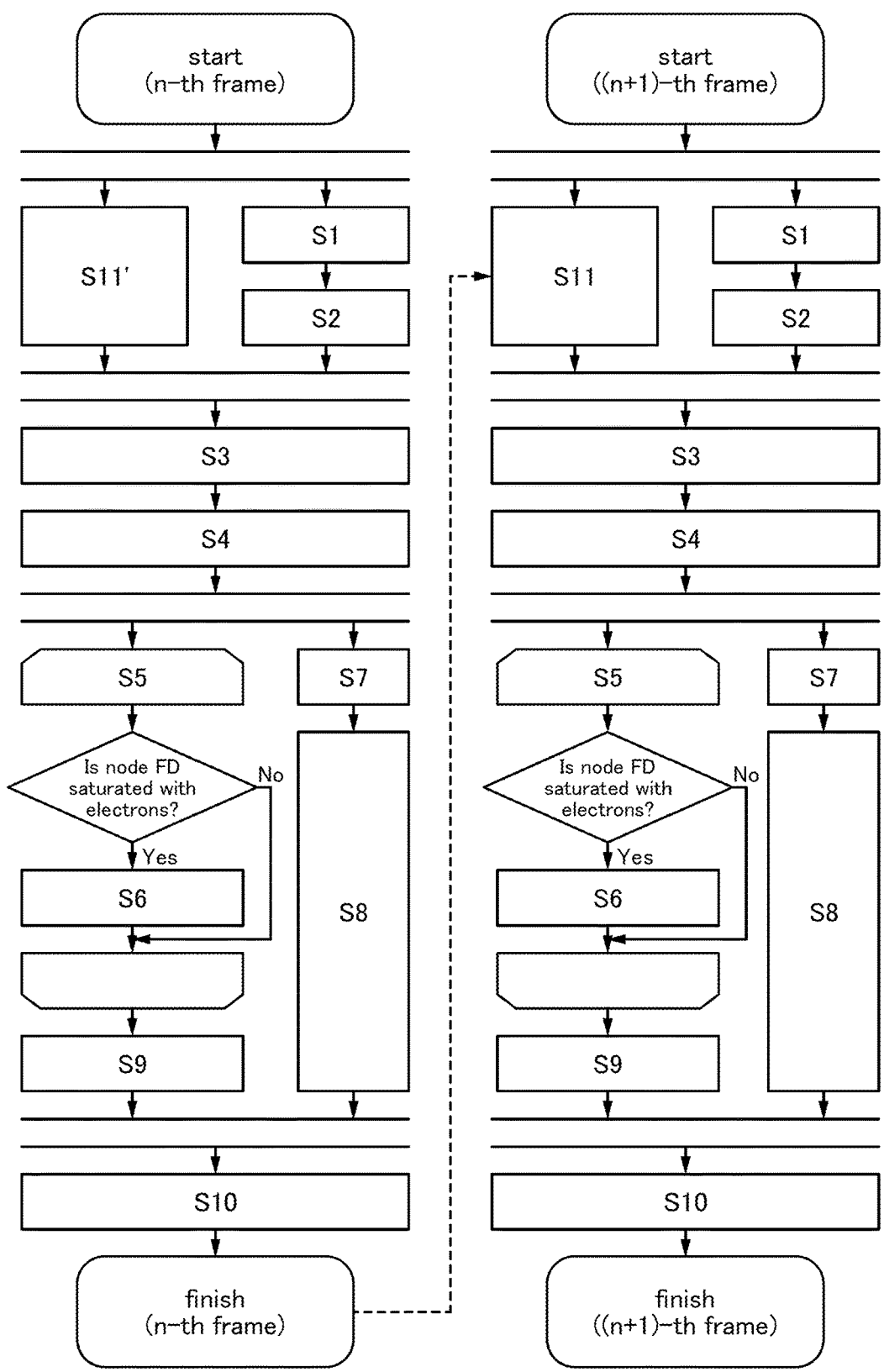
FIG. 37 is a flow chart showing an operation of an imaging device.
Figure 38:
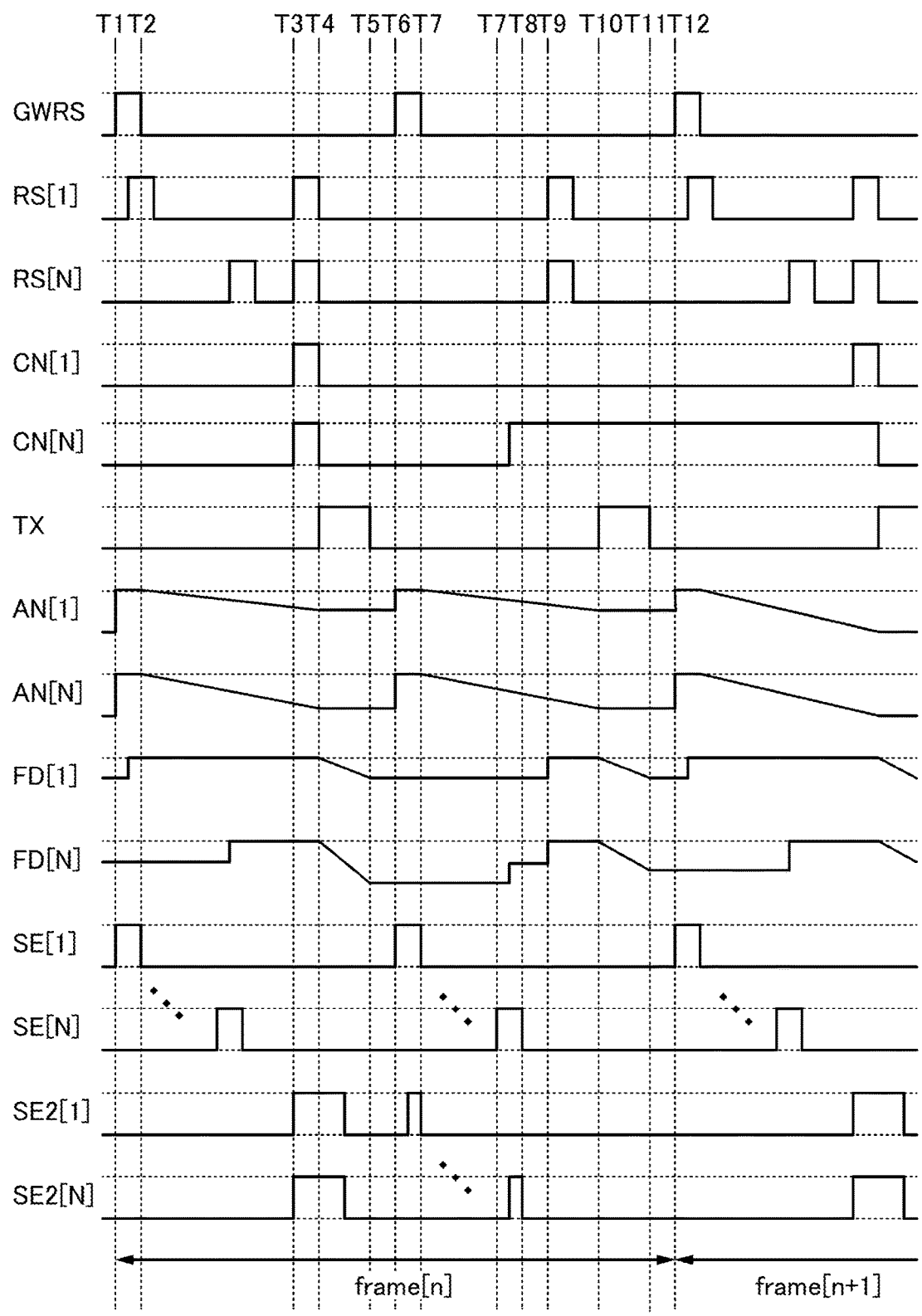
FIG. 38 is a timing chart showing an operation of an imaging device.

In FIG. 37 and FIG. 38, the n-th frame, a given frame, is used as a reference for the description. The wiring 771 (VPD) and the wiring 773 (VSS) are set at a low potential ("L"), and the wiring 772 (VRS) and the wiring 774 (VPI) are set at a high potential ("H").

In FIG. 38, GWRS refers to the potential of the wiring 762 (GWRS), RS[1] refers to the potential of the wiring 763 (RS) in the specific pixel 20 in the first row, RS[N] refers to the potential of the wiring 763 (RS) in the specific pixel 20 in the last row, CN[1] refers to the potential of the node CN in the specific pixel 20 in the first row, CN[N] refers to the potential of the node CN in the specific pixel 20 in the last row, TX refers to the potential of the wiring 761 (TX), AN[1] refers to the potential of the node AN in the specific pixel 20 in the first row, AN[N] refers to the potential of the node AN in the specific pixel 20 in the last row, FD[1] refers to the potential of the node FD in the specific pixel 20 in the first row, and FD[N] refers to the potential of the node FD in the specific pixel 20 in the last row.

First, the capture of the first imaging data and the reading of the imaging data captured in the previous frame will be described.

The first imaging data is data for determining the illuminance (low illuminance or high illuminance) of an object for imaging. In a mode for capturing the first imaging data, imaging is performed with a low capacitance value (specifically, only the capacitor C71 is connected to the node FD); thus, the node FD is saturated with electrons in an environment with high illuminance. Therefore, by determining whether the node FD is saturated with electrons, the illuminance of an object for imaging can be determined. In the timing chart of FIG. 38, the potentials for the pixels in the first row correspond to the operation in the case where the node FD is not saturated with electrons, and the potentials for the pixels in the N-th row (last row) correspond to the operation in the case where the node FD is saturated with electrons.

At Time T1, GWRS is set at "H", and thus AN[1:N] are reset to "H" (the potential of the wiring 772 (VRS)) (S1).

At Time T2, GWRS is set at "L", and thus AN[1:N] start decreasing depending on illuminance (first-time light exposure, S2).

At Time T3, RS[1:N] are set at "H" and CN[1:N] are set at "H", and thus FD[1:N] are reset to "H" (the potential of the wiring 772 (VRS)) (S3). At this time, the capacitor C72 is electrically connected to the node FD through the transistor 744. Note that in order to set CN[1:N] at "H", the wiring 765 (SE2)[1:N] are set at "H" to turn on the transistor 747 and an input signal of the terminal GCN in the determination output circuit 28 is set at "H".

At Time T4, SE2[1:N] are set at "H" and CN[1:N] are set at "L"; thus, the transistor 744 is turned off and the electrical connection between the node FD and the capacitor C72 is cut. Note that in order to set CN[1:N] at "L", the determination output circuit 28 is brought into a reset state and GCN is set at "L". After Time T4, SE2[1:N] are set at "L" to turn off the transistor 747; thus, CN[1:N] are held by the capacitor C73 and the like.

Furthermore, at Time T4, RS [1:N] are set at "L" and TX is set at "H"; thus, the potential of the node AN is transferred to the node FD, and the potential of the node FD starts decreasing (S4).

At Time T5, TX is set at "L", and thus FD[1:N] are held. The steps up to here correspond to the operation of capturing the first imaging data.

Here, during a period from Time T1 to Time T3, SE[1] to SE[N] are sequentially set at "H" for a certain period, and imaging data which has been determined in the (n−1)-th frame is read out (S10'). In other words, the operation of capturing the first imaging data in the n-th frame and the operation of reading the imaging data which has been determined in the (n−1)-th frame are performed concurrently. In this manner, imaging data is read out in the following frame, whereby the length of time for light exposure can be long even in a global shutter system. Therefore, an image with a wide dynamic range and little noise can be obtained even under low illuminance.

Figure 39A:
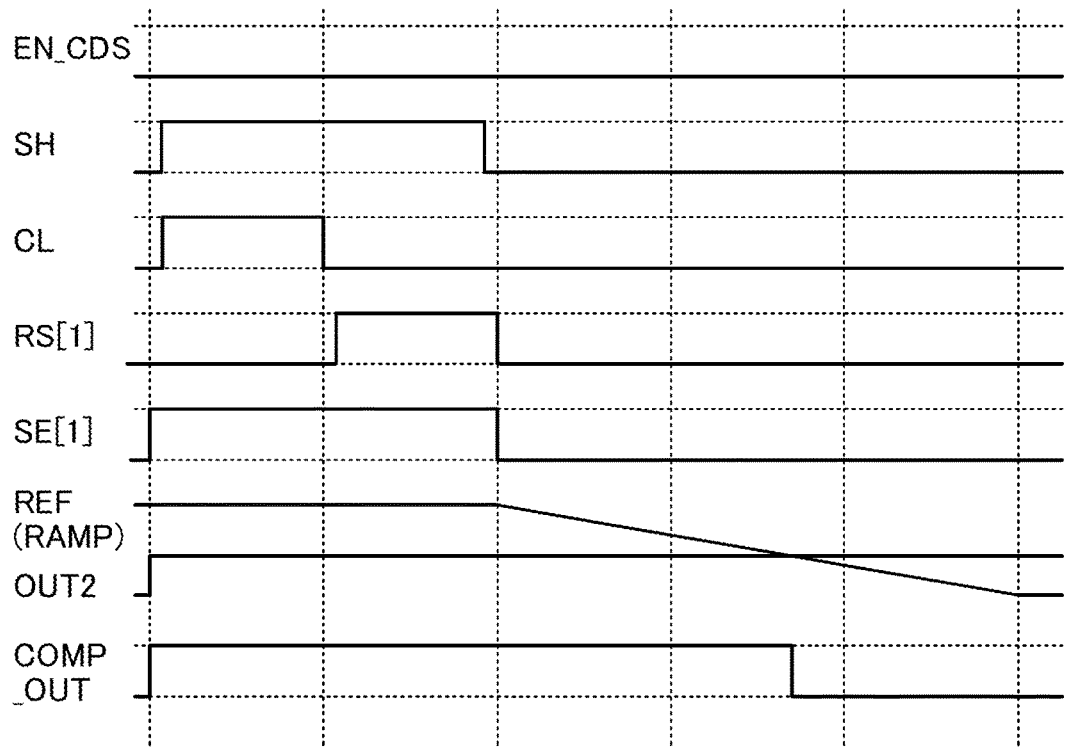
FIGS. 39A and 39B are timing charts showing operations of a CDS circuit and a comparator circuit.

FIG. 39A is a timing chart showing the operation of reading imaging data in the first row. Note that SH refers to the potential supplied to a gate of the transistor 752 in the circuit 23, CL refers to the potential supplied to a gate of the transistor 751 in the circuit 23, REF (RAMP) refers to the reference potential supplied to the comparator circuit 27, OUT2 refers to the potential of the wiring 792 (OUT2), and COMP_OUT refers to the potential of the output terminal of the compactor circuit 27.

In FIG. 38, RS[1] to RS[N] are sequentially set at "H" for a certain period before Time T3 and thus the potential of the node FD is reset; this operation accompanies the operation of the circuit 23 illustrated in FIG. 39A.

Next, the determination using the first imaging data and the operation based on the determination result will be described.

During a period from Time T6 to Time T8, SE[1] to SE[N] are sequentially set at "H" for a certain period: thus, the first imaging data is read out on a row basis, and whether the node FD is saturated with electrons is determined in each of the pixels 20 that can be effectively used (S5).

Figure 39B:
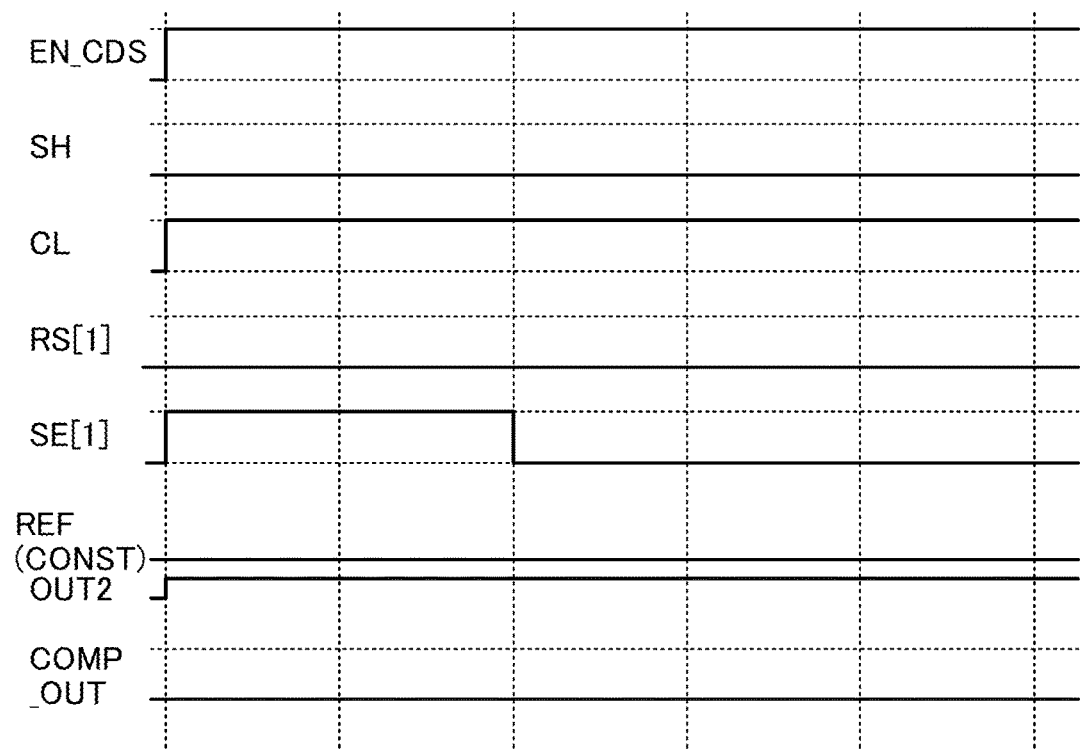

FIG. 39B is a timing chart showing the operation of reading the first imaging data in the period from Time T6 to Time T8. In the period during which the first imaging data is read out, EN_CDS is set at "H" and CL is set at "H"; thus, a signal output from the pixel 20 bypasses the circuit 23 to be input to the comparator circuit 27. Note that REF (CONST) is made constant, which is slightly higher than the potential output to the wiring 791 (OUT1) when the node FD is saturated with electrons. With such an operation, whether the node FD is saturated with electrons can be determined on the basis of the output from the comparator circuit 27. In the example of FIG. 39B, the node FD in the specific pixel 20 that is selected is saturated with electrons, and "L" is output from the output terminal of the comparator circuit 27. Note that EN_CDS may be set at "L" so that the first imaging data is read out without the signal output from the pixel 20 bypassing the circuit 23. In this case, "H" is output from the output terminal of the comparator circuit 27.

At this time, the first imaging data is used for determining whether the node FD is saturated with electrons, and is not output to the outside. Therefore, the operation of an output circuit such as the circuit 25 (column driver) needed for external output may be stopped.

Through the determination output circuit 28, the determination result using the first imaging data is output to the pixel 20 from which the first imaging data has been read. Here, in order to input the determination result to the node CN in the pixel 20 in a predetermined row, the wiring 765 (SE2) in the predetermined row is set at "H" for a certain period at a timing at which the determination result is output.

In the pixel 20 in which it has been determined that the node FD is not saturated with electrons, "L" is input to the node CN and thus the transistor 744 is not turned on. Therefore, only the capacitor C71 is electrically connected to the node FD, so that the capacitance value of the node FD is not changed. That is, the above pixel 20 is set to an imaging mode suitable for imaging under low illuminance.

In the pixel 20 in which it has been determined that the node FD is saturated with electrons, "H" is input to the node CN and thus the transistor 744 is turned on. Therefore, the capacitor C71 and the capacitor C72 are electrically connected to the node FD, so that the capacitance value of the node FD is increased (S6). That is, the above pixel 20 is set to an imaging mode suitable for imaging under high illuminance. The steps up to here correspond to the determination using the first imaging data and the operation based on the determination result.

Next, the capture of the second imaging data will be described.

The light exposure for capturing the second imaging data may be performed before all the determination results are obtained. For example, as shown in FIG. 38, GWRS is set at "H", and AN[1:N] are reset at Time T7 (S7). Then, GWRS is set at "L" at Time T8, and second-time light exposure is performed before Time T10 (S8). Note that the length of time for the second-time light exposure may be equal to or shorter than the length of time for the first-time light exposure.

At Time T9 before the completion of the second-time light exposure, RS[1:N] are set at "H", and thus FD[1:N] are reset to "H" (the potential of the wiring 772 (VRS)) (S9).

At Time T10, the wiring 761 (TX) is set at "H", so that the potential of the node AN is transferred to the node FD (S10).

At Time T11, the wiring 761 (TX) is set at "L", and thus FD[1:N] are held. The steps up to here correspond to the operation of capturing the second imaging data. Note that the second imaging data is read out as n-th frame imaging data in the (n+1)-th frame (S11).

With the above operation, the imaging mode of the second imaging data can be set per pixel 20; even in the case of imaging with a view where brightness and darkness are mixed, an image with a wide dynamic range can be obtained because the gray level can be kept.

Figure 40:
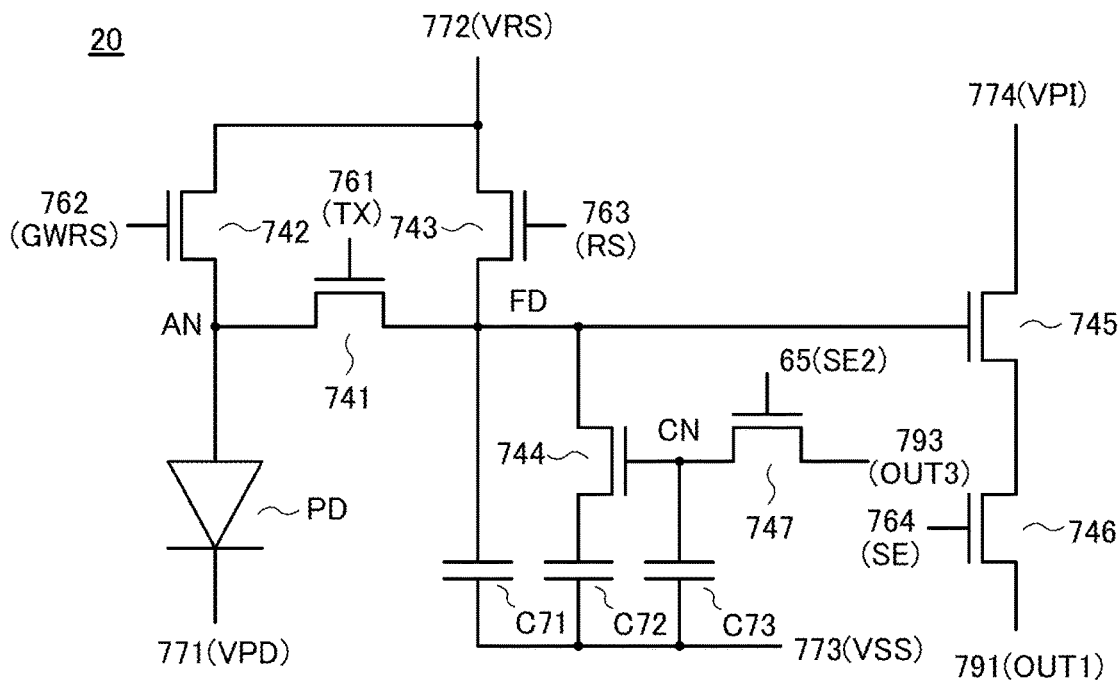
FIG. 40 illustrates a pixel circuit.
Figure 42:
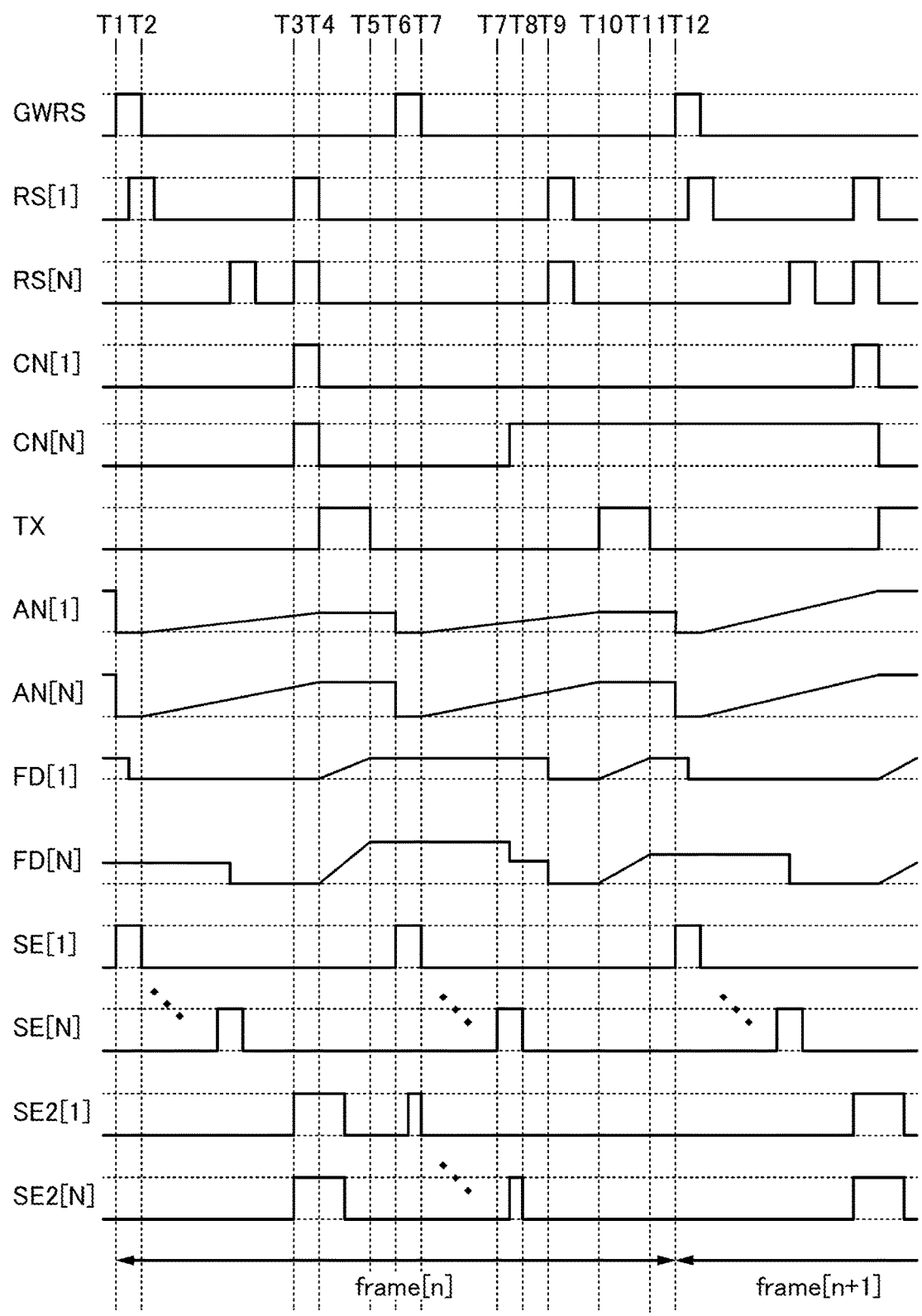
FIG. 42 is a timing chart showing an operation of an imaging device.

The pixel 20 may have a configuration illustrated in FIG. 40. The pixel 20 illustrated in FIG. 40 is different from that illustrated in FIG. 33 in the connection direction of the photoelectric conversion element PD. The pixel 20 illustrated in FIG. 40 can operate according to a timing chart of FIG. 42. In this case, the wiring 771 (VPD) and the wiring 774 (VPI) are each set at a high potential ("H"), and the wiring 772 (VRS) and the wiring 773 (VSS) are each set at a low potential ("L").

In this case, the node AN and the node FD are saturated with electrons when the potentials are reset, and they are insufficient in electrons under high illuminance. Therefore, the potentials of the node AN and the node FD are changed so as to be inverted to those in the above operation of the pixel 20 illustrated in FIG. 33.

Figure 41A:
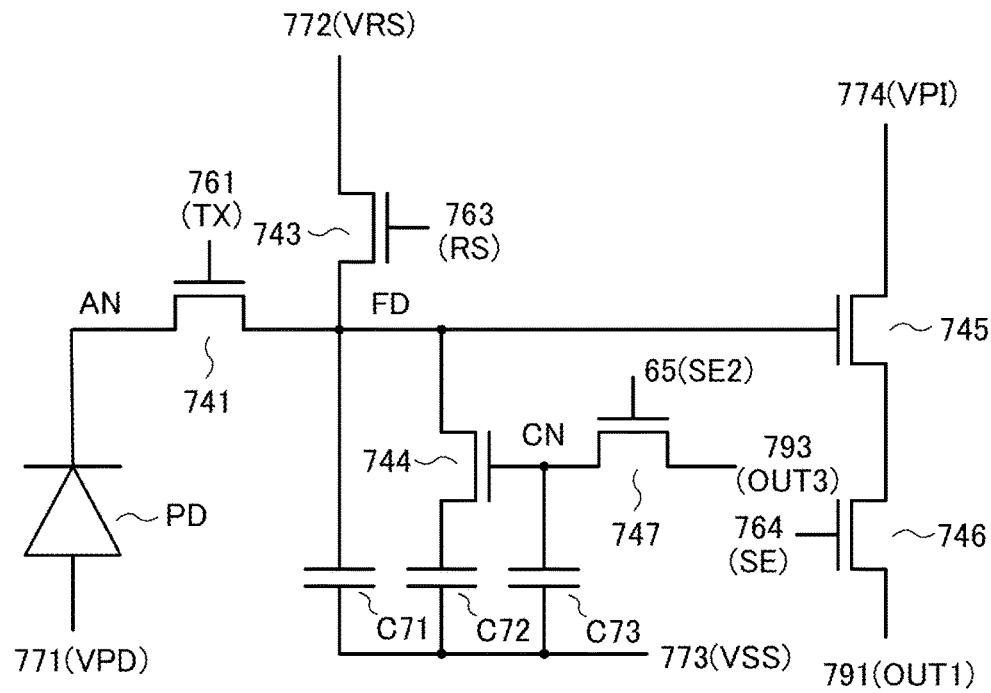
FIGS. 41A and 41B each illustrate a pixel circuit.
Figure 41B:
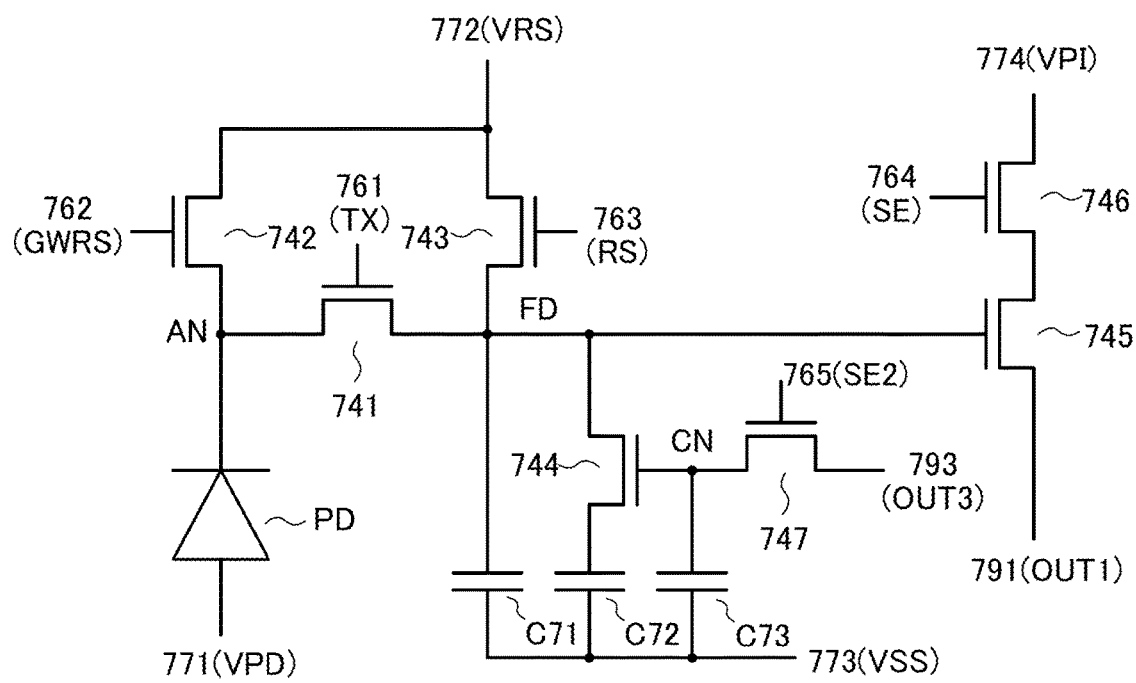

Alternatively, the pixel 20 may have a configuration illustrated in FIG. 41A or FIG. 41B. In the configuration of FIG. 41A, the transistor 742 is not provided. In this configuration, the wiring 771 (VPD) is set at a high potential, whereby the potential of the node AN can be reset. In the configuration of FIG. 41B, one of the source and the drain of the transistor 745 is connected to the wiring 791 (OUT).

Figure 43A:
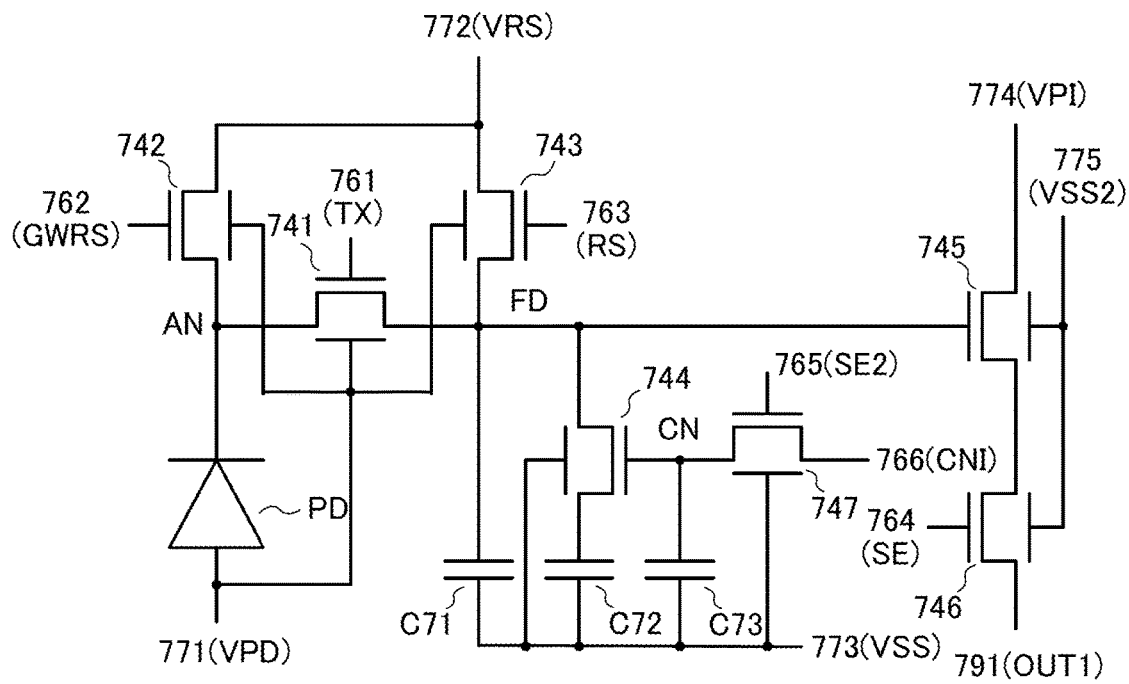
FIGS. 43A and 43B each illustrate a pixel circuit.
Figure 43B:
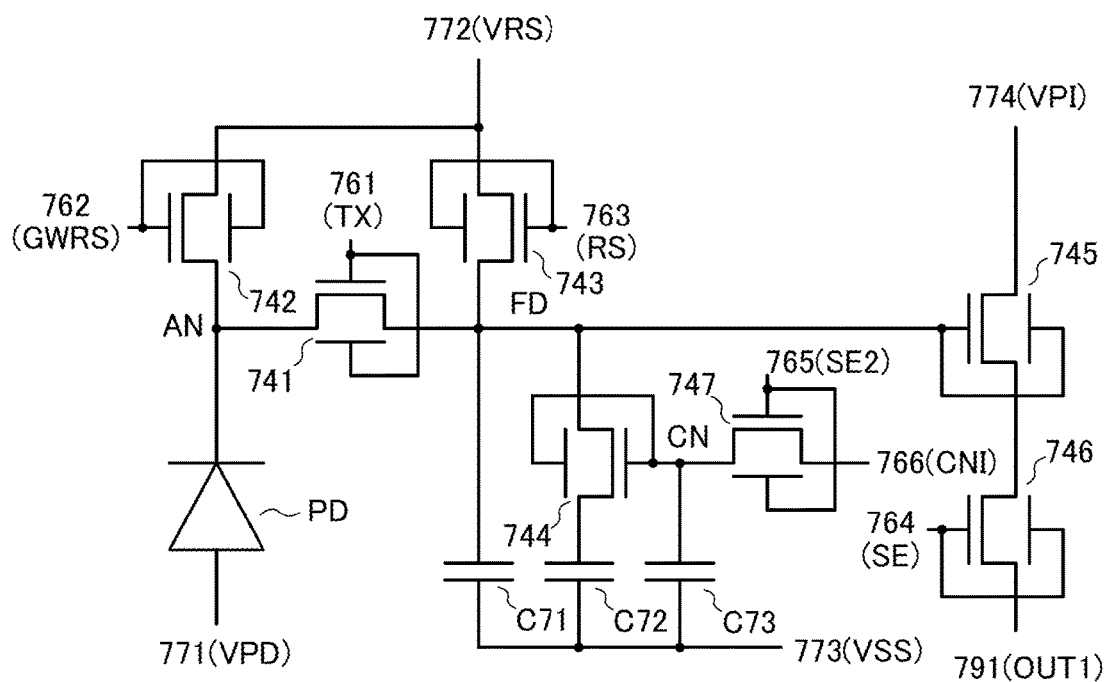

The transistors 741 to 747 in the pixel 20 may each have a back gate as illustrated in FIGS. 43A and 43B. FIG. 43A illustrates a configuration in which a constant potential is applied to the back gates, which enables control of the threshold voltages. The back gates are connected to the wiring 771 (VPD), the wiring 773 (VSS), and a wiring 775 (VSS2) through which a low potential is supplied in the example of FIG. 43A, but may be connected to one of them. FIG. 43B illustrates a configuration in which the same potential is applied to the front gate and the back gate, which enables an increase in on-state current and a decrease in off-state current. The configurations of FIGS. 43A and 43B and the like may be combined such that desired transistors can have appropriate electrical characteristics. Note that a transistor without a back gate may be provided. Note that any of the configurations of FIG. 40, FIGS. 41A and 41B, and FIGS. 43A and 43B can be combined as necessary.

Figure 44:
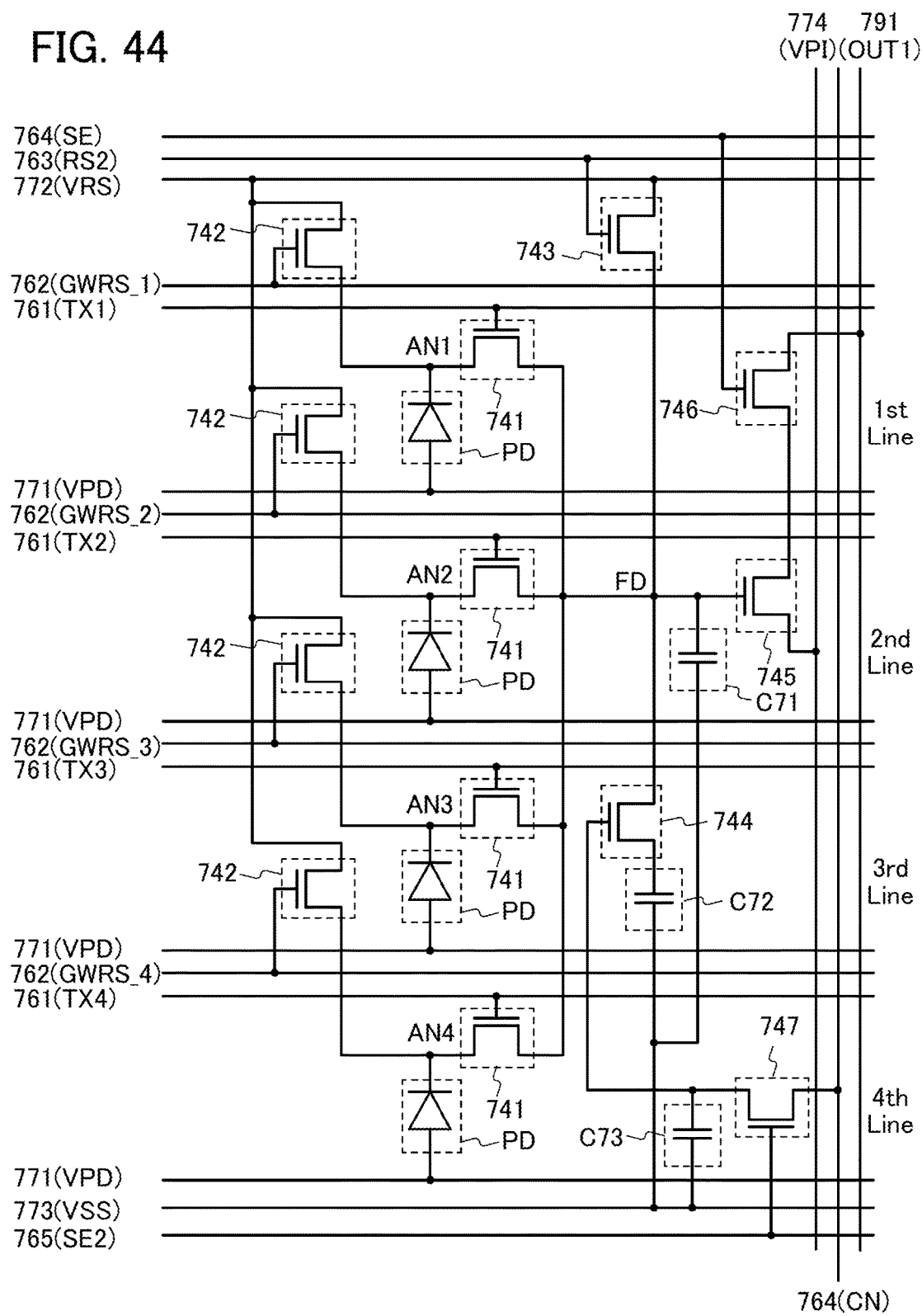
FIG. 44 illustrates a pixel circuit.

Note that the pixel 20 may have a configuration in which the transistors 743 to 747 are shared among a plurality of pixels as illustrated in FIG. 44. FIG. 44 illustrates a configuration in which the transistors 743 to 747 are shared among a plurality of pixels in the perpendicular direction; however, the transistors 743 to 747 may be shared among a plurality of pixels in the horizontal direction or in the horizontal and perpendicular directions. With such a configuration, the number of transistors included in one pixel can be reduced.

Although FIG. 44 illustrates a configuration in which the transistors 743 to 747 are shared among four pixels, the transistors 743 to 747 may be shared among two pixels, three pixels, or five or more pixels. Note that this configuration can be optionally combined with any of the configurations in FIG. 40, FIGS. 41A and 41B, and FIGS. 43A and 43B.

This embodiment can be implemented in appropriate combination with any of the structures described in the other embodiments.

Embodiment 3

In this embodiment, a transistor including an oxide semiconductor that can be used in one embodiment of the present invention will be described with reference to drawings. In the drawings in this embodiment, some components are enlarged, reduced in size, or omitted for easy understanding.

Figure 45A:
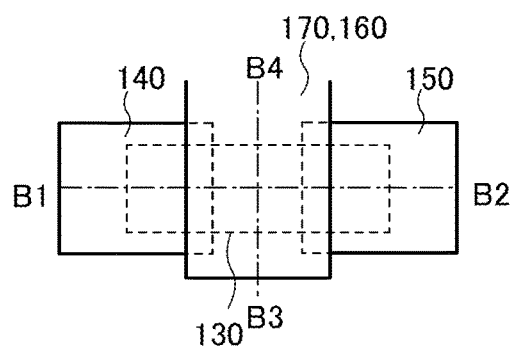
FIGS. 45A to 45F are top views and cross-sectional views illustrating transistors.
Figure 45B:
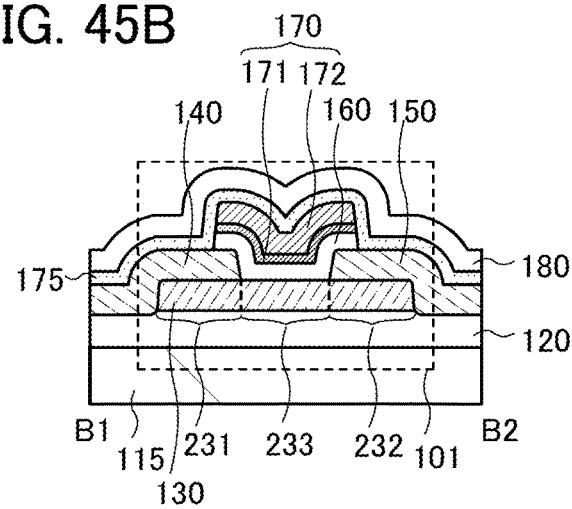
Figure 47A:
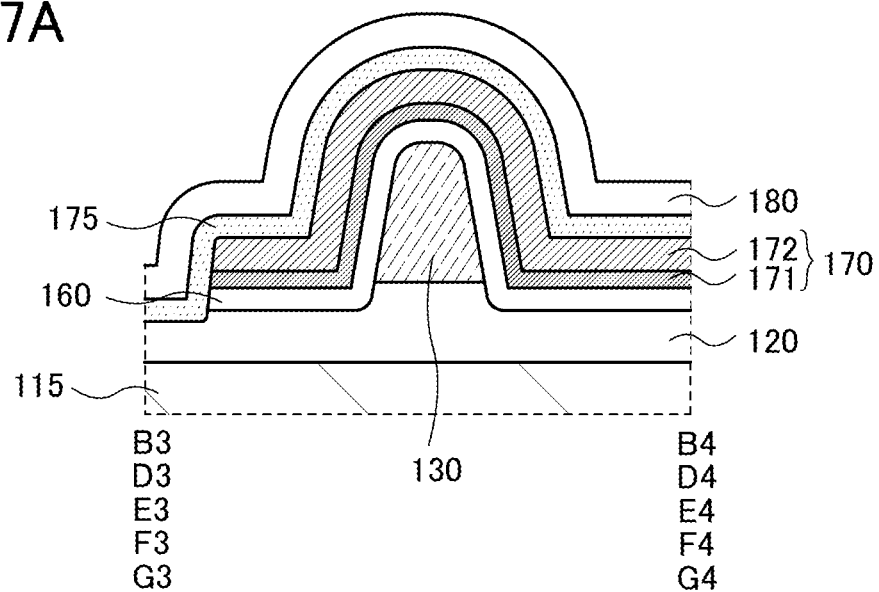
FIGS. 47A to 47D each illustrate a cross section of a transistor in a channel width direction.

FIGS. 45A and 45B are a top view and a cross-sectional view illustrating a transistor 101 of one embodiment of the present invention. FIG. 45A is the top view, and FIG. 45B illustrates a cross section taken along dashed-dotted line B1-B2 in FIG. 45A. A cross section in the direction of dashed-dotted line B3-B4 in FIG. 45A is illustrated in FIG. 47A. The direction of dashed-dotted line B1-B2 is referred to as a channel length direction, and the direction of dashed-dotted line B3-B4 is referred to as a channel width direction.

The transistor 101 includes an insulating layer 120 in contact with a substrate 115; an oxide semiconductor layer 130 in contact with the insulating layer 120; conductive layers 140 and 150 electrically connected to the oxide semiconductor layer 130; an insulating layer 160 in contact with the oxide semiconductor layer 130 and the conductive layers 140 and 150; a conductive layer 170 in contact with the insulating layer 160; an insulating layer 175 in contact with the conductive layers 140 and 150, the insulating layer 160, and the conductive layer 170; and an insulating layer 180 in contact with the insulating layer 175. The insulating layer 180 may function as a planarization film as necessary.

Here, the conductive layer 140, the conductive layer 150, the insulating layer 160, and the conductive layer 170 can function as a source electrode layer, a drain electrode layer, a gate insulating film, and a gate electrode layer, respectively.

A region 231, a region 232, and a region 233 in FIG. 45B can function as a source region, a drain region, and a channel formation region, respectively. The region 231 and the region 232 are in contact with the conductive layer 140 and the conductive layer 150, respectively. When a conductive material that is easily bonded to oxygen is used for the conductive layers 140 and 150, the resistance of the regions 231 and 232 can be reduced.

Specifically, since the oxide semiconductor layer 130 is in contact with the conductive layers 140 and 150, an oxygen vacancy is generated in the oxide semiconductor layer 130, and interaction between the oxygen vacancy and hydrogen that remains in the oxide semiconductor layer 130 or diffuses into the oxide semiconductor layer 130 from the outside changes the regions 231 and 232 to n-type regions with low resistance.

Note that functions of a "source" and a "drain" of a transistor are sometimes interchanged with each other when a transistor of an opposite conductivity type is used or when the direction of current flow is changed in circuit operation, for example. Therefore, the terms "source" and "drain" can be interchanged with each other in this specification. In addition, the term "electrode layer" can be replaced with the term "wiring".

The conductive layer 170 includes two layers, a conductive layer 171 and a conductive layer 172, in the drawing, but also may be a single layer or a stack of three or more layers. The same applies to other transistors described in this embodiment.

Each of the conductive layers 140 and 150 is a single layer in the drawing, but also may be a stack of two or more layers. The same applies to other transistors described in this embodiment.

Figure 45C:
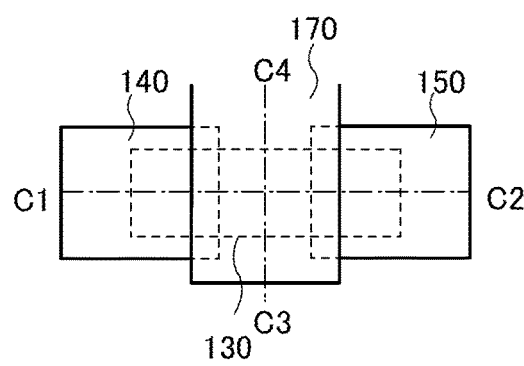
Figure 45D:
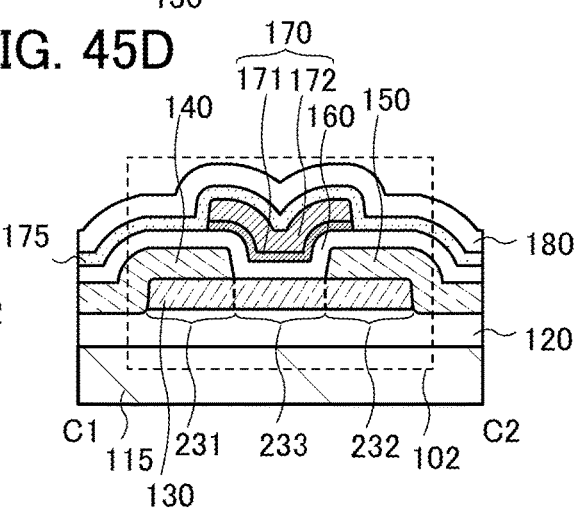
Figure 47B:
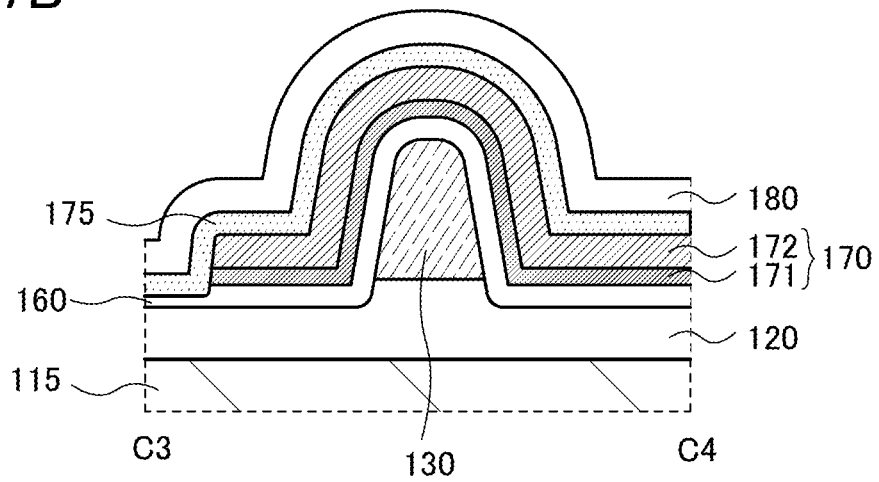

The transistor in one embodiment of the present invention may have a structure illustrated in FIGS. 45C and 45D. FIG. 45C is a top view of a transistor 102. A cross section in the direction of dashed-dotted line C1-C2 in FIG. 45C is illustrated in FIG. 45D. A cross section in the direction of dashed-dotted line C3-C4 in FIG. 45C is illustrated in FIG. 47B. The direction of dashed-dotted line C1-C2 is referred to as a channel length direction, and the direction of dashed-dotted line C3-C4 is referred to as a channel width direction.

The transistor 102 has the same structure as the transistor 101 except that an end portion of the insulating layer 160 functioning as a gate insulating film is not aligned with an end portion of the conductive layer 170 functioning as a gate electrode layer. In the transistor 102, wide areas of the conductive layers 140 and 150 are covered with the insulating layer 160 and accordingly the resistance between the conductive layer 170 and the conductive layers 140 and 150 is high; therefore, the transistor 102 has a feature of low gate leakage current.

The transistors 101 and 102 each have a top-gate structure including a region where the conductive layer 170 overlaps with the conductive layers 140 and 150. To reduce parasitic capacitance, the width of the region in the channel length direction is preferably greater than or equal to 3 nm and less than 300 nm. Since an offset region is not formed in the oxide semiconductor layer 130 in this structure, a transistor with a high on-state current can be easily formed.

Figure 45E:
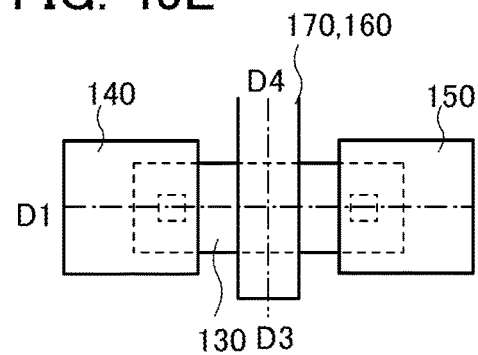
Figure 45F:
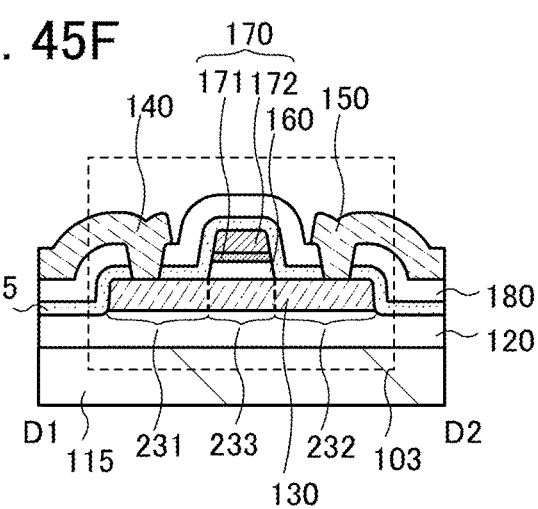

The transistor in one embodiment of the present invention may have a structure illustrated in FIGS. 45E and 45F. FIG. 45E is a top view of a transistor 103. A cross section in the direction of dashed-dotted line D1-D2 in FIG. 45E is illustrated in FIG. 45F. A cross section in the direction of dashed-dotted line D3-D4 in FIG. 45E is illustrated in FIG. 47A. The direction of dashed-dotted line D1-D2 is referred to as a channel length direction, and the direction of dashed-dotted line D3-D4 is referred to as a channel width direction.

The transistor 103 includes the insulating layer 120 in contact with the substrate 115; the oxide semiconductor layer 130 in contact with the insulating layer 120; the insulating layer 160 in contact with the oxide semiconductor layer 130; the conductive layer 170 in contact with the insulating layer 160; the insulating layer 175 covering the oxide semiconductor layer 130, the insulating layer 160, and the conductive layer 170; the insulating layer 180 in contact with the insulating layer 175; and the conductive layers 140 and 150 electrically connected to the oxide semiconductor layer 130 through openings provided in the insulating layers 175 and 180. The transistor 103 may further include, for example, an insulating layer (planarization film) in contact with the insulating layer 180 and the conductive layers 140 and 150 as necessary.

Here, the conductive layer 140, the conductive layer 150, the insulating layer 160, and the conductive layer 170 can function as a source electrode layer, a drain electrode layer, a gate insulating film, and a gate electrode layer, respectively.

The region 231, the region 232, and the region 233 in FIG. 45F can function as a source region, a drain region, and a channel formation region, respectively. The regions 231 and 232 are in contact with the insulating layer 175. When an insulating material containing hydrogen is used for the insulating layer 175, for example, the resistance of the regions 231 and 232 can be reduced.

Specifically, interaction between an oxygen vacancy generated in the regions 231 and 232 by the steps up to formation of the insulating layer 175 and hydrogen that diffuses into the regions 231 and 232 from the insulating layer 175 changes the regions 231 and 232 to n-type regions with low resistance. As the insulating material containing hydrogen, for example, silicon nitride, aluminum nitride, or the like can be used.

Figure 46A:
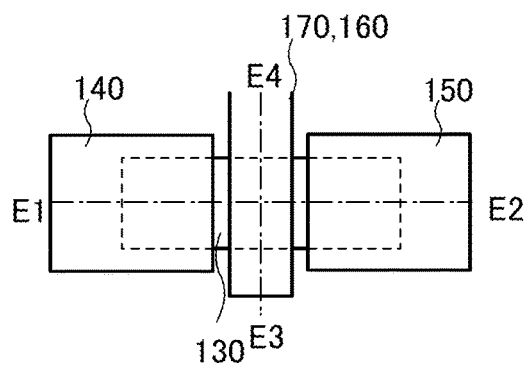
FIGS. 46A to 46F are top views and cross-sectional views illustrating transistors.
Figure 46B:
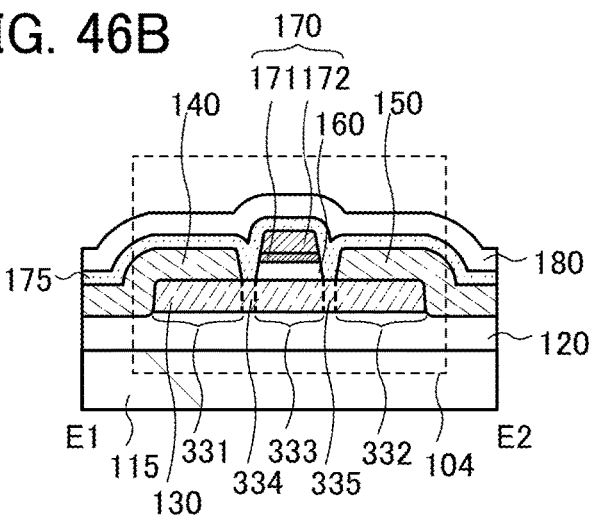

The transistor in one embodiment of the present invention may have a structure illustrated in FIGS. 46A and 46B. FIG. 46A is a top view of a transistor 104. A cross section in the direction of dashed-dotted line E1-E2 in FIG. 46A is illustrated in FIG. 46B. A cross section in the direction of dashed-dotted line E3-E4 in FIG. 46A is illustrated in FIG. 47A. The direction of dashed-dotted line E1-E2 is referred to as a channel length direction, and the direction of dashed-dotted line E3-E4 is referred to as a channel width direction.

The transistor 104 has the same structure as the transistor 103 except that the conductive layers 140 and 150 in contact with the oxide semiconductor layer 130 cover end portions of the oxide semiconductor layer 130.

In FIG. 46B, regions 331 and 334 can function as a source region, regions 332 and 335 can function as a drain region, and a region 333 can function as a channel formation region.

The resistance of the regions 331 and 332 can be reduced in a manner similar to that of the regions 231 and 232 in the transistor 101.

The resistance of the regions 334 and 335 can be reduced in a manner similar to that of the regions 231 and 232 in the transistor 103. In the case where the length of the regions 334 and 335 in the channel length direction is less than or equal to 100 nm, preferably less than or equal to 50 nm, a gate electric field prevents a significant decrease in on-state current. Therefore, a reduction in resistance of the regions 334 and 335 is not performed in some cases.

The transistors 103 and 104 each have a self-aligned structure that does not include a region where the conductive layer 170 overlaps with the conductive layers 140 and 150. A transistor with a self-aligned structure, which has extremely low parasitic capacitance between a gate electrode layer and source and drain electrode layers, is suitable for applications that require high-speed operation.

Figure 46C:
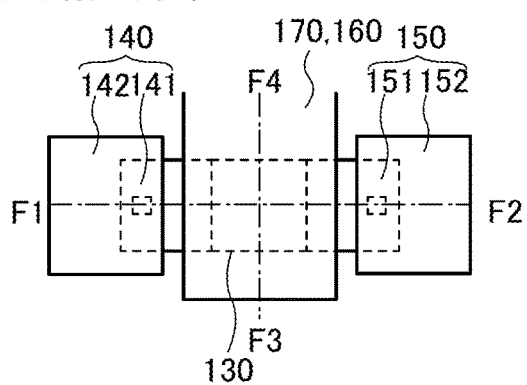
Figure 46D:
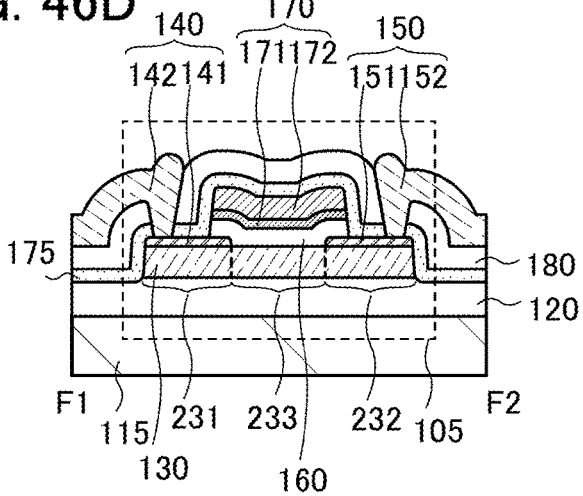

The transistor in one embodiment of the present invention may have a structure illustrated in FIGS. 46C and 46D. FIG. 46C is a top view of a transistor 105. A cross section in the direction of dashed-dotted line F1-F2 in FIG. 46C is illustrated in FIG. 46D. A cross section in the direction of dashed-dotted line F3-F4 in FIG. 46C is illustrated in FIG. 47A. The direction of dashed-dotted line F1-F2 is referred to as a channel length direction, and the direction of dashed-dotted line F3-F4 is referred to as a channel width direction.

The transistor 105 includes the insulating layer 120 in contact with the substrate 115; the oxide semiconductor layer 130 in contact with the insulating layer 120; conductive layers 141 and 151 electrically connected to the oxide semiconductor layer 130; the insulating layer 160 in contact with the oxide semiconductor layer 130 and the conductive layers 141 and 151; the conductive layer 170 in contact with the insulating layer 160; the insulating layer 175 in contact with the oxide semiconductor layer 130, the conductive layers 141 and 151, the insulating layer 160, and the conductive layer 170; the insulating layer 180 in contact with the insulating layer 175; and conductive layers 142 and 152 electrically connected to the conductive layers 141 and 151, respectively, through openings provided in the insulating layers 175 and 180. The transistor 105 may further include, for example, an insulating layer in contact with the insulating layer 180 and the conductive layers 142 and 152 as necessary.

Here, the conductive layers 141 and 151 are in contact with the top surface of the oxide semiconductor layer 130 and are not in contact with side surfaces of the oxide semiconductor layer 130.

The transistor 105 has the same structure as the transistor 101 except that the conductive layers 141 and 151 are provided, that openings are provided in the insulating layers 175 and 180, and that the conductive layers 142 and 152 electrically connected to the conductive layers 141 and 151, respectively, through the openings are provided. The conductive layer 140 (the conductive layers 141 and 142) can function as a source electrode layer, and the conductive layer 150 (the conductive layers 151 and 152) can function as a drain electrode layer.

Figure 46E:
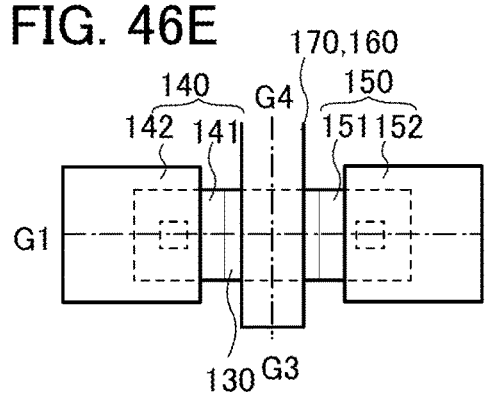
Figure 46F:
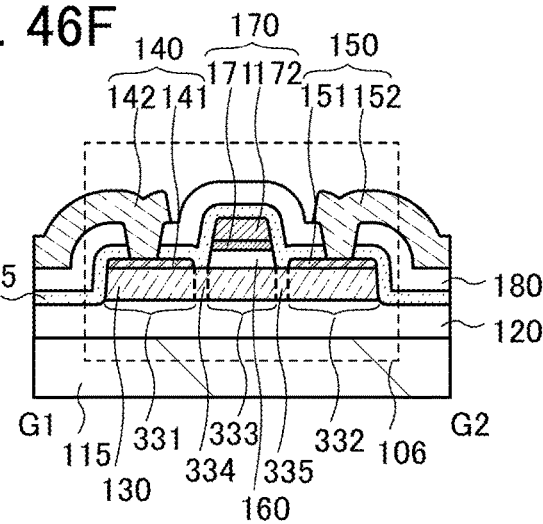

The transistor in one embodiment of the present invention may have a structure illustrated in FIGS. 46E and 46F. FIG. 46E is a top view of a transistor 106. A cross section in the direction of dashed-dotted line G1-G2 in FIG. 46E is illustrated in FIG. 46F. A cross section in the direction of dashed-dotted line G3-G4 in FIG. 46A is illustrated in FIG. 47A. The direction of dashed-dotted line G1-G2 is referred to as a channel length direction, and the direction of dashed-dotted line G3-G4 is referred to as a channel width direction.

The transistor 106 includes the insulating layer 120 in contact with the substrate 115; the oxide semiconductor layer 130 in contact with the insulating layer 120; the conductive layers 141 and 151 electrically connected to the oxide semiconductor layer 130; the insulating layer 160 in contact with the oxide semiconductor layer 130; the conductive layer 170 in contact with the insulating layer 160; the insulating layer 175 in contact with the insulating layer 120, the oxide semiconductor layer 130, the conductive layers 141 and 151, the insulating layer 160, and the conductive layer 170; the insulating layer 180 in contact with the insulating layer 175; and the conductive layers 142 and 152 electrically connected to the conductive layers 141 and 151, respectively, through openings provided in the insulating layers 175 and 180. The transistor 106 may further include, for example, an insulating layer (planarization film) in contact with the insulating layer 180 and the conductive layers 142 and 152 as necessary.

Here, the conductive layers 141 and 151 are in contact with the top surface of the oxide semiconductor layer 130 and are not in contact with side surfaces of the oxide semiconductor layer 130.

The transistor 106 has the same structure as the transistor 103 except that the conductive layers 141 and 151 are provided. The conductive layer 140 (the conductive layers 141 and 142) can function as a source electrode layer, and the conductive layer 150 (the conductive layers 151 and 152) can function as a drain electrode layer.

In the structures of the transistors 105 and 106, the conductive layers 140 and 150 are not in contact with the insulating layer 120. These structures make the insulating layer 120 less likely to be deprived of oxygen by the conductive layers 140 and 150 and facilitate oxygen supply from the insulating layer 120 to the oxide semiconductor layer 130.

An impurity for forming an oxygen vacancy to increase conductivity may be added to the regions 231 and 232 in the transistor 103 and the regions 334 and 335 in the transistors 104 and 106. As an impurity for forming an oxygen vacancy in an oxide semiconductor layer, for example, one or more of the following can be used: phosphorus, arsenic, antimony, boron, aluminum, silicon, nitrogen, helium, neon, argon, krypton, xenon, indium, fluorine, chlorine, titanium, zinc, and carbon. As a method for adding the impurity, plasma treatment, ion implantation, ion doping, plasma immersion ion implantation, or the like can be used.

When the above element is added as an impurity element to the oxide semiconductor layer, a bond between a metal element and oxygen in the oxide semiconductor layer is cut, so that an oxygen vacancy is formed. Interaction between an oxygen vacancy in the oxide semiconductor layer and hydrogen that remains in the oxide semiconductor layer or is added to the oxide semiconductor layer later can increase the conductivity of the oxide semiconductor layer.

When hydrogen is added to an oxide semiconductor in which an oxygen vacancy is formed by addition of an impurity element, hydrogen enters an oxygen vacant site and forms a donor level in the vicinity of the conduction band. Consequently, an oxide conductor can be formed. Here, an oxide conductor refers to an oxide semiconductor having become a conductor. Note that the oxide conductor has a light-transmitting property like the oxide semiconductor.

The oxide conductor is a degenerated semiconductor and it is suggested that the conduction band edge equals or substantially equals the Fermi level. For that reason, an ohmic contact is made between an oxide conductor layer and conductive layers functioning as a source electrode layer and a drain electrode layer; thus, contact resistance between the oxide conductor layer and the conductive layers functioning as a source electrode layer and a drain electrode layer can be reduced.

Figure 47C:
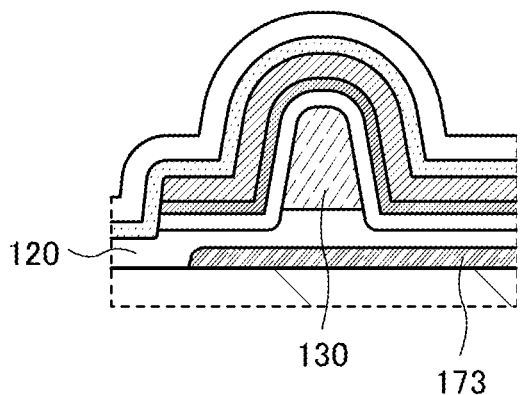
Figure 47D:
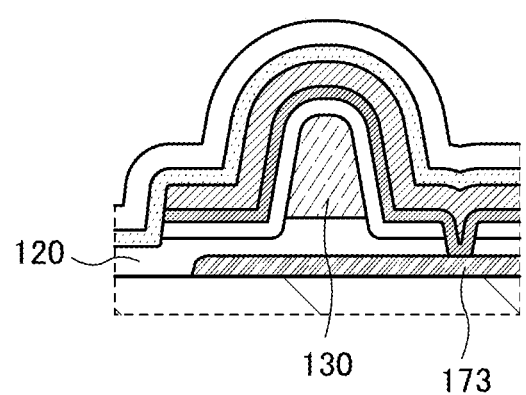
Figure 48A:
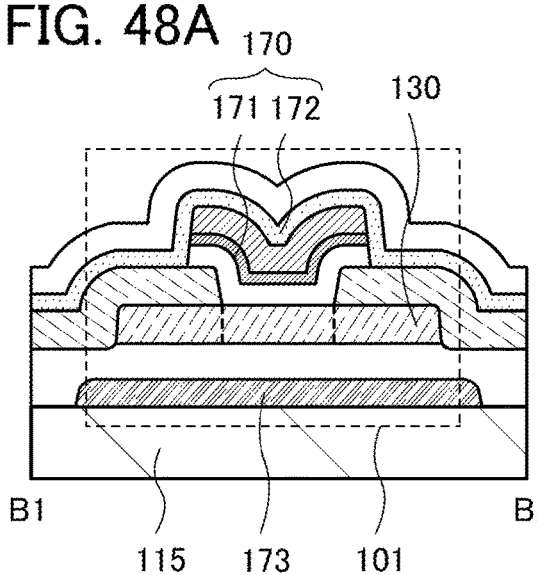
FIGS. 48A to 48F each illustrate a cross section of a transistor in a channel length direction.
Figure 48B:
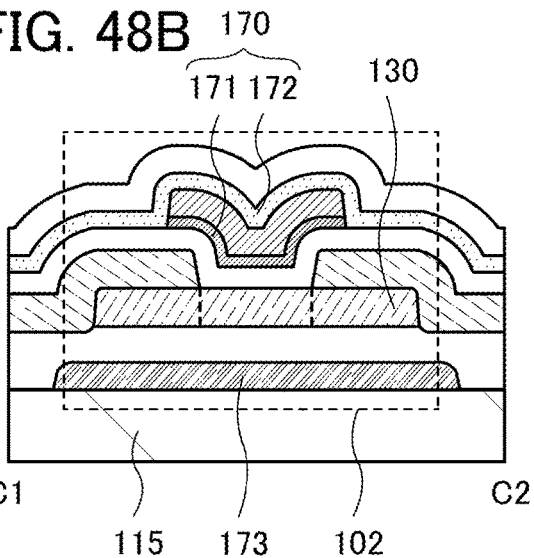
Figure 48C:
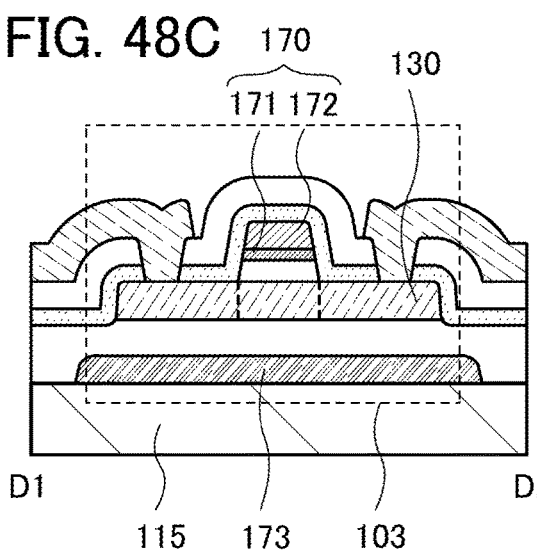
Figure 48D:
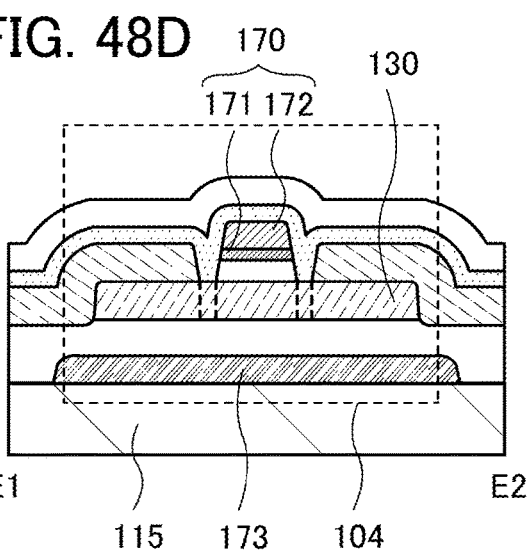
Figure 48E:
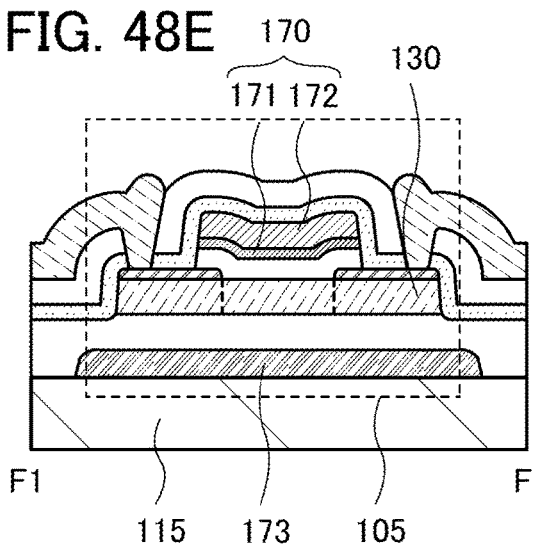
Figure 48F:
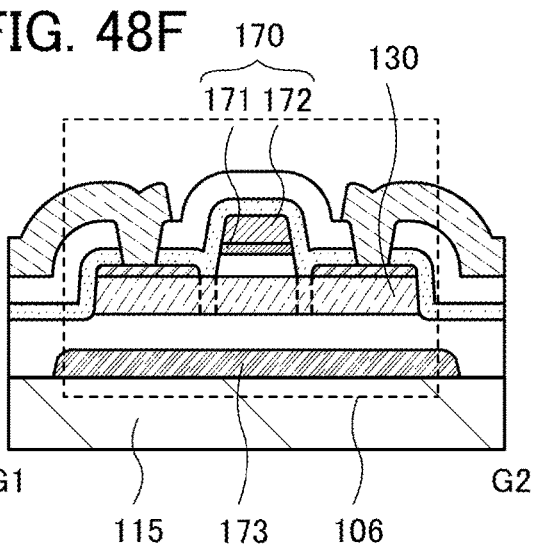

The transistor in one embodiment of the present invention may include a conductive layer 173 between the oxide semiconductor layer 130 and the substrate 115 as illustrated in cross-sectional views in the channel length direction in FIGS. 48A to 48F and cross-sectional views in the channel width direction in FIGS. 47C and 47D. When the conductive layer 173 is used as a second gate electrode layer (back gate), the on-state current can be increased or the threshold voltage can be controlled. In the cross-sectional views in FIGS. 48A to 48F, the width of the conductive layer 173 may be shorter than that of the oxide semiconductor layer 130. Moreover, the width of the conductive layer 173 may be shorter than that of the conductive layer 170.

In order to increase the on-state current, for example, the conductive layers 170 and 173 are made to have the same potential, and the transistor is driven as a double-gate transistor. Furthermore, in order to control the threshold voltage, a fixed potential that is different from the potential of the conductive layer 170 is applied to the conductive layer 173. To set the conductive layers 170 and 173 at the same potential, for example, as illustrated in FIG. 47D, the conductive layers 170 and 173 may be electrically connected to each other through a contact hole.

Although the transistors 101 to 106 in FIGS. 45A to 45F and FIGS. 46A to 46F are examples in which the oxide semiconductor layer 130 is a single layer, the oxide semiconductor layer 130 may be a stacked layer. The oxide semiconductor layer 130 in the transistors 101 to 106 can be replaced with the oxide semiconductor layer 130 in FIGS. 49B and 49C or FIGS. 49D and 49E.

Figure 49A:
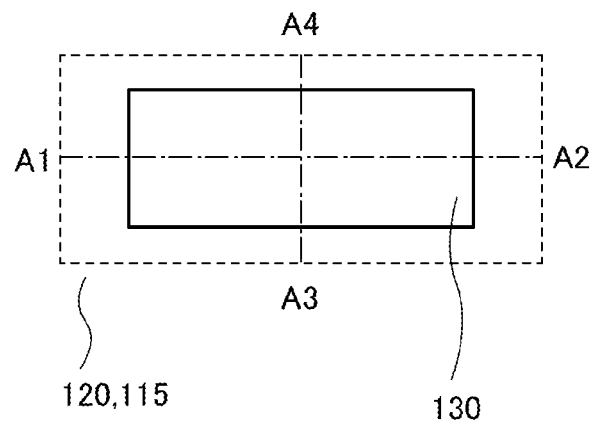
FIGS. 49A to 49E are a top view and cross-sectional views illustrating semiconductor layers.
Figure 49B:
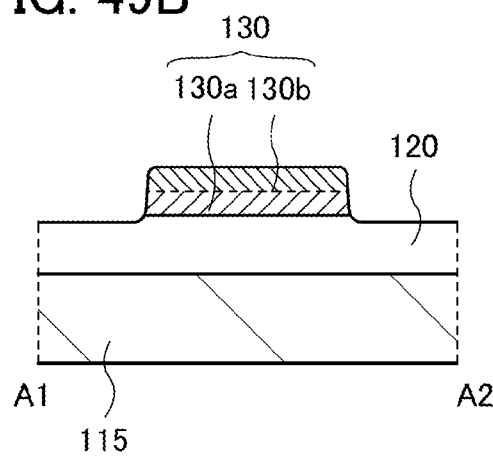
Figure 49D:
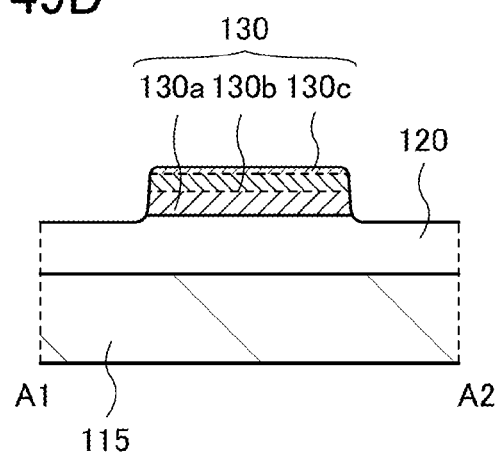
Figure 49C:
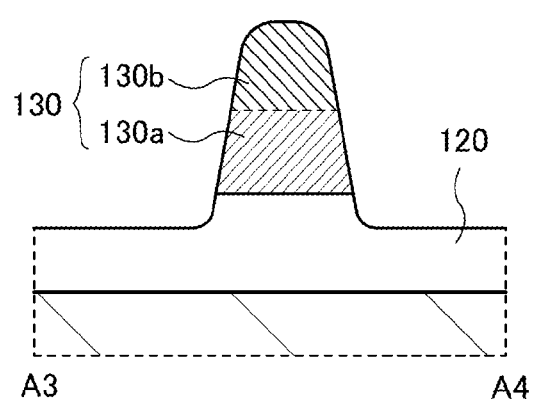
Figure 49E:
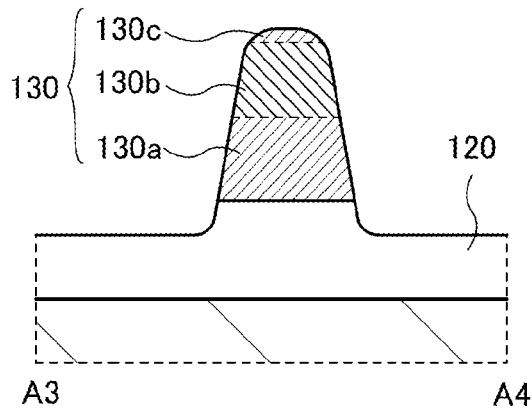

FIG. 49A is a top view of the oxide semiconductor layer 130, and FIGS. 49B and 49C are cross-sectional views of the oxide semiconductor layer 130 with a two-layer structure. FIGS. 49D and 49E are cross-sectional views of the oxide semiconductor layer 130 with a three-layer structure.

Oxide semiconductor layers with different compositions, for example, can be used as an oxide semiconductor layer 130a, an oxide semiconductor layer 130b, and an oxide semiconductor layer 130c.

Figure 50A:
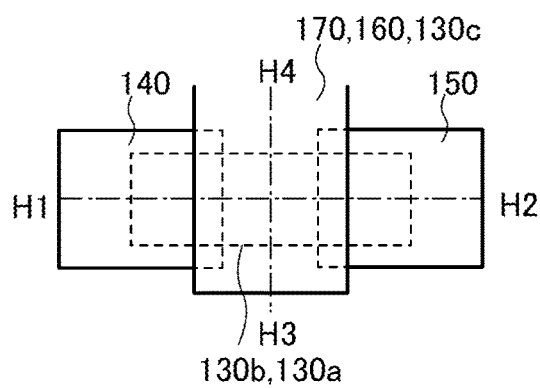
FIGS. 50A to 50F are top views and cross-sectional views illustrating transistors.
Figure 50B:
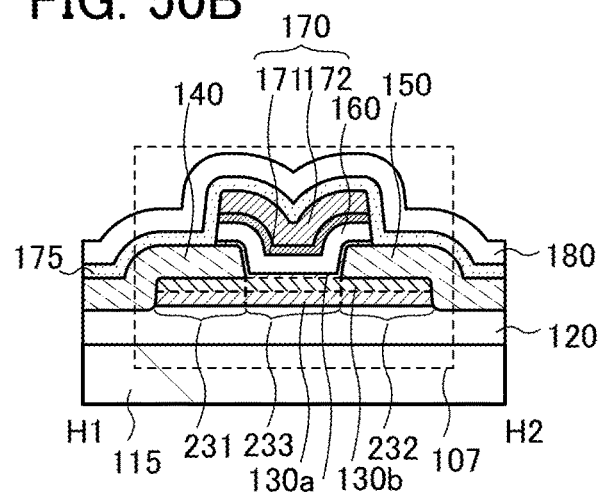
Figure 52A:
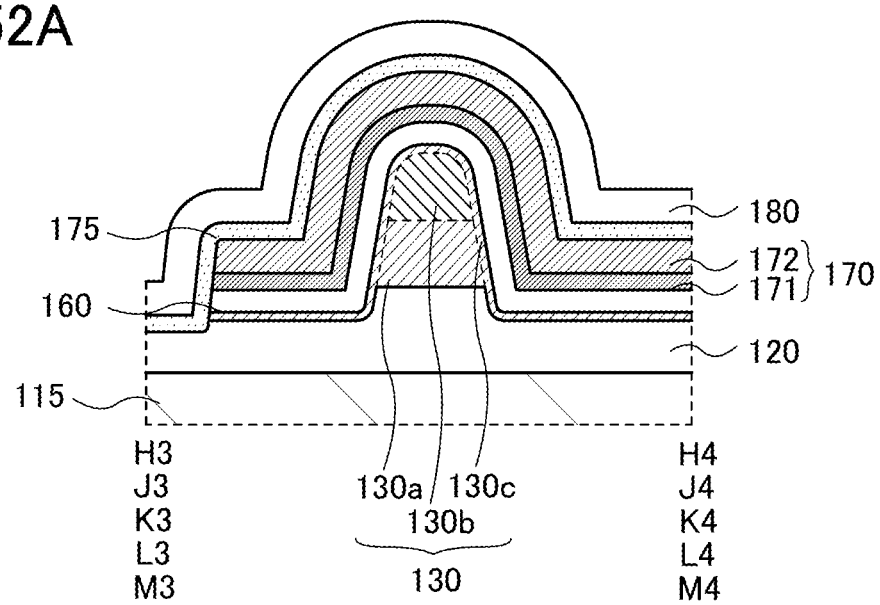
FIGS. 52A to 52D each illustrate a cross section of a transistor in a channel width direction.

The transistor in one embodiment of the present invention may have a structure illustrated in FIGS. 50A and 50B. FIG. 50A is a top view of a transistor 107. A cross section in the direction of dashed-dotted line H1-H2 in FIG. 50A is illustrated in FIG. 50B. A cross section in the direction of dashed-dotted line H3-H4 in FIG. 50A is illustrated in FIG. 52A. The direction of dashed-dotted line H1-H2 is referred to as a channel length direction, and the direction of dashed-dotted line H3-H4 is referred to as a channel width direction.

The transistor 107 includes the insulating layer 120 in contact with the substrate 115; a stack of the oxide semiconductor layers 130a and 130b in contact with the insulating layer 120; the conductive layers 140 and 150 electrically connected to the stack; the oxide semiconductor layer 130c in contact with the stack and the conductive layers 140 and 150; the insulating layer 160 in contact with the oxide semiconductor layer 130c; the conductive layer 170 in contact with the insulating layer 160; the insulating layer 175 in contact with the conductive layers 140 and 150, the oxide semiconductor layer 130c, the insulating layer 160, and the conductive layer 170; and the insulating layer 180 in contact with the insulating layer 175. The insulating layer 180 may function as a planarization film as necessary.

The transistor 107 has the same structure as the transistor 101 except that the oxide semiconductor layer 130 includes two layers (the oxide semiconductor layers 130a and 130b) in the regions 231 and 232, that the oxide semiconductor layer 130 includes three layers (the oxide semiconductor layers 130a to 130c) in the region 233, and that part of the oxide semiconductor layer (the oxide semiconductor layer 130c) exists between the insulating layer 160 and the conductive layers 140 and 150.

Figure 50C:
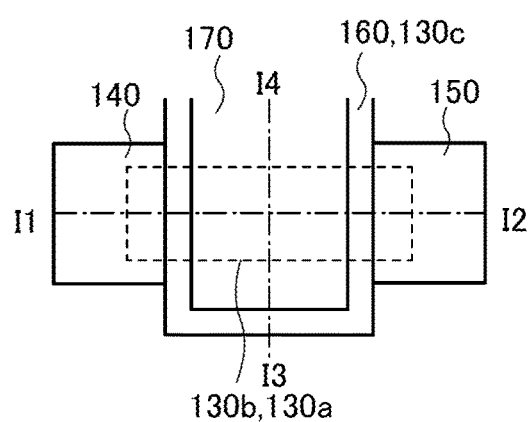
Figure 50D:
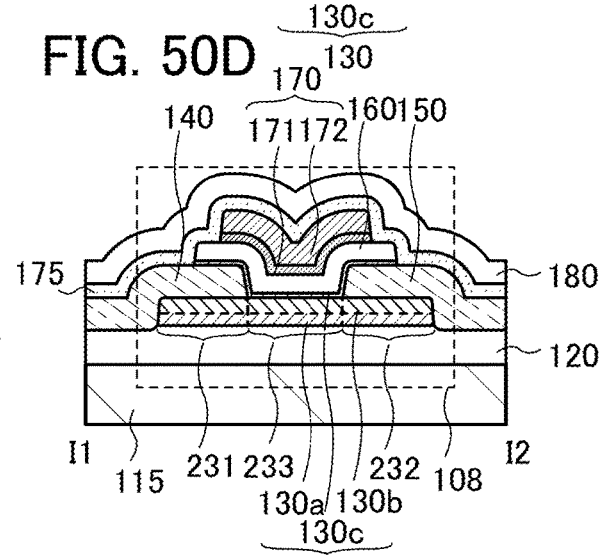
Figure 52B:
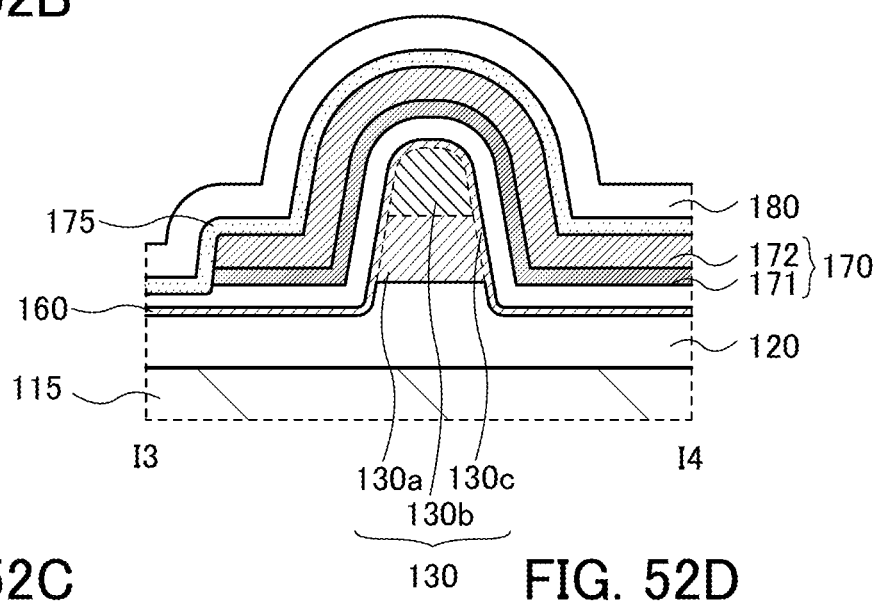

The transistor in one embodiment of the present invention may have a structure illustrated in FIGS. 50C and 50D. FIG. 50C is a top view of a transistor 108. A cross section in the direction of dashed-dotted line 11-12 in FIG. 50C is illustrated in FIG. 50D. A cross section in the direction of dashed-dotted line 13-14 in FIG. 50C is illustrated in FIG. 52B. The direction of dashed-dotted line 11-12 is referred to as a channel length direction, and the direction of dashed-dotted line 13-14 is referred to as a channel width direction.

The transistor 108 differs from the transistor 107 in that end portions of the insulating layer 160 and the oxide semiconductor layer 130c are not aligned with the end portion of the conductive layer 170.

Figure 50E:
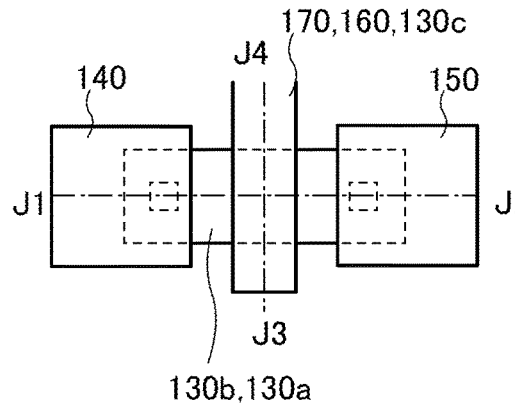
Figure 50F:
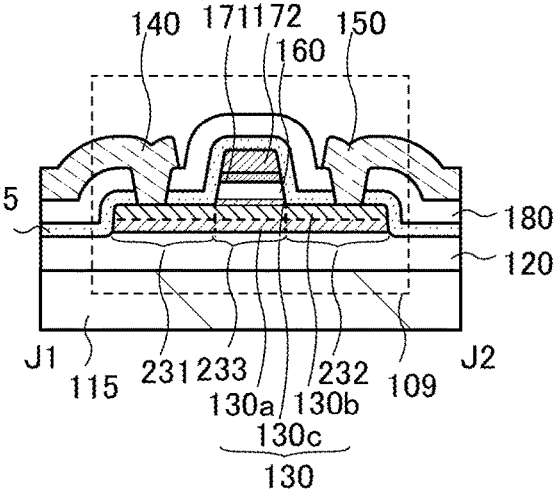

The transistor in one embodiment of the present invention may have a structure illustrated in FIGS. 50E and 50F. FIG. 50E is a top view of a transistor 109. A cross section in the direction of dashed-dotted line J1-J2 in FIG. 50E is illustrated in FIG. 50F. A cross section in the direction of dashed-dotted line J3-J4 in FIG. 50E is illustrated in FIG. 52A. The direction of dashed-dotted line J1-J2 is referred to as a channel length direction, and the direction of dashed-dotted line J3-J4 is referred to as a channel width direction.

The transistor 109 includes the insulating layer 120 in contact with the substrate 115; a stack of the oxide semiconductor layers 130a and 130b in contact with the insulating layer 120; the oxide semiconductor layer 130c in contact with the stack; the insulating layer 160 in contact with the oxide semiconductor layer 130c; the conductive layer 170 in contact with the insulating layer 160; the insulating layer 175 covering the stack, the oxide semiconductor layer 130c, the insulating layer 160, and the conductive layer 170; the insulating layer 180 in contact with the insulating layer 175; and the conductive layers 140 and 150 electrically connected to the stack through openings provided in the insulating layers 175 and 180. The transistor 109 may further include, for example, an insulating layer (planarization film) in contact with the insulating layer 180 and the conductive layers 140 and 150 as necessary.

The transistor 109 has the same structure as the transistor 103 except that the oxide semiconductor layer 130 includes two layers (the oxide semiconductor layers 130a and 130b) in the regions 231 and 232 and that the oxide semiconductor layer 130 includes three layers (the oxide semiconductor layers 130a to 130c) in the region 233.

The transistor in one embodiment of the present invention may have a structure illustrated in FIGS. 51A and 51B. FIG. 51A is a top view of a transistor 110. A cross section in the direction of dashed-dotted line K1-K2 in FIG. 51A is illustrated in FIG. 51B. A cross section in the direction of dashed-dotted line K3-K4 in FIG. 51A is illustrated in FIG. 52A. The direction of dashed-dotted line K1-K2 is referred to as a channel length direction, and the direction of dashed-dotted line K3-K4 is referred to as a channel width direction.

The transistor 110 has the same structure as the transistor 104 except that the oxide semiconductor layer 130 includes two layers (the oxide semiconductor layers 130a and 130b) in the regions 331 and 332 and that the oxide semiconductor layer 130 includes three layers (the oxide semiconductor layers 130a to 130c) in the region 333.

The transistor in one embodiment of the present invention may have a structure illustrated in FIGS. 51C and 51D. FIG. 51C is a top view of a transistor 111. A cross section in the direction of dashed-dotted line L1-L2 in FIG. 51C is illustrated in FIG. 51D. A cross section in the direction of dashed-dotted line L3-L4 in FIG. 51C is illustrated in FIG. 52A. The direction of dashed-dotted line L1-L2 is referred to as a channel length direction, and the direction of dashed-dotted line L3-L4 is referred to as a channel width direction.

The transistor 111 includes the insulating layer 120 in contact with the substrate 115; a stack of the oxide semiconductor layers 130a and 130b in contact with the insulating layer 120; the conductive layers 141 and 151 electrically connected to the stack; the oxide semiconductor layer 130c in contact with the stack and the conductive layers 141 and 151; the insulating layer 160 in contact with the oxide semiconductor layer 130c; the conductive layer 170 in contact with the insulating layer 160; the insulating layer 175 in contact with the stack, the conductive layers 141 and 151, the oxide semiconductor layer 130c, the insulating layer 160, and the conductive layer 170; the insulating layer 180 in contact with the insulating layer 175; and the conductive layers 142 and 152 electrically connected to the conductive layers 141 and 151, respectively, through openings provided in the insulating layers 175 and 180. The transistor 111 may further include, for example, an insulating layer (planarization film) in contact with the insulating layer 180 and the conductive layers 142 and 152 as necessary.

The transistor 111 has the same structure as the transistor 105 except that the oxide semiconductor layer 130 includes two layers (the oxide semiconductor layers 130a and 130b) in the regions 231 and 232, that the oxide semiconductor layer 130 includes three layers (the oxide semiconductor layers 130a to 130c) in the region 233, and that part of the oxide semiconductor layer (the oxide semiconductor layer 130c) exists between the insulating layer 160 and the conductive layers 141 and 151.

The transistor in one embodiment of the present invention may have a structure illustrated in FIGS. 51E and 51F. FIG. 51E is a top view of a transistor 112. A cross section in the direction of dashed-dotted line M1-M2 in FIG. 51E is illustrated in FIG. 51F. A cross section in the direction of dashed-dotted line M3-M4 in FIG. 51E is illustrated in FIG. 52A. The direction of dashed-dotted line M1-M2 is referred to as a channel length direction, and the direction of dashed-dotted line M3-M4 is referred to as a channel width direction.

The transistor 112 has the same structure as the transistor 106 except that the oxide semiconductor layer 130 includes two layers (the oxide semiconductor layers 130a and 130b) in the regions 331, 332, 334, and 335 and that the oxide semiconductor layer 130 includes three layers (the oxide semiconductor layers 130a to 130c) in the region 333.

Figure 52C:
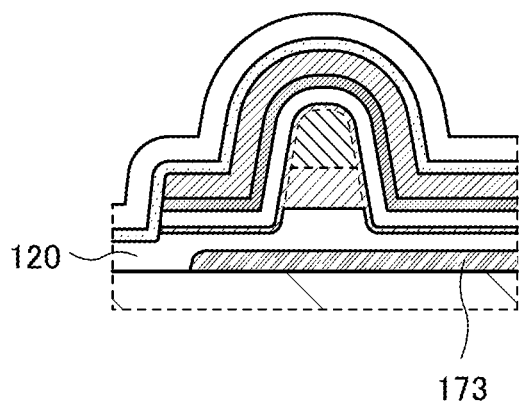
Figure 52D:
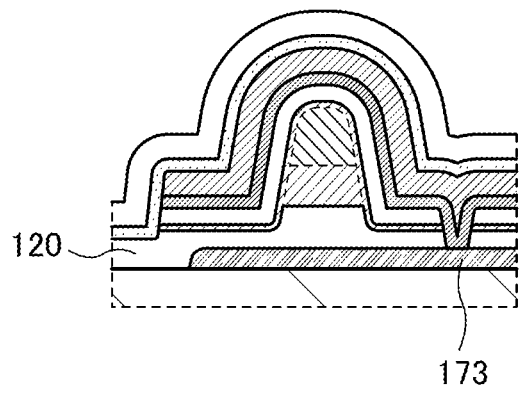
Figure 53A:
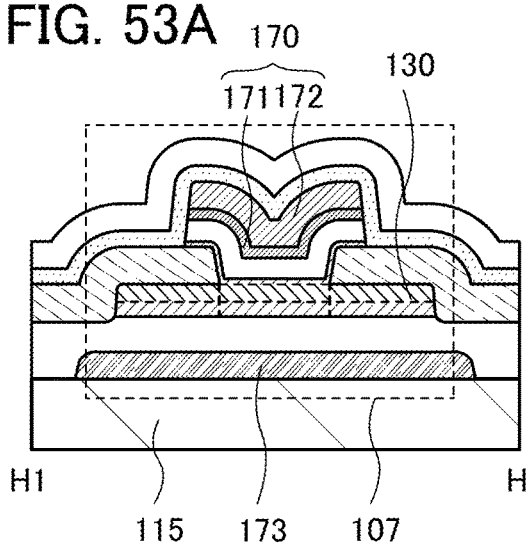
FIGS. 53A to 53F each illustrate a cross section of a transistor in a channel length direction.
Figure 53B:
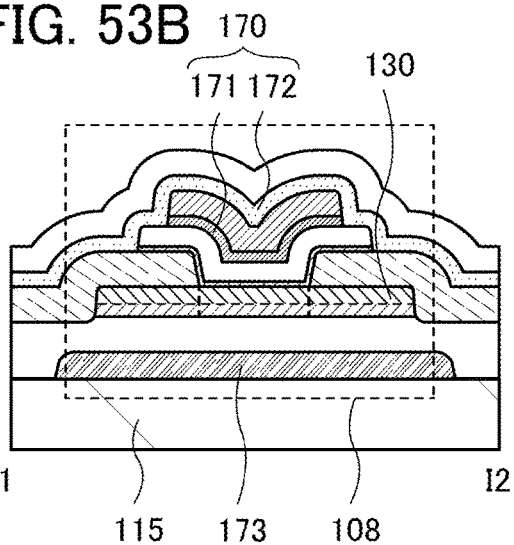
Figure 53C:
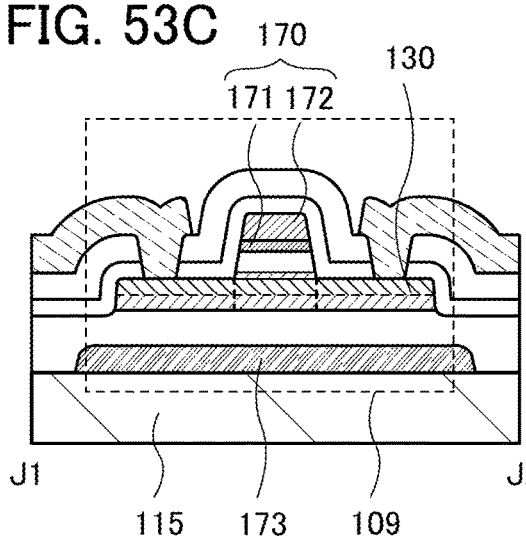
Figure 53D:
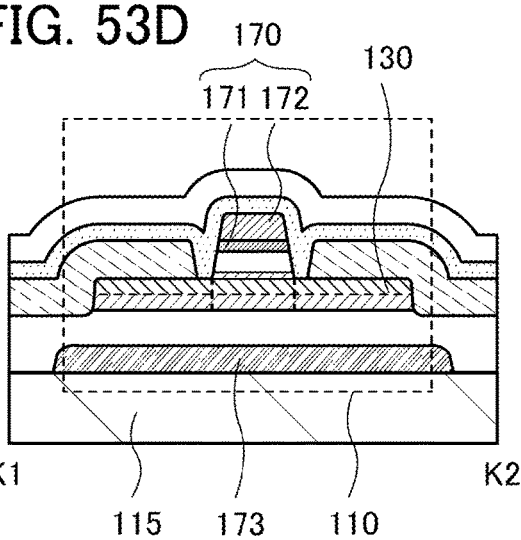
Figure 53E:
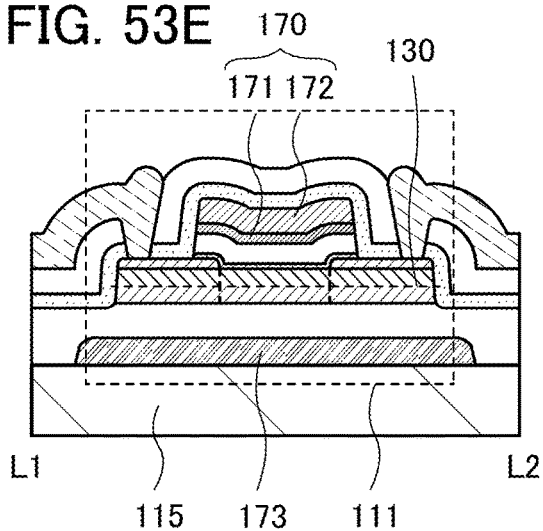
Figure 53F:
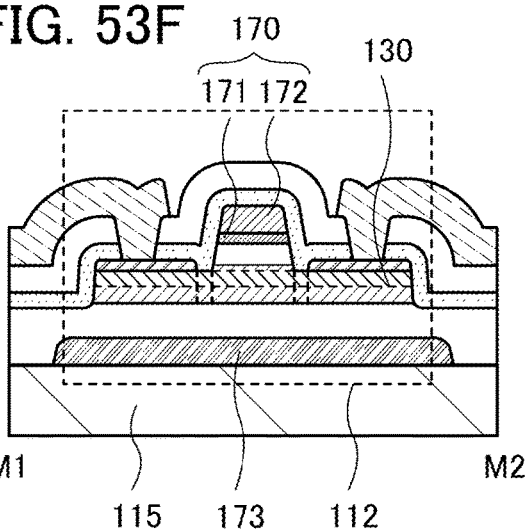

The transistor in one embodiment of the present invention may include the conductive layer 173 between the oxide semiconductor layer 130 and the substrate 115 as illustrated in cross-sectional views in the channel length direction in FIGS. 53A to 53F and cross-sectional views in the channel width direction in FIGS. 52C and 52D. When the conductive layer is used as a second gate electrode layer (back gate), the on-state current can be further increased or the threshold voltage can be controlled. In the cross-sectional views in FIGS. 53A to 53F, the width of the conductive layer 173 may be shorter than that of the oxide semiconductor layer 130. Moreover, the width of the conductive layer 173 may be shorter than that of the conductive layer 170.

Figure 54A:
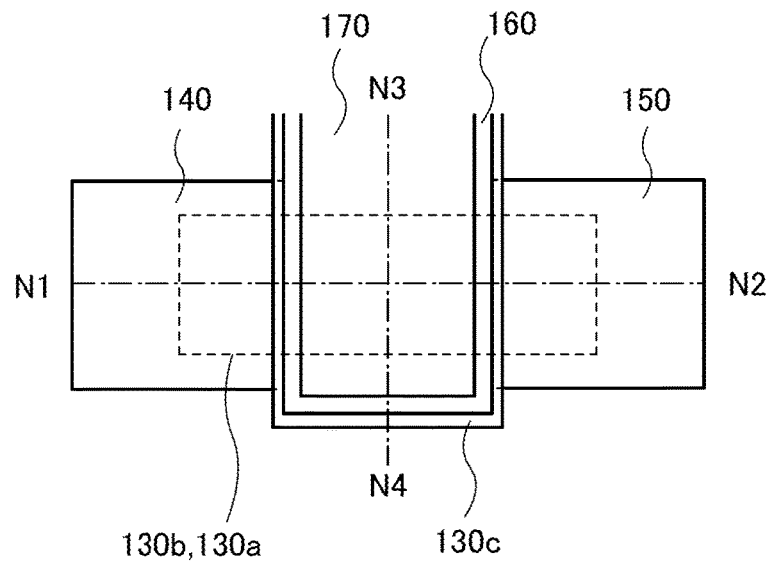
FIGS. 54A and 54B are a top view and cross-sectional views illustrating a transistor.
Figure 54B:
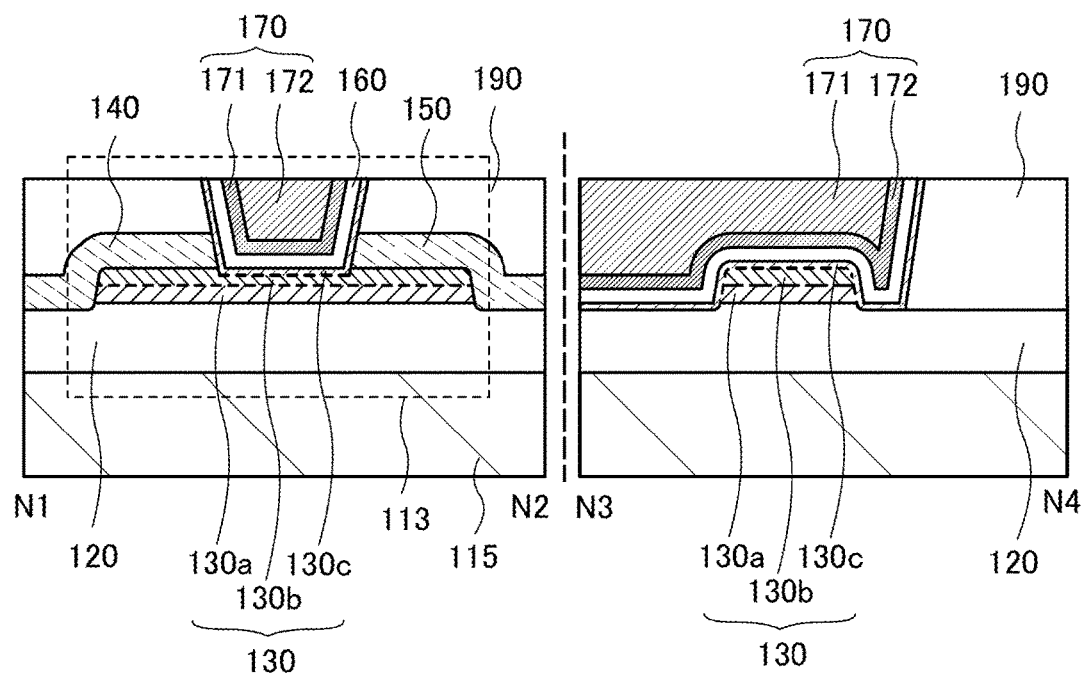

The transistor in one embodiment of the present invention may have a structure illustrated in FIGS. 54A and 54B. FIG. 54A is a top view and FIG. 54B is a cross-sectional view taken along dashed-dotted line N1-N2 and dashed-dotted line N3-N4 in FIG. 54A. Note that for simplification of the drawing, some components are not illustrated in the top view in FIG. 54A.

A transistor 113 illustrated in FIGS. 54A and 54B includes the substrate 115, the insulating layer 120 over the substrate 115, the oxide semiconductor layer 130 (the oxide semiconductor layer 130a, the oxide semiconductor layer 130b, and the oxide semiconductor layer 130c) over the insulating layer 120, the conductive layers 140 and 150 which are in contact with the oxide semiconductor layer 130 and are apart from each other, the insulating layer 160 in contact with the oxide semiconductor layer 130c, and the conductive layer 170 in contact with the insulating layer 160. Note that the oxide semiconductor layer 130c, the insulating layer 160, and the conductive layer 170 are provided in an opening which is provided in the insulating layer 190 over the transistor 113 and reaches the oxide semiconductor layers 130a and 130b and the insulating layer 120.

The transistor 113 has a smaller region in which a conductor serving as a source electrode or a drain electrode overlaps with a conductor serving as a gate electrode than the other transistors described above; thus, the parasitic capacitance in the transistor 113 can be reduced. Therefore, the transistor 113 is preferable as a component of a circuit for which high-speed operation is needed. As illustrated in FIG. 54B, a top surface of the transistor 113 is preferably planarized by a chemical mechanical polishing (CMP) method or the like, but is not necessarily planarized.

Figure 55A:
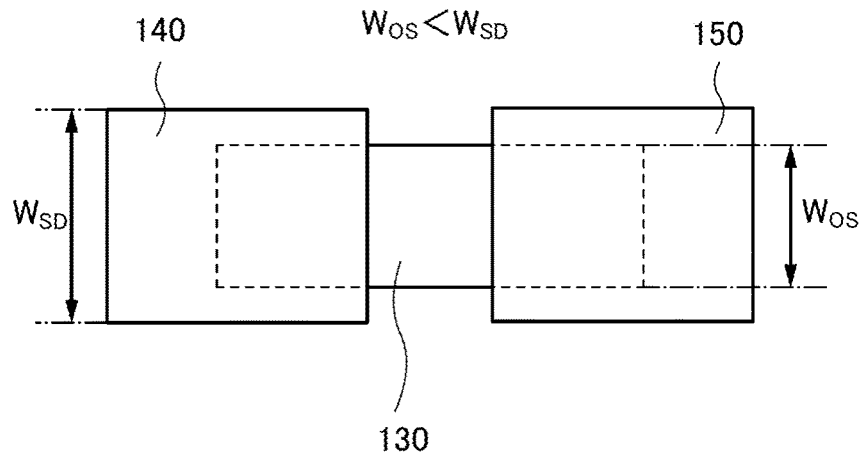
FIGS. 55A to 55C are top views each illustrating a transistor.
Figure 55B:
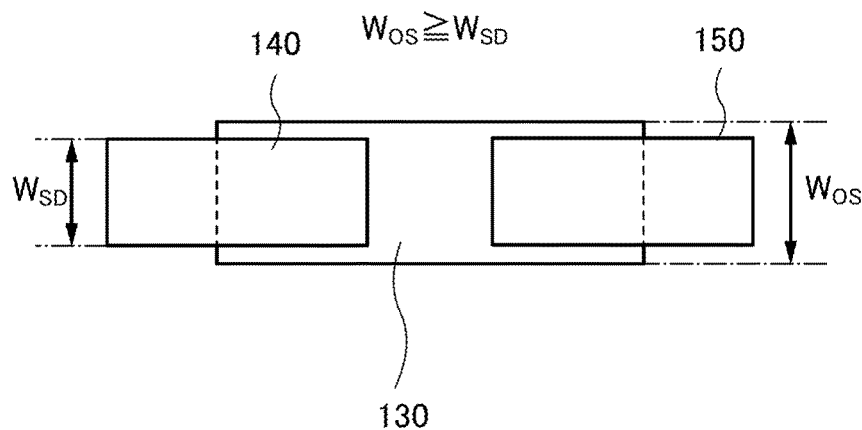
Figure 55C:
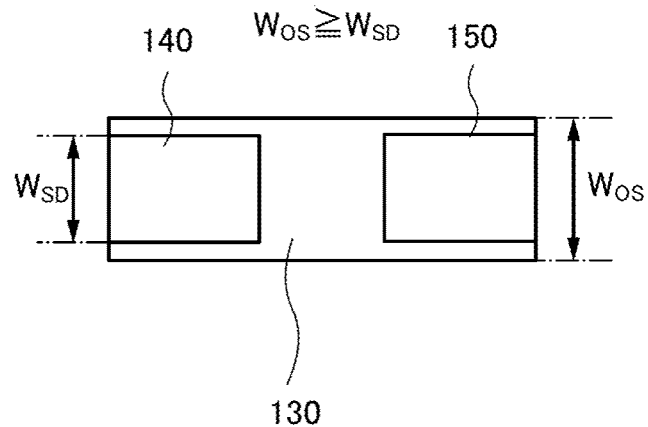

As shown in the top views in FIGS. 55A and 55B (showing only the oxide semiconductor layer 130, the conductive layer 140, and the conductive layer 150), the widths ($W_{SD}$) of the conductive layer 140 (source electrode layer) and the conductive layer 150 (drain electrode layer) in the transistor of one embodiment of the present invention may be either longer than or shorter than the width ($W_{OS}$) of the oxide semiconductor layer 130. When $W_{OS} \geq W_{SD}$ ($W_{SD}$ is less than or equal to $W_{OS}$) is satisfied, a gate electric field is easily applied to the entire oxide semiconductor layer 130, so that electrical characteristics of the transistor can be improved. As illustrated in FIG. 55C, the conductive layers 140 and 150 may be formed only in a region that overlaps with the oxide semiconductor layer 130.

In the transistor in one embodiment of the present invention (any of the transistors 101 to 113), the conductive layer 170 functioning as a gate electrode layer electrically surrounds the oxide semiconductor layer 130 in the channel width direction with the insulating layer 160 functioning as a gate insulating film positioned therebetween. This structure increases the on-state current. Such a transistor structure is referred to as a surrounded channel (s-channel) structure.

In the transistor including the oxide semiconductor layers 130a and 130b and the transistor including the oxide semiconductor layers 130a to 130c, selecting appropriate materials for the two or three layers forming the oxide semiconductor layer 130 makes current flow to the oxide semiconductor layer 130b. Since current flows to the oxide semiconductor layer 130b, the current is hardly influenced by interface scattering, leading to high on-state current. Thus, increasing the thickness of the oxide semiconductor layer 130b improves the on-state current in some cases.

With the above structure, the electrical characteristics of the transistor can be improved.

The structures described in this embodiment can be used in appropriate combination with any of the structures described in the other embodiments.

Embodiment 4

In this embodiment, components of the transistors described in Embodiment 2 will be described in detail.

As the substrate 115, a glass substrate, a quartz substrate, a semiconductor substrate, a ceramic substrate, a metal substrate with an insulated surface, or the like can be used. Alternatively, a silicon substrate provided with a transistor, a photodiode, or the like can be used, and an insulating layer, a wiring, a conductor functioning as a contact plug, and the like may be provided over the silicon substrate. Note that when p-channel transistors are formed using the silicon substrate, a silicon substrate with n⁻-type conductivity is preferably used. Alternatively, an SOI substrate including an n⁻-type or i-type silicon layer may be used. In the case where a p-channel transistor is formed on the silicon substrate, it is preferable to use a silicon substrate in which a plane where the transistor is formed is a (110) plane orientation. Forming a p-channel transistor with the (110) plane can increase mobility.

The insulating layer 120 can have a function of supplying oxygen to the oxide semiconductor layer 130 as well as a function of preventing diffusion of impurities from a component included in the substrate 115. For this reason, the insulating layer 120 is preferably an insulating film containing oxygen and further preferably, the insulating layer 120 is an insulating film containing oxygen in which the oxygen content is higher than that in the stoichiometric composition. The insulating layer 120 is a film in which the amount of released oxygen when converted into oxygen atoms is preferably greater than or equal to $1.0 \times 10^{19}$ atoms/cm³ in TDS analysis. In the TDS analysis, the film surface temperature is higher than or equal to 100° C. and lower than or equal to 700° C., or higher than or equal to 100° C. and lower than or equal to 500° C. In the case where the substrate 115 is provided with another device, the insulating layer 120 also has a function as an interlayer insulating film. In that case, the insulating layer 120 is preferably subjected to planarization treatment such as chemical mechanical polishing (CMP) treatment so as to have a flat surface.

For example, the insulating layer 120 can be formed using an oxide insulating film including aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like; a nitride insulating film including silicon nitride, silicon nitride oxide, aluminum nitride, aluminum nitride oxide, or the like; or a mixed material of any of these. The insulating layer 120 may be a stack of any of the above materials.

In this embodiment, detailed description is given mainly on the case where the oxide semiconductor layer 130 of the transistor has a three-layer structure in which the oxide semiconductor layers 130a to 130c are sequentially stacked from the insulating layer 120 side.

Note that in the case where the oxide semiconductor layer 130 is a single layer, a layer corresponding to the oxide semiconductor layer 130b described in this embodiment is used.

In the case where the oxide semiconductor layer 130 has a two-layer structure, a stack in which layers corresponding to the oxide semiconductor layer 130a and the oxide semiconductor layer 130b described in this embodiment are sequentially stacked from the insulating layer 120 side is used. In such a case, the oxide semiconductor layers 130a and 130b can be replaced with each other.

In the case where the oxide semiconductor layer 130 has a layered structure of four or more layers, for example, a structure in which another oxide semiconductor layer is added to the three-layer stack of the oxide semiconductor layer 130 described in this embodiment can be employed.

For the oxide semiconductor layer 130b, for example, an oxide semiconductor whose electron affinity (an energy difference between a vacuum level and the conduction band minimum) is higher than those of the oxide semiconductor layers 130a and 130c is used. The electron affinity can be obtained by subtracting an energy difference between the conduction band minimum and the valence band maximum (what is called an energy gap) from an energy difference between the vacuum level and the valence band maximum (what is called an ionization potential).

The oxide semiconductor layers 130a and 130c each contain one or more kinds of metal elements contained in the oxide semiconductor layer 130b. For example, the oxide semiconductor layers 130a and 130c are preferably formed using an oxide semiconductor whose conduction band minimum is closer to a vacuum level than that of the oxide semiconductor layer 130b by 0.05 eV or more, 0.07 eV or more, 0.1 eV or more, or 0.15 eV or more and 2 eV or less, 1 eV or less, 0.5 eV or less, or 0.4 eV or less.

In such a structure, when an electric field is applied to the conductive layer 170, a channel is formed in the oxide semiconductor layer 130b whose conduction band minimum is the lowest in the oxide semiconductor layer 130. Therefore, the oxide semiconductor layer 130b can be regarded as having a region serving as a semiconductor, while the oxide semiconductor layer 130a and the oxide semiconductor layer 130c can be regarded as having a region serving as an insulator or a semi-insulator.

Furthermore, since the oxide semiconductor layer 130a contains one or more kinds of metal elements contained in the oxide semiconductor layer 130b, an interface state is unlikely to be formed at the interface between the oxide semiconductor layers 130a and 130b, compared with the interface between the oxide semiconductor layer 130b and the insulating layer 120 on the assumption that the oxide semiconductor layer 130b is in contact with the insulating layer 120. The interface state sometimes forms a channel; therefore, the threshold voltage of the transistor is changed in some cases. Thus, with the oxide semiconductor layer 130a, variations in electrical characteristics of the transistor, such as a threshold voltage, can be reduced. Moreover, the reliability of the transistor can be improved.

Since the oxide semiconductor layer 130c contains one or more kinds of metal elements contained in the oxide semiconductor layer 130b, scattering of carriers is unlikely to occur at the interface between the oxide semiconductor layers 130b and 130c, compared with the interface between the oxide semiconductor layer 130b and the gate insulating film (the insulating layer 160) on the assumption that the oxide semiconductor layer 130b is in contact with the gate insulating film. Thus, with the oxide semiconductor layer 130c, the field-effect mobility of the transistor can be increased.

For the oxide semiconductor layers 130a and 130c, for example, a material containing Al, Ti, Ga, Ge, Y, Zr, Sn, La, Ce, or Hf with a higher atomic ratio than that used for the oxide semiconductor layer 130b can be used. Specifically, the atomic ratio of any of the above metal elements in the oxide semiconductor layers 130a and 130c is 1.5 times or more, preferably 2 times or more, further preferably 3 times or more as large as that in the oxide semiconductor layer 130b. Any of the above metal elements is strongly bonded to oxygen and thus has a function of suppressing generation of an oxygen vacancy in the oxide semiconductor layers 130a and 130c. That is, an oxygen vacancy is less likely to be generated in the oxide semiconductor layers 130a and 130c than in the oxide semiconductor layer 130b.

An oxide semiconductor that can be used for each of the oxide semiconductor layers 130a to 130c preferably contains at least In or Zn. Both In and Zn are preferably contained. In order to reduce variations in electrical characteristics of the transistor including the oxide semiconductor, the oxide semiconductor preferably contains a stabilizer in addition to In and Zn.

Examples of a stabilizer include Ga, Sn, Hf, Al, and Zr. Other examples of the stabilizer include lanthanoids such as La, Ce, Pr, Nd, Sm, Eu, Gd, Tb, Dy, Ho, Er, Tm, Yb, and Lu.

As the oxide semiconductor, for example, any of the following can be used: indium oxide, tin oxide, gallium oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide, an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide.

For example, an In—Ga—Zn oxide means an oxide containing In, Ga, and Zn as its main components. The In—Ga—Zn oxide may contain another metal element in addition to In, Ga, and Zn. In this specification, a film containing the In—Ga—Zn oxide is also referred to as an IGZO film.

A material represented by $InMO_3(ZnO)_m$ (m>0, where m is not an integer) may be used. Note that M represents one or more metal elements selected from Ga, Y, Zr, La, Ce, and Nd. Alternatively, a material represented by $In_2SnO_5(ZnO)_n$ (n>0, where n is an integer) may be used.

The indium content in the oxide semiconductor layer 130b is preferably higher than those in the oxide semiconductor layers 130a and 130c. In an oxide semiconductor, the s orbital of heavy metal mainly contributes to carrier transfer, and when the proportion of In in the oxide semiconductor is increased, overlap of the s orbitals is likely to be increased. Therefore, an oxide in which the proportion of In is higher than that of M has higher mobility than an oxide in which the proportion of In is equal to or lower than that of M. Thus, with the use of an oxide having a high content of indium for the oxide semiconductor layer 130b, a transistor having high field-effect mobility can be obtained.

The thickness of the oxide semiconductor layer 130a is greater than or equal to 3 nm and less than or equal to 100 nm, preferably greater than or equal to 5 nm and less than or equal to 50 nm, more preferably greater than or equal to 5 nm and less than or equal to 25 nm. The thickness of the oxide semiconductor layer 130b is greater than or equal to 3 nm and less than or equal to 200 nm, preferably greater than or equal to 5 nm and less than or equal to 150 nm, more preferably greater than or equal to 10 nm and less than or equal to 100 nm. The thickness of the oxide semiconductor layer 130c is greater than or equal to 1 nm and less than or equal to 50 nm, preferably greater than or equal to 2 nm and less than or equal to 30 nm, more preferably greater than or equal to 3 nm and less than or equal to 15 nm. In addition, the oxide semiconductor layer 130b is preferably thicker than the oxide semiconductor layer 130c.

In order that a transistor in which a channel is formed in an oxide semiconductor layer have stable electrical characteristics, it is effective to make the oxide semiconductor layer intrinsic (i-type) or substantially intrinsic by reducing the concentration of impurities in the oxide semiconductor layer. The term "substantially intrinsic" refers to a state where an oxide semiconductor layer has a carrier density lower than $1 \times 10^{19}/cm^3$, lower than $1 \times 10^{15}/cm^3$, lower than $1 \times 10^{13}/cm^3$, or lower than $1 \times 10^{8}/cm^3$, and higher than or equal to $1 \times 10^{-9}/cm^3$.

In the oxide semiconductor layer, hydrogen, nitrogen, carbon, silicon, and a metal element other than main components of the oxide semiconductor layer are impurities. For example, hydrogen and nitrogen form donor levels to increase the carrier density, and silicon forms impurity levels in the oxide semiconductor layer. The impurity levels serve as traps and might cause deterioration of electrical characteristics of the transistor. Therefore, it is preferable to reduce the concentration of the impurities in the oxide semiconductor layers 130a to 130c and at interfaces between the oxide semiconductor layers.

In order to make the oxide semiconductor layer intrinsic or substantially intrinsic, the oxide semiconductor layer is controlled to have a region in which the concentration of hydrogen estimated by secondary ion mass spectrometry (SIMS) is lower than or equal to $2 \times 10^{20}$ atoms/cm$^3$, preferably lower than or equal to $5 \times 10^{19}$ atoms/cm$^3$, more preferably lower than or equal to $1 \times 10^{19}$ atoms/cm$^3$, still more preferably lower than or equal to $5 \times 10^{18}$ atoms/cm$^3$ and is higher than or equal to $1 \times 10^{17}$ atoms/cm$^3$. In addition, the oxide semiconductor layer is controlled to have a region in which the concentration of nitrogen is lower than $5 \times 10^{19}$ atoms/cm$^3$, preferably lower than or equal to $5 \times 10^{18}$ atoms/cm$^3$, more preferably lower than or equal to $1 \times 10^{18}$ atoms/cm$^3$, still more preferably lower than or equal to $5 \times 10^{17}$ atoms/cm$^3$ and is higher than or equal to $5 \times 10^{16}$ atoms/cm$^3$.

The high concentration of silicon or carbon might reduce the crystallinity of the oxide semiconductor layer. In order not to lower the crystallinity of the oxide semiconductor layer, the oxide semiconductor layer is controlled to have a region in which the concentration of silicon is lower than $1\times10^{19}$ atoms/cm$^3$, preferably lower than $5\times10^{18}$ atoms/cm$^3$ and is higher than or equal to $1\times10^{18}$ atoms/cm$^3$. Furthermore, the oxide semiconductor layer is controlled to have a region in which the concentration of carbon is lower than $1\times10^{19}$ atoms/cm$^3$, preferably lower than $5\times10^{18}$ atoms/cm$^3$, more preferably lower than $1\times10^{18}$ atoms/cm$^3$ and is higher than or equal to $6\times10^{17}$ atoms/cm$^3$.

As described above, a transistor in which a highly purified oxide semiconductor layer is used for a channel formation region exhibits an extremely low off-state current. When voltage between a source and a drain is set at about 0.1 V, 5 V, or 10 V, for example, the off-state current per channel width of the transistor can be as low as several yoctoamperes per micrometer to several zeptoamperes per micrometer.

As the gate insulating film of the transistor, an insulating film containing silicon is used in many cases; thus, it is preferable that, as in the transistor of one embodiment of the present invention, a region of the oxide semiconductor layer that serves as a channel not be in contact with the gate insulating film for the above reason. In the case where a channel is formed at the interface between the gate insulating film and the oxide semiconductor layer, scattering of carriers occurs at the interface, so that the field-effect mobility of the transistor is reduced in some cases. Also from the view of the above, it is preferable that the region of the oxide semiconductor layer that serves as a channel be separated from the gate insulating film.

Accordingly, with the oxide semiconductor layer 130 having a layered structure including the oxide semiconductor layers 130a to 130c, a channel can be formed in the oxide semiconductor layer 130b; thus, the transistor can have high field-effect mobility and stable electrical characteristics.

In a band structure, the conduction band minimums of the oxide semiconductor layers 130a to 130c are continuous. This can be understood also from the fact that the compositions of the oxide semiconductor layers 130a to 130c are close to one another and oxygen is easily diffused among the oxide semiconductor layers 130a to 130c. Thus, the oxide semiconductor layers 130a to 130c have a continuous physical property though they have different compositions and form a stack. In the drawings, interfaces between the oxide semiconductor layers of the stack are indicated by dotted lines.

The oxide semiconductor layer 130 in which layers containing the same main components are stacked is formed to have not only a simple layered structure of the layers but also a continuous energy band (here, in particular, a well structure having a U shape in which the conduction band minimums are continuous (U-shape well)). In other words, the layered structure is formed such that there exists no impurity that forms a defect level such as a trap center or a recombination center at each interface. If impurities exist between the stacked oxide semiconductor layers, the continuity of the energy band is lost and carriers disappear by a trap or recombination at the interface.

For example, an In—Ga—Zn oxide whose atomic ratio of In to Ga and Zn is 1:3:2, 1:3:3, 1:3:4, 1:3:6, 1:4:5, 1:6:4, 1:9:6, or 1:10:1 or in the neighborhood of the above atomic ratio, or a Ga—Zn oxide whose atomic ratio of Ga to Zn is 10:1 or in the neighborhood of the above atomic ratio can be used for the oxide semiconductor layers 130a and 130c. Furthermore, for example, an In—Ga—Zn oxide whose atomic ratio of In to Ga and Zn is 1:1:1, 2:1:3, 5:5:6, 3:1:2, 4:2:3, or 4:2:4.1 or in the neighborhood of the above atomic ratio can be used for the oxide semiconductor layer 130b. In the case where each of the oxide semiconductor layers 130a to 130c is formed using the above oxide as a sputtering target, the obtained oxide semiconductor layers 130a to 130c do not necessarily have the same atomic ratio.

The oxide semiconductor layer 130b of the oxide semiconductor layer 130 serves as a well, so that a channel is formed in the oxide semiconductor layer 130b. Since the conduction band minimums are continuous, the oxide semiconductor layer 130 can also be referred to as a U-shaped well. Furthermore, a channel formed to have such a structure can also be referred to as a buried channel.

Note that trap levels due to impurities or defects might be formed in the vicinity of the interface between an insulating layer such as a silicon oxide film and each of the oxide semiconductor layers 130a and 130c. The oxide semiconductor layer 130b can be distanced away from the trap levels owing to the existence of the oxide semiconductor layers 130a and 130c.

However, when the energy differences between the conduction band minimum of the oxide semiconductor layer 130b and the conduction band minimum of each of the oxide semiconductor layers 130a and 130c are small, an electron in the oxide semiconductor layer 130b might reach the trap level by passing over the energy differences. When the electron is trapped in the trap level, negative charge is generated at the interface with the insulating layer, so that the threshold voltage of the transistor is shifted in the positive direction.

The oxide semiconductor layers 130a to 130c preferably include crystal parts. In particular, when crystals with c-axis alignment are used, the transistor can have stable electrical characteristics. Moreover, crystals with c-axis alignment are resistant to bending; therefore, using such crystals can improve the reliability of a semiconductor device using a flexible substrate.

As the conductive layer 140 functioning as a source electrode layer and the conductive layer 150 functioning as a drain electrode layer, for example, a single layer or a stacked layer formed using a material selected from Al, Cr, Cu, Ta, Ti, Mo, W, Ni, Mn, Nd, and Sc and alloys of any of these metal materials can be used. Typically, it is preferable to use Ti, which is particularly easily bonded to oxygen, or W, which has a high melting point and thus allows subsequent processes to be performed at relatively high temperatures. It is also possible to use a stack of any of the above materials and Cu or an alloy such as Cu—Mn, which has low resistance. In the transistors 105, 106, 111, and 112, for example, it is possible to use W for the conductive layers 141 and 151 and use a stack of Ti and Al for the conductive layers 142 and 152.

The above materials are capable of extracting oxygen from an oxide semiconductor layer. Therefore, in a region of the oxide semiconductor layer that is in contact with any of the above materials, oxygen is released from the oxide semiconductor layer and an oxygen vacancy is formed. Hydrogen slightly contained in the layer and the oxygen vacancy are bonded to each other, so that the region is markedly changed to an n-type region. Accordingly, the n-type region can serve as a source or a drain of the transistor.

In the case where W is used for the conductive layers 140 and 150, the conductive layers 140 and 150 may be doped with nitrogen. Doping with nitrogen can appropriately lower the capability of extracting oxygen and prevent the n-type region from spreading to a channel region. It is possible to prevent the n-type region from spreading to a channel region also by using a stack of W and an n-type semiconductor layer as the conductive layers 140 and 150 and putting the n-type semiconductor layer in contact with the oxide semiconductor layer. As the n-type semiconductor layer, an In—Ga—Zn oxide, zinc oxide, indium oxide, tin oxide, indium tin oxide, or the like to which nitrogen is added can be used.

The insulating layer 160 functioning as a gate insulating film can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 160 may be a stack including any of the above materials. The insulating layer 160 may contain La, N, Zr, or the like as an impurity.

An example of a layered structure of the insulating layer 160 is described. The insulating layer 160 includes, for example, oxygen, nitrogen, silicon, or hafnium. Specifically, the insulating layer 160 preferably includes hafnium oxide and silicon oxide or silicon oxynitride.

Hafnium oxide and aluminum oxide have higher dielectric constants than silicon oxide and silicon oxynitride. Therefore, the insulating layer 160 using hafnium oxide or aluminum oxide can have larger thickness than the insulating layer 160 using silicon oxide, so that leakage current due to tunnel current can be reduced. That is, a transistor with a low off-state current can be provided. Moreover, hafnium oxide with a crystalline structure has a higher dielectric constant than hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited to these examples.

For the insulating layers 120 and 160 in contact with the oxide semiconductor layer 130, a film that releases less nitrogen oxide is preferably used. In the case where the oxide semiconductor is in contact with an insulating layer that releases a large amount of nitrogen oxide, the density of states due to nitrogen oxide increases in some cases. For the insulating layers 120 and 160, for example, an oxide insulating layer such as a silicon oxynitride film or an aluminum oxynitride film that releases less nitrogen oxide can be used.

A silicon oxynitride film that releases less nitrogen oxide is a film of which the amount of released ammonia is larger than the amount of released nitrogen oxide in TDS; the amount of released ammonia is typically greater than or equal to $1\times10^{18}$ cm$^{-3}$ and less than or equal to $5\times10^{19}$ cm$^{-3}$. Note that the amount of released ammonia is the amount of ammonia released by heat treatment with which the surface temperature of the film becomes higher than or equal to 50° C. and lower than or equal to 650° C., preferably higher than or equal to 50° C. and lower than or equal to 550° C.

By using the above oxide insulating layer for the insulating layers 120 and 160, a shift in the threshold voltage of the transistor can be reduced, which leads to reduced fluctuations in the electrical characteristics of the transistor.

For the conductive layer 170 functioning as a gate electrode layer, for example, a conductive film formed using Al, Ti, Cr, Co, Ni, Cu, Y, Zr, Mo, Ru, Ag, Mn, Nd, Sc, Ta, or W can be used. Alternatively, an alloy or a conductive nitride of any of these materials may be used. Alternatively, a stack of a plurality of materials selected from these materials, alloys of these materials, and conductive nitrides of these materials may be used. Typically, tungsten, a stack of tungsten and titanium nitride, a stack of tungsten and tantalum nitride, or the like can be used. Alternatively, Cu or an alloy such as Cu—Mn, which has low resistance, or a stack of any of the above materials and Cu or an alloy such as Cu—Mn may be used. In this embodiment, tantalum nitride is used for the conductive layer 171 and tungsten is used for the conductive layer 172 to form the conductive layer 170.

As the insulating layer 175, a silicon nitride film, an aluminum nitride film, or the like containing hydrogen can be used. In the transistors 103, 104, 106, 109, 110, and 112 described in Embodiment 2, when an insulating film containing hydrogen is used as the insulating layer 175, part of the oxide semiconductor layer can have n-type conductivity. In addition, a nitride insulating film functions as a blocking film against moisture and the like and can improve the reliability of the transistor.

An aluminum oxide film can also be used as the insulating layer 175. It is particularly preferable to use an aluminum oxide film as the insulating layer 175 in the transistors 101, 102, 105, 107, 108, and 111 described in Embodiment 2. The aluminum oxide film has a significant effect of blocking both oxygen and impurities such as hydrogen and moisture. Accordingly, during and after the manufacturing process of the transistor, the aluminum oxide film can suitably function as a protective film that has effects of preventing entry of impurities such as hydrogen and moisture into the oxide semiconductor layer 130, preventing release of oxygen from the oxide semiconductor layer, and preventing unnecessary release of oxygen from the insulating layer 120. Furthermore, oxygen contained in the aluminum oxide film can be diffused into the oxide semiconductor layer.

Furthermore, the insulating layer 180 is preferably formed over the insulating layer 175. The insulating layer 180 can be formed using an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 180 may be a stack of any of the above materials.

Here, like the insulating layer 120, the insulating layer 180 preferably contains oxygen more than that in the stoichiometric composition. Oxygen released from the insulating layer 180 can be diffused into the channel formation region in the oxide semiconductor layer 130 through the insulating layer 160, so that oxygen vacancies formed in the channel formation region can be filled with oxygen. In this manner, stable electrical characteristics of the transistor can be achieved.

High integration of a semiconductor device requires miniaturization of a transistor. However, it is known that miniaturization of a transistor causes deterioration of electrical characteristics of the transistor. In particular, a decrease in channel width causes a reduction in on-state current.

In the transistors 107 to 112 in one embodiment of the present invention, the oxide semiconductor layer 130*c* is formed to cover the oxide semiconductor layer 130*b* where a channel is formed; thus, a channel formation layer is not in contact with the gate insulating film. Accordingly, scattering of carriers at the interface between the channel formation layer and the gate insulating film can be reduced and the on-state current of the transistor can be increased.

In the transistor in one embodiment of the present invention, as described above, the gate electrode layer (the conductive layer 170) is formed to electrically surround the oxide semiconductor layer 130 in the channel width direction; accordingly, a gate electric field is applied to the oxide semiconductor layer 130 in a direction perpendicular to its side surface in addition to a direction perpendicular to its top surface. In other words, a gate electric field is applied to the entire channel formation layer and an effective channel width is increased, leading to a further increase in on-state current.

Furthermore, in the transistor in one embodiment of the present invention in which the oxide semiconductor layer 130 has a two-layer structure or a three-layer structure, since the oxide semiconductor layer 130b where a channel is formed is provided over the oxide semiconductor layer 130a, an interface state is less likely to be formed. In the transistor in one embodiment of the present invention in which the oxide semiconductor layer 130 has a three-layer structure, since the oxide semiconductor layer 130b is positioned at the middle of the three-layer structure, the influence of an impurity that enters from upper and lower layers on the oxide semiconductor layer 130b can also be eliminated. Therefore, the transistor can achieve not only the increase in on-state current but also stabilization of the threshold voltage and a reduction in S value (subthreshold value). Thus, current at a gate voltage VG of 0 V can be reduced and power consumption can be reduced. In addition, since the threshold voltage of the transistor becomes stable, long-term reliability of the semiconductor device can be improved. Furthermore, the transistor in one embodiment of the present invention is suitable for a highly integrated semiconductor device because deterioration of electrical characteristics due to miniaturization is reduced.

Although the variety of films such as the metal films, the semiconductor films, and the inorganic insulating films that are described in this embodiment typically can be formed by sputtering or plasma-enhanced CVD, such films may be formed by another method such as thermal CVD. Examples of the thermal CVD include metal organic chemical vapor deposition (MOCVD) and atomic layer deposition (ALD).

Since plasma is not used for deposition, thermal CVD has an advantage that no defect due to plasma damage is generated.

Deposition by thermal CVD may be performed in such a manner that a source gas and an oxidizer are supplied to the chamber at the same time, the pressure in the chamber is set to an atmospheric pressure or a reduced pressure, and reaction is caused in the vicinity of the substrate or over the substrate.

Deposition by ALD is performed in such a manner that the pressure in a chamber is set to an atmospheric pressure or a reduced pressure, source gases for reaction are introduced into the chamber and reacted, and then the sequence of gas introduction is repeated. An inert gas (e.g., argon or nitrogen) may be introduced as a carrier gas with the source gases. For example, two or more kinds of source gases may be sequentially supplied to the chamber. In that case, after reaction of a first source gas, an inert gas is introduced, and then a second source gas is introduced so that the source gases are not mixed. Alternatively, the first source gas may be exhausted by vacuum evacuation instead of introduction of the inert gas, and then the second source gas may be introduced. The first source gas is adsorbed on the surface of the substrate and reacted to form a first layer, and then, the second source gas introduced is adsorbed and reacted. As a result, a second layer is stacked over the first layer, so that a thin film is formed. The sequence of gas introduction is controlled and repeated more than once until desired thickness is obtained, so that a thin film with excellent step coverage can be formed. The thickness of the thin film can be adjusted by the number of repetition times of the sequence of gas introduction; therefore, ALD makes it possible to accurately adjust thickness and thus is suitable for manufacturing a minute FET.

The variety of films such as the metal film, the semiconductor film, and the inorganic insulating film that have been disclosed in the above embodiments can be formed by thermal CVD such as MOCVD or ALD. For example, in the case where an In—Ga—Zn—O film is formed, trimethylindium ($In(CH_3)_3$), trimethylgallium ($Ga(CH_3)_3$), and dimethylzinc ($Zn(CH_3)_2$) can be used. Without limitation to the above combination, triethylgallium ($Ga(C_2H_5)_3$) can be used instead of trimethylgallium and diethylzinc ($Zn(C_2H_5)_2$) can be used instead of dimethylzinc.

For example, in the case where a hafnium oxide film is formed by a deposition apparatus using ALD, two kinds of gases, i.e., ozone ($O_3$) as an oxidizer and a source material gas which is obtained by vaporizing liquid containing a solvent and a hafnium precursor (hafnium alkoxide and a hafnium amide such as tetrakis(dimethylamide)hafnium (TDMAH, $Hf[N(CH_3)_2]_4$) and tetrakis(ethylmethylamide)hafnium) are used.

For example, in the case where an aluminum oxide film is formed by a deposition apparatus using ALD, two kinds of gases, i.e., $H_2O$ as an oxidizer and a source gas which is obtained by vaporizing liquid containing a solvent and an aluminum precursor (e.g., trimethylaluminum (TMA, $Al(CH_3)_3$)) are used. Examples of another material include tris(dimethylamide)aluminum, triisobutylaluminum, and aluminum tris(2,2,6,6-tetramethyl-3,5-heptanedionate).

For example, in the case where a silicon oxide film is formed by a deposition apparatus using ALD, hexachlorodisilane is adsorbed on a surface where a film is to be formed, and radicals of an oxidizing gas (e.g., $O_2$ or dinitrogen monoxide) are supplied to react with an adsorbate.

For example, in the case where a tungsten film is formed by a deposition apparatus using ALD, a $WF_6$ gas and a $B_2H_6$ gas are sequentially introduced to form an initial tungsten film, and then a $WF_6$ gas and an $H_2$ gas are sequentially introduced to form a tungsten film. Note that an $SiH_4$ gas may be used instead of a $B_2H_6$ gas.

For example, in the case where an oxide semiconductor layer, e.g., an In—Ga—Zn—O layer is formed by a deposition apparatus using ALD, an $In(CH_3)_3$ gas and an $O_3$ gas are sequentially introduced to form an In—O layer, a $Ga(CH_3)_3$ gas and an $O_3$ gas are sequentially introduced to form a Ga—O layer, and then a $Zn(CH_3)_2$ gas and an $O_3$ gas are sequentially introduced to form a Zn—O layer. Note that the order of these layers is not limited to this example. A mixed compound layer such as an In—Ga—O layer, an In—Zn—O layer, or a Ga—Zn—O layer may be formed by using these gases. Although an $H_2O$ gas which is obtained by bubbling with an inert gas such as Ar may be used instead of an $O_3$ gas, it is preferable to use an $O_3$ gas, which does not contain H.

A facing-target-type sputtering apparatus can be used for deposition of an oxide semiconductor layer. Deposition using the facing-target-type sputtering apparatus can also be referred to as vapor deposition SP (VDSP).

When an oxide semiconductor layer is deposited using a facing-target-type sputtering apparatus, plasma damage to the oxide semiconductor layer at the time of deposition can be reduced. Thus, oxygen vacancies in the film can be reduced. In addition, the use of the facing-target-type sputtering apparatus enables low-pressure deposition. Accordingly, the concentration of impurities (e.g., hydrogen, a rare gas (e.g., argon), and water) in a deposited oxide semiconductor layer can be lowered.

The structures described in this embodiment can be used in appropriate combination with any of the structures described in the other embodiments.

Embodiment 5

A structure of an oxide semiconductor layer that can be used in one embodiment of the present invention will be described below.

In this specification, the term "parallel" indicates that the angle formed between two straight lines is greater than or equal to −10° and less than or equal to 10°, and accordingly also includes the case where the angle is greater than or equal to −5° and less than or equal to 5°. Furthermore, the term "perpendicular" indicates that the angle formed between two straight lines is greater than or equal to 80° and less than or equal to 100°, and accordingly also includes the case where the angle is greater than or equal to 85° and less than or equal to 95°.

In this specification, trigonal and rhombohedral crystal systems are included in a hexagonal crystal system.

<Structure of Oxide Semiconductor>

The structure of an oxide semiconductor will be described below.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and have no fixed positions of atoms, to have a flexible bond angle, and to have a short-range order but have no long-range order, for example.

In other words, a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS will be described.

A CAAC-OS is one of oxide semiconductors having a plurality of c-axis aligned crystal parts (also referred to as pellets).

Figure 56A:
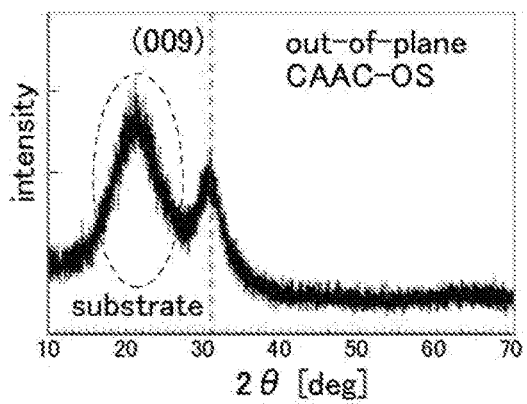
FIGS. 56A to 56E show structural analysis of a CAAC-OS and a single crystal oxide semiconductor by XRD and selected-area electron diffraction patterns of a CAAC-OS.

Analysis of a CAAC-OS by X-ray diffraction (XRD) is described. For example, when the structure of a CAAC-OS including an InGaZnO$_4$ crystal that is classified into the space group R-3m is analyzed by an out-of-plane method, a peak appears at a diffraction angle (2θ) of around 31° as shown in FIG. 56A. This peak is derived from the (009) plane of the InGaZnO$_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at a 2θ of around 36° is derived from a crystal structure that is classified into the space group Fd-3m; thus, this peak is preferably not exhibited in a CAAC-OS.

Figure 56B:
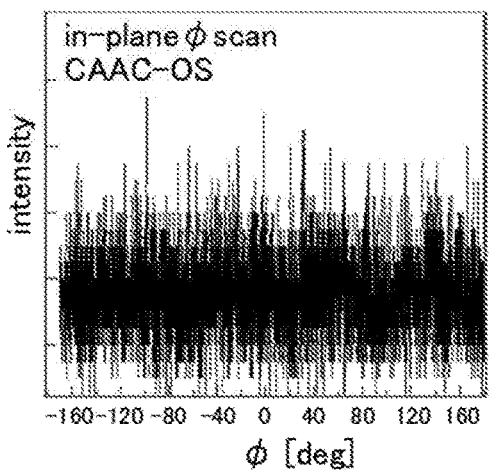
Figure 56C:
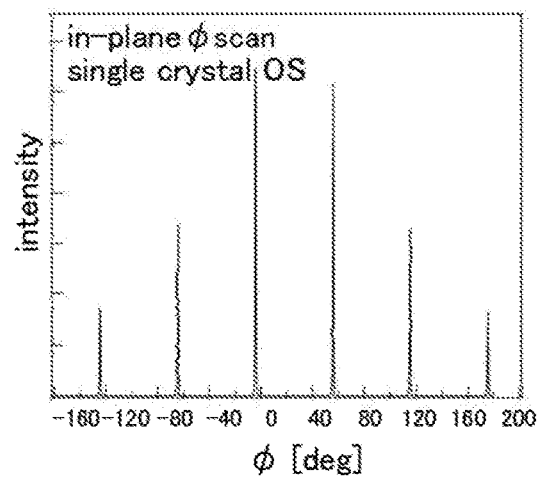

On the other hand, in structural analysis of the CAAC-OS by an in-plane method in which an X-ray is incident on the CAAC-OS in a direction parallel to the formation surface, a peak appears at a 2θ of around 56°. This peak is attributed to the (110) plane of the InGaZnO$_4$ crystal. When analysis (φ scan) is performed with 2θ fixed at around 56° and with the sample rotated using a normal vector to the sample surface as an axis (φ axis), as shown in FIG. 56B, a peak is not clearly observed. In contrast, in the case where single crystal InGaZnO$_4$ is subjected to φ scan with 2θ fixed at around 56°, as shown in FIG. 56C, six peaks which are derived from crystal planes equivalent to the (110) plane are observed. Accordingly, the structural analysis using XRD shows that the directions of a-axes and b-axes are irregularly oriented in the CAAC-OS.

Figure 56D:
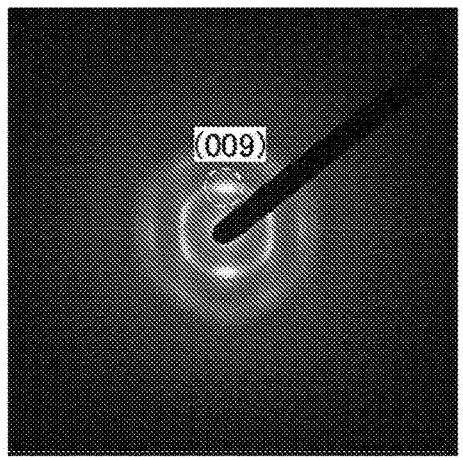
Figure 56E:
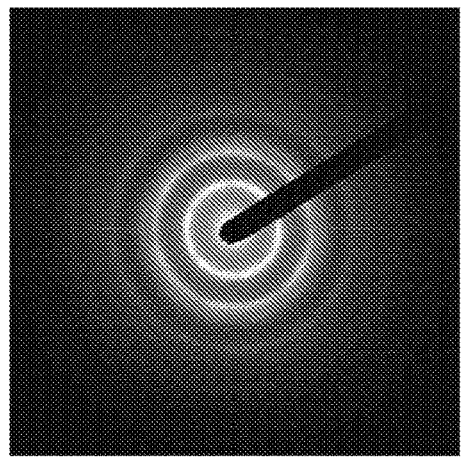

Next, a CAAC-OS analyzed by electron diffraction is described. For example, when an electron beam with a probe diameter of 300 nm is incident on a CAAC-OS including an InGaZnO$_4$ crystal in a direction parallel to the formation surface of the CAAC-OS, a diffraction pattern (also referred to as a selected-area electron diffraction pattern) shown in FIG. 56D can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 56E shows a diffraction pattern obtained in such a manner that an electron beam with a probe diameter of 300 nm is incident on the same sample in a direction perpendicular to the sample surface. As shown in FIG. 56E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 56E is considered to be derived from the (010) plane, the (100) plane, and the like of the InGaZnO$_4$ crystal. The second ring in FIG. 56E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed in some cases. Thus, in the CAAC-OS, a reduction in electron mobility due to the grain boundary is less likely to occur.

Figure 57A:
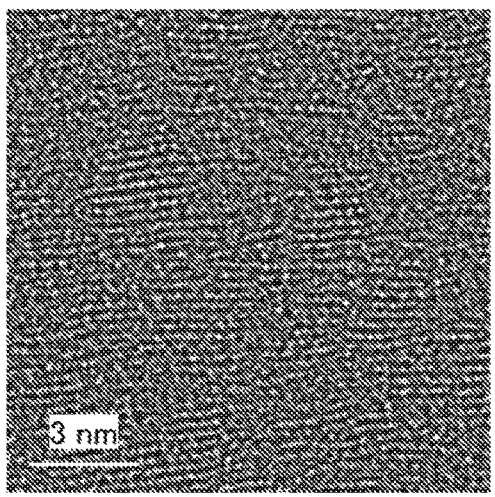
FIGS. 57A to 57E show a cross-sectional TEM image and plan-view TEM images of a CAAC-OS and images obtained through analysis thereof.

FIG. 57A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 57A shows pellets in which metal atoms are arranged in a layered manner. FIG. 57A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 57B:
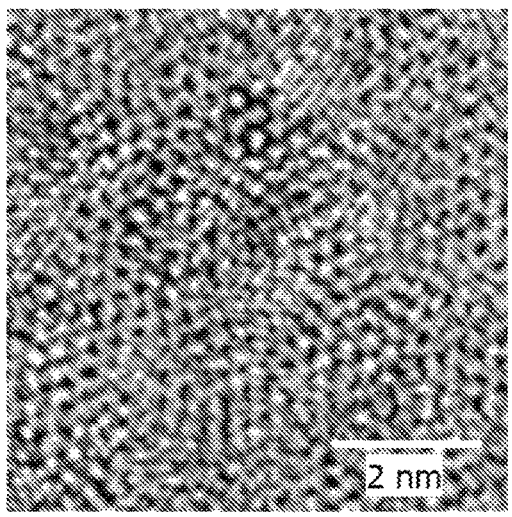
Figure 57C:
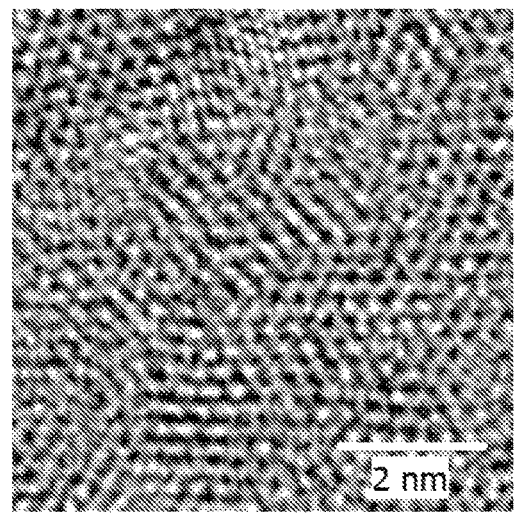
Figure 57D:
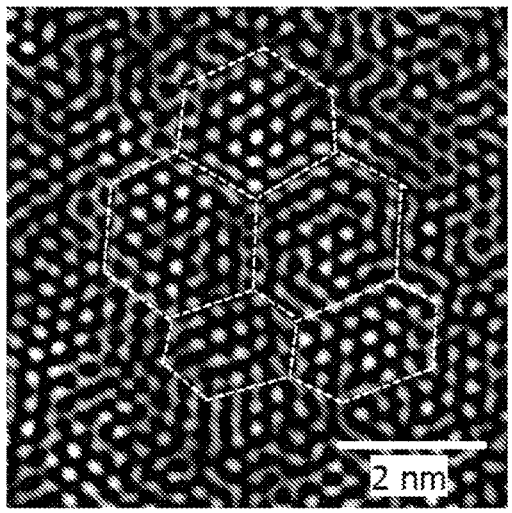
Figure 57E:
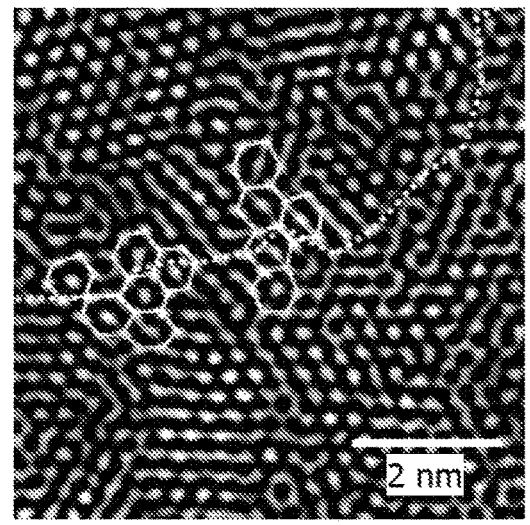

FIGS. 57B and 57C show Cs-corrected high-resolution TEM images of a plane of the CAAC-OS observed from a direction substantially perpendicular to the sample surface. FIGS. 57D and 57E are images obtained through image processing of FIGS. 57B and 57C. The method of image processing is as follows. The image in FIG. 57B is subjected to fast Fourier transform (FFT), so that an FFT image is obtained. Then, mask processing is performed such that a range of from 2.8 $nm^{-1}$ to 5.0 $nm^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 57D, a portion where a lattice arrangement is broken is denoted with a dashed line. A region surrounded by a dashed line is one pellet. The portion denoted with the dashed line is a junction of pellets. The dashed line draws a hexagon, which means that the pellet has a hexagonal shape. Note that the shape of the pellet is not always a regular hexagon but is a non-regular hexagon in many cases.

In FIG. 57E, a dotted line denotes a portion between a region where a lattice arrangement is well aligned and another region where a lattice arrangement is well aligned. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed, for example. That is, a lattice arrangement is distorted so that formation of a crystal grain boundary is inhibited. This is probably because the CAAC-OS can tolerate distortion owing to a low density of the atomic arrangement in an a-b plane direction, an interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in an oxide semiconductor might serve as carrier traps or carrier generation sources, for example. For example, oxygen vacancies in an oxide semiconductor might serve as carrier traps or serve as carrier generation sources when hydrogen is captured therein.

A CAAC-OS having small amounts of impurities and oxygen vacancies is an oxide semiconductor with a low carrier density (specifically, lower than $8\times10^{11}$ $cm^{-3}$, preferably lower than $1\times10^{11}$ $cm^{-3}$, more preferably lower than $1\times10^{10}$ $cm^{-3}$, and higher than or equal to $1\times10^{-9}$ $cm^{-3}$). Such an oxide semiconductor is referred to as a highly purified intrinsic or substantially highly purified intrinsic oxide semiconductor. A CAAC-OS has a low impurity concentration and a low density of defect states. Thus, a CAAC-OS can be referred to as an oxide semiconductor having stable characteristics.

<nc-OS>

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 58A:
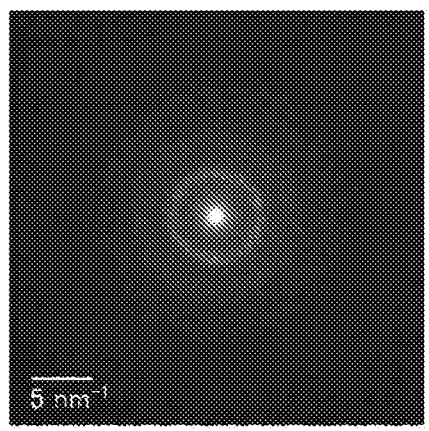
FIGS. 58A to 58D show electron diffraction patterns and a cross-sectional TEM image of an nc-OS.
Figure 58B:
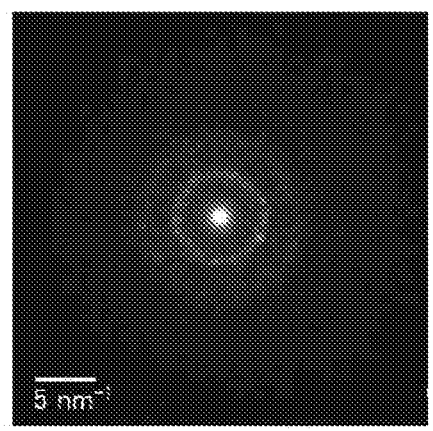

For example, when an electron beam with a probe diameter of 50 nm is incident on a 34-nm-thick region of thinned nc-OS including an $InGaZnO_4$ crystal in a direction parallel to the formation surface, a ring-shaped diffraction pattern (a nanobeam electron diffraction pattern) shown in FIG. 58A is observed. FIG. 58B shows a diffraction pattern obtained when an electron beam with a probe diameter of 1 nm is incident on the same sample. As shown in FIG. 58B, a plurality of spots are observed in a ring-like region. In other words, ordering in an nc-OS is not observed with an electron beam with a probe diameter of 50 nm but is observed with an electron beam with a probe diameter of 1 nm.

Figure 58C:
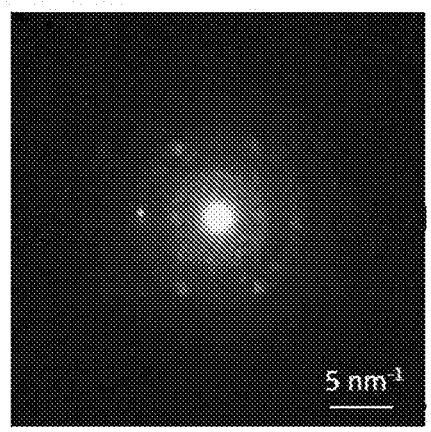

Furthermore, an electron diffraction pattern in which spots are arranged in an approximately regular hexagonal shape is observed in some cases as shown in FIG. 58C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 58D:
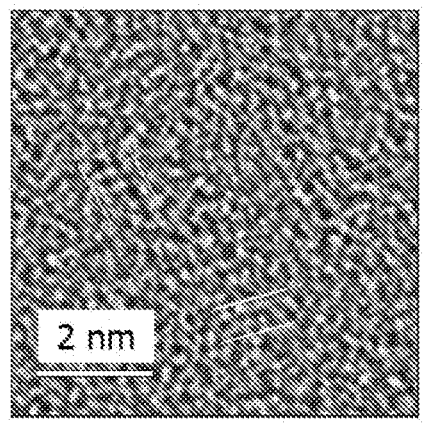

FIG. 58D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines in FIG. 58D, and a region in which a crystal part is not clearly observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS has a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-Like OS>

An a-like OS has a structure between those of the nc-OS and the amorphous oxide semiconductor.

Figure 59A:
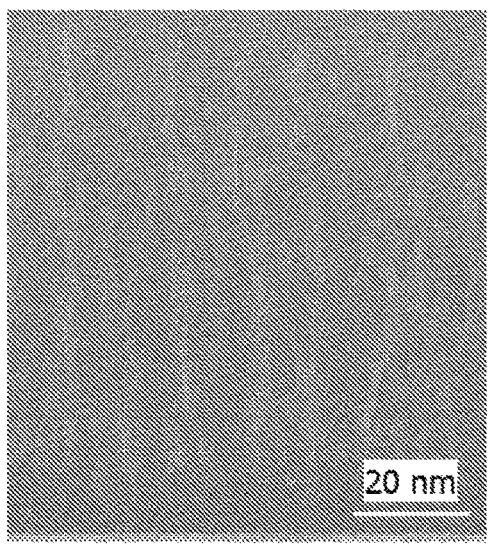
FIGS. 59A and 59B are cross-sectional TEM images of an a-like OS.
Figure 59B:
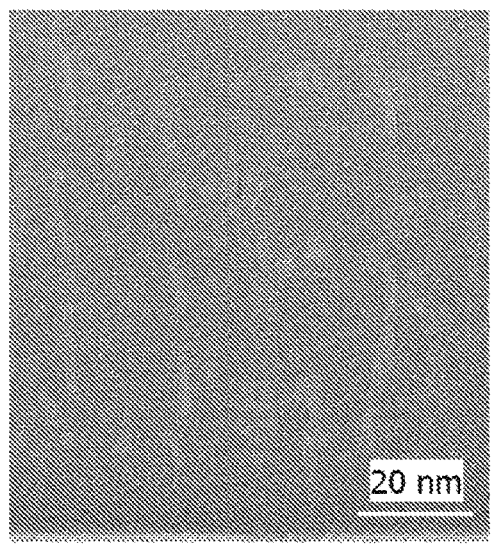

FIGS. 59A and 59B are high-resolution cross-sectional TEM images of an a-like OS. FIG. 59A is the high-resolution cross-sectional TEM image of the a-like OS at the start of the electron irradiation. FIG. 59B is the high-resolution cross-sectional TEM image of the a-like OS after the electron (e) irradiation at $4.3 \times 10^8$ $e^-/nm^2$. FIGS. 59A and 59B show that stripe-like bright regions extending vertically are observed in the a-like OS from the start of the electron irradiation. It can be also found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the spacing between lattice fringes is greater than or equal to 0.28 nm and less than or equal to 0.30 nm is regarded as a crystal part of InGaZnO$_4$ in the following description. Each of lattice fringes corresponds to the a-b plane of the InGaZnO$_4$ crystal.

Figure 60:
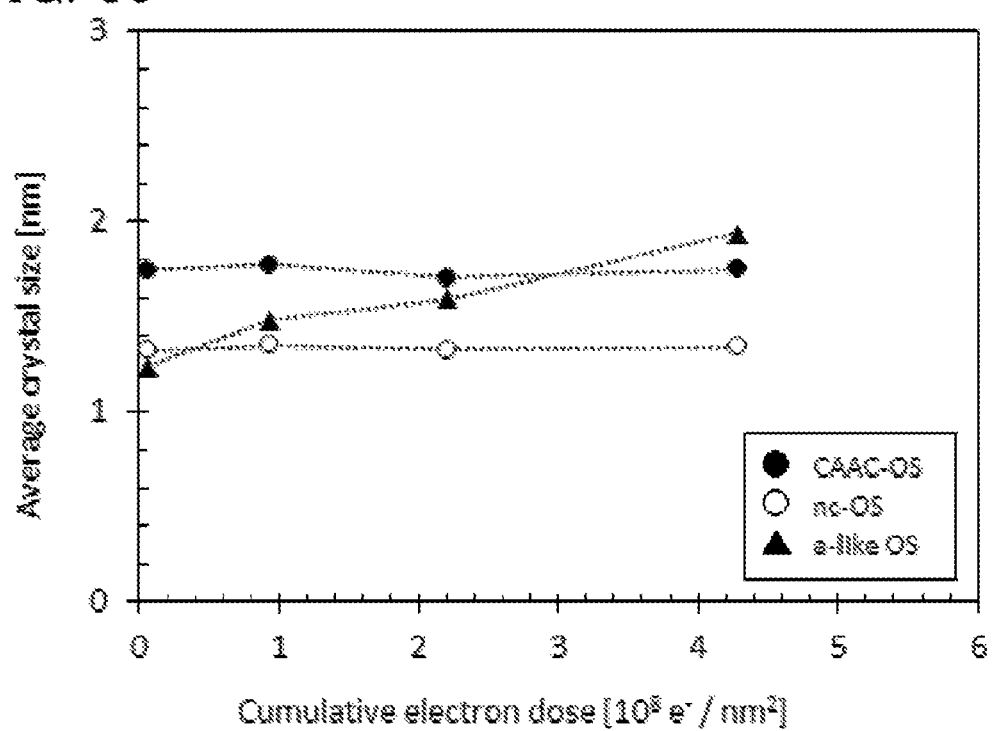
FIG. 60 shows a change of crystal parts of an In—Ga—Zn oxide due to electron irradiation.

FIG. 60 shows change in the average size of crystal parts (at 22 points to 30 points) in each sample. Note that the crystal part size corresponds to the length of a lattice fringe. FIG. 60 indicates that the crystal part size in the a-like OS increases with an increase in the cumulative electron dose in obtaining TEM images, for example. As shown in FIG. 60, a crystal part of approximately 1.2 nm (also referred to as an initial nucleus) at the start of TEM observation grows to a size of approximately 1.9 nm at a cumulative electron (e) dose of $4.2 \times 10^8$ $e^-/nm^2$. In contrast, the crystal part size in the nc-OS and the CAAC-OS shows little change from the start of electron irradiation to a cumulative electron dose of $4.2 \times 10^8$ $e^-/nm^2$. As shown in FIG. 60, the crystal part sizes in an nc-OS and a CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of electron beam irradiation were as follows: the accelerating voltage was 300 kV; the current density was $6.7 \times 10^5$ $e^-/(nm^2 \cdot s)$; and the diameter of irradiation region was 230 nm.

In this manner, growth of the crystal part in the a-like OS is sometimes induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

The structures described in this embodiment can be used in appropriate combination with any of the structures described in the other embodiments.

Embodiment 6

In this embodiment, examples of a package and a camera module each including an image sensor chip will be described. For the image sensor chip, the structure of an imaging device of one embodiment of the present invention can be used.

Figure 61A:
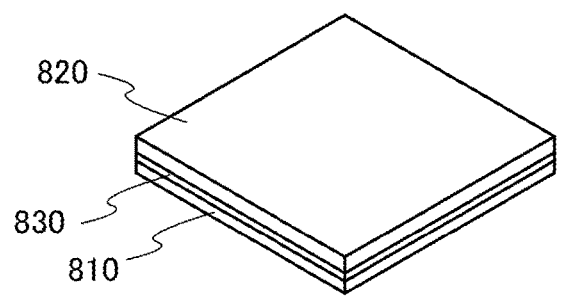
FIGS. 61A to 61D are perspective views and a cross-sectional view of a package including an imaging device.

FIG. 61A is an external perspective view showing the top surface side of a package including an image sensor chip. The package includes a package substrate 810 to which an image sensor chip 850 is fixed, a cover glass 820, an adhesive 830 for bonding the package substrate 810 and the cover glass 820 to each other, and the like.

Figure 61B:
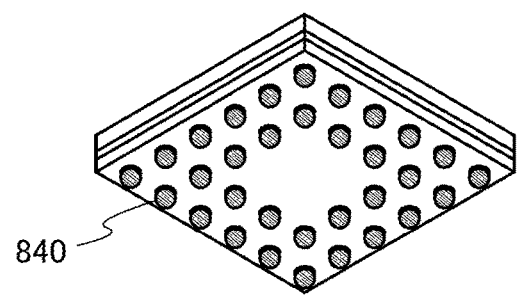

FIG. 61B is an external perspective view showing the bottom surface side of the package. On the bottom surface of the package, ball grid array (BGA) including solder balls as bumps 840 is formed. Although BGA is employed here, land grid array (LGA), pin grid array (PGA), or the like may be alternatively employed.

Figure 61C:
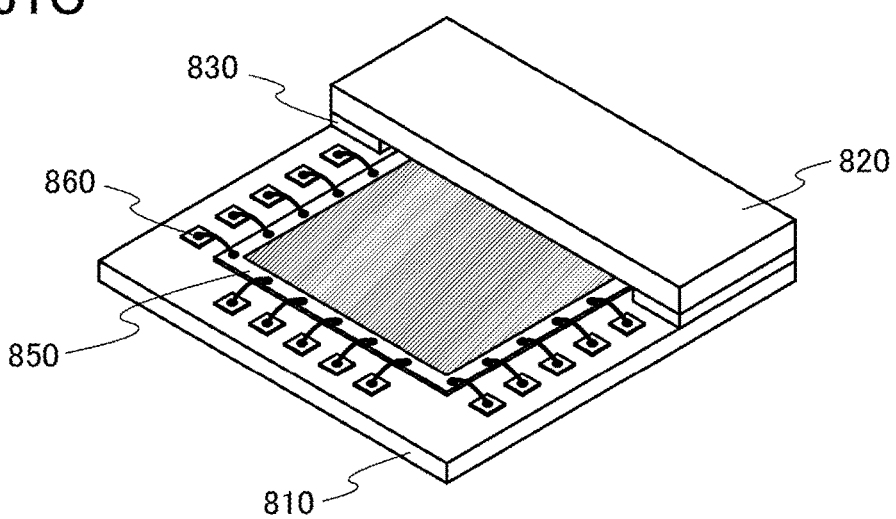
Figure 61D:
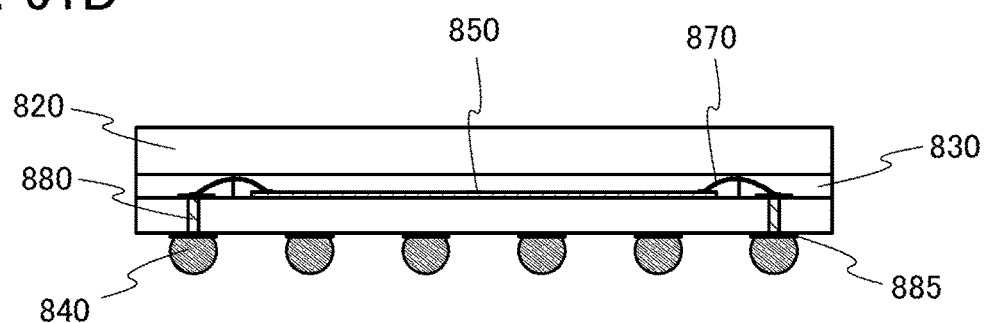

FIG. 61C is a perspective view of the package, in which the cover glass 820 and the adhesive 830 are partly illustrated. FIG. 61D is a cross-sectional view of the package. Electrode pads 860 are formed over the package substrate 810, and electrically connected to the bumps 840 through through-holes 880 and lands 885. The electrode pads 860 are electrically connected to electrodes of the image sensor chip 850 through wires 870.

Figure 62A:
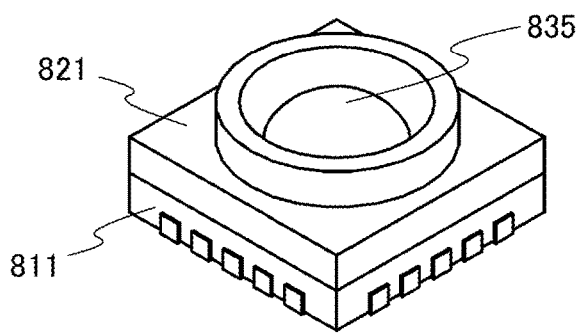
FIGS. 62A to 62D are perspective views and a cross-sectional view of a package including an imaging device.

FIG. 62A is an external perspective view showing the top surface side of a camera module in which an image sensor chip is mounted on a package with a built-in lens. The camera module includes a package substrate 811 to which an image sensor chip 851 is fixed, a lens cover 821, a lens 835, and the like. Furthermore, an IC chip 890 having functions of a driver circuit, a signal conversion circuit, and the like of an imaging device is provided between the package substrate 811 and the image sensor chip 851. Thus, the camera module is built as a system in package (SiP).

Figure 62B:
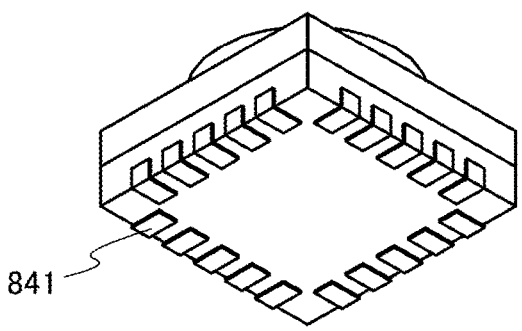

FIG. 62B is an external perspective view showing the bottom surface side of the camera module. On the bottom surface and four side surfaces of the package substrate 811, mounting lands 841 are provided; this structure can be called a quad flat no-lead package (QFN). Although QFN is employed here, quad flat package (QFP), the above BGA, or the like may be alternatively employed.

Figure 62C:
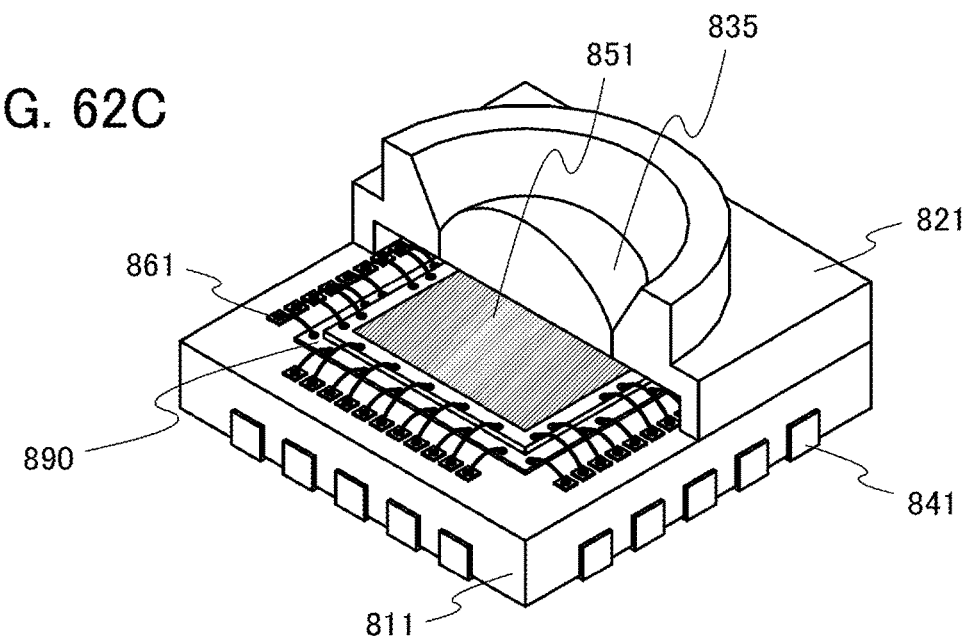
Figure 62D:
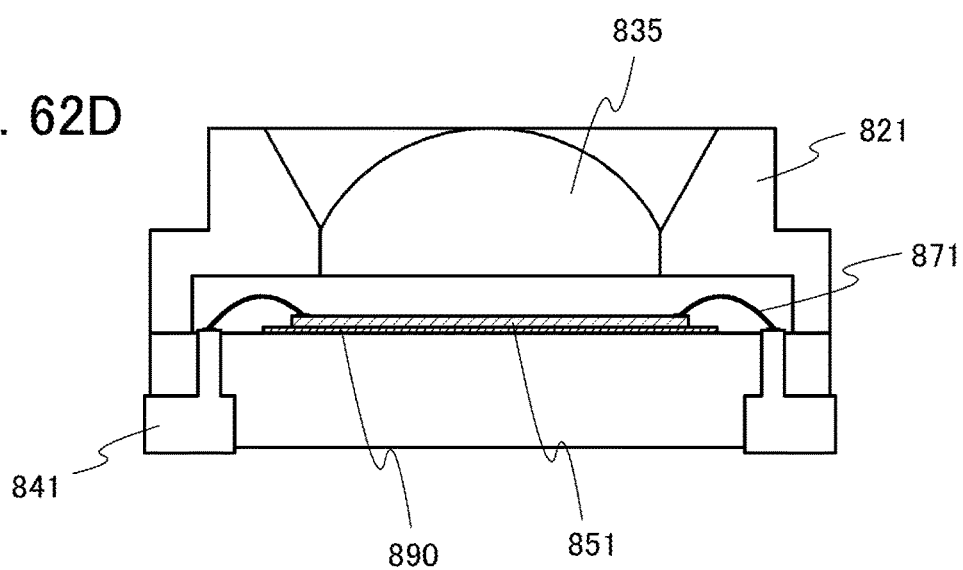

FIG. 62C is a perspective view of the module, in which the lens cover 821 and the lens 835 are partly illustrated. FIG. 62D is a cross-sectional view of the camera module. The lands 841 are partly used as the electrode pads 861. The electrode pads 861 are electrically connected to electrodes of the image sensor chip 851 and the IC chip 890 through wires 871.

The image sensor chip can be easily mounted on a printed circuit board or the like by being provided in the package having the above structure, and can be incorporated into a variety of semiconductor devices or a variety of electronic devices.

The structures described in this embodiment can be used in appropriate combination with any of the structures described in the other embodiments.

Embodiment 7

Examples of an electronic device that can use the imaging device of one embodiment of the present invention or a semiconductor device including the imaging device include display devices, personal computers, image memory devices or image reproducing devices provided with storage media, cellular phones, game machines (including portable game machines), portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 63A to 63F illustrate specific examples of these electronic devices.

Figure 63A:
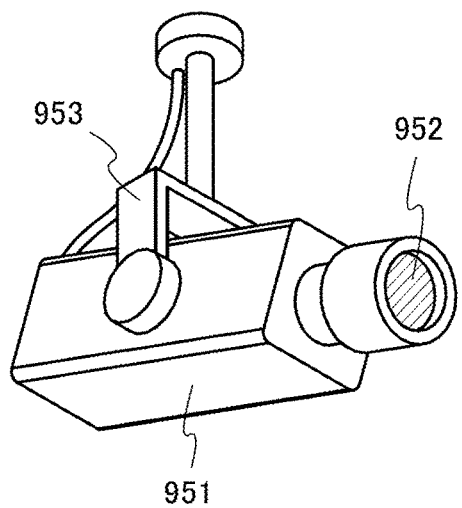
FIGS. 63A to 63F illustrate electronic devices.

FIG. 63A illustrates a monitoring camera, which includes a housing 951, a lens 952, a support portion 953, and the like. The imaging device of one embodiment of the present invention can be included as a component for obtaining an image in the monitoring camera. Note that a "monitoring camera" is a common name and does not limit the uses. For example, a device that has a function of a monitoring camera can also be called a camera or a video camera.

Figure 63B:
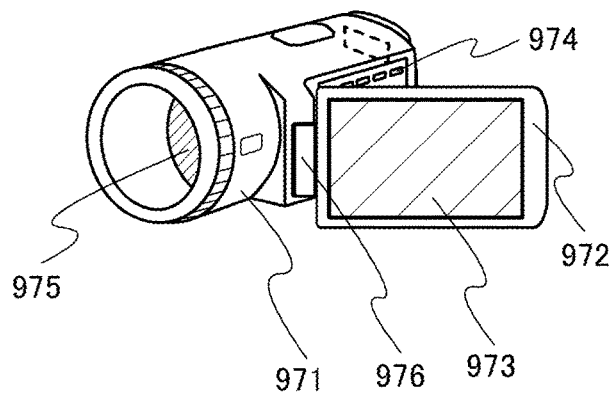

FIG. 63B illustrates a video camera, which includes a first housing 971, a second housing 972, a display portion 973, operation keys 974, a lens 975, a joint 976, and the like. The operation keys 974 and the lens 975 are provided for the first housing 971, and the display portion 973 is provided for the second housing 972. The imaging device of one embodiment of the present invention can be included as a component for obtaining an image in the video camera.

Figure 63C:
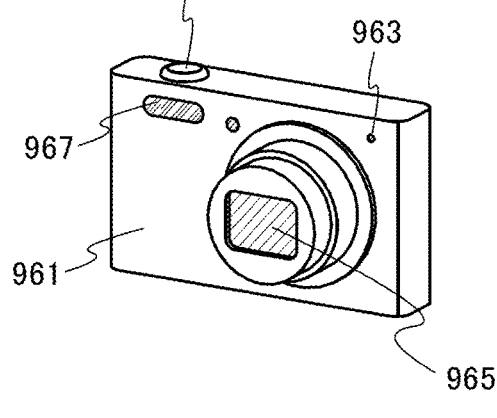

FIG. 63C illustrates a digital camera, which includes a housing 961, a shutter button 962, a microphone 963, a light-emitting portion 967, a lens 965, and the like. The imaging device of one embodiment of the present invention can be included as a component for obtaining an image in the digital camera.

Figure 63D:
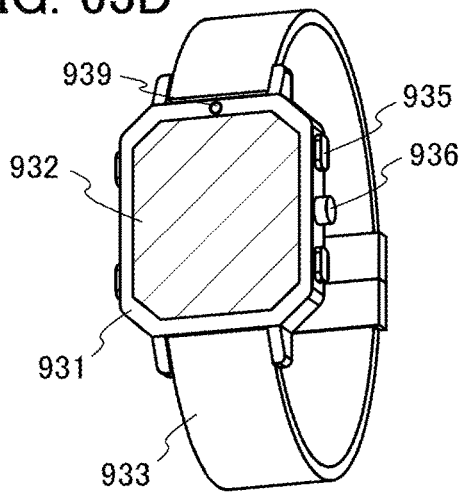

FIG. 63D illustrates a wrist-watch-type information terminal, which includes a housing 931, a display portion 932, a wristband 933, operation buttons 935, a winder 936, a camera 939, and the like. The display portion 932 may be a touch panel. The imaging device of one embodiment of the present invention can be included as a component for obtaining an image in the information terminal.

Figure 63E:
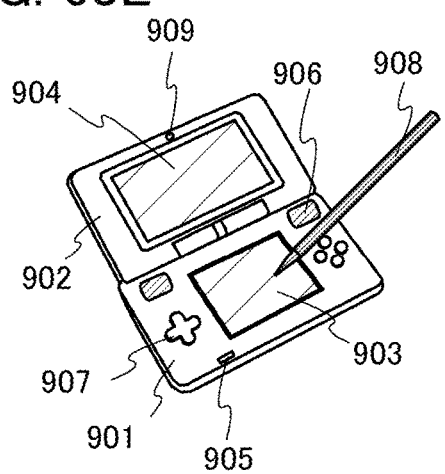

FIG. 63E illustrates a portable game machine, which includes housings 901 and 902, display portions 903 and 904, a microphone 905, speakers 906, an operation key 907, a stylus 908, a camera 909, and the like. Although the portable game machine in FIG. 63E has the two display portions 903 and 904, the number of display portions included in the portable game machine is not limited to two. The imaging device of one embodiment of the present invention can be included as one component for obtaining an image in the portable game machine.

Figure 63F:
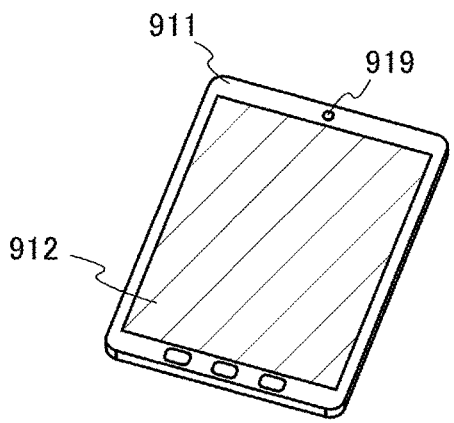

FIG. 63F illustrates a portable information terminal, which includes a housing 911, a display portion 912, a camera 919, and the like. The touch panel function of the display portion 912 enables input and output of information. The imaging device of one embodiment of the present invention can be included as one component for obtaining an image in the portable information terminal.

This embodiment can be combined with any of the other embodiments in this specification as appropriate.

REFERENCE NUMERALS

10: pixel, 11: pixel array, 12: circuit, 13: circuit, 14: circuit, 15: circuit, 16: circuit, 17: comparator circuit, 18: determination output circuit, 19: counter circuit, 20: pixel, 21: pixel array, 22: circuit, 23: circuit, 24: circuit, 25: circuit, 27: comparator circuit, 28: determination output circuit, 29: counter circuit, 35: substrate, 41: transistor, 42: transistor, 43: transistor, 44: transistor, 45: transistor, 46: transistor, 51: transistor, 52: transistor, 53: transistor, 54: transistor, 61: wiring, 62: wiring, 63: wiring, 64: wiring, 65: wiring, 71: wiring, 71*a*: conductive layer, 71*b*: conductive layer, 72: wiring, 73: wiring, 74: wiring, 75:

wiring, 80: insulating layer, 81: conductor, 82: insulating layer, 82a: insulating layer, 82b: insulating layer, 83: insulating layer, 88: wiring, 91: wiring, 92: wiring, 93: wiring, 94: wiring, 101: transistor, 102: transistor, 103: transistor, 104: transistor, 105: transistor, 106: transistor, 107: transistor, 108: transistor, 109: transistor, 110: transistor, 111: transistor, 112: transistor, 113: transistor, 115: substrate, 120: insulating layer, 130: oxide semiconductor layer, 130a: oxide semiconductor layer, 130b: oxide semiconductor layer, 130c: oxide semiconductor layer, 140: conductive layer, 141: conductive layer, 142: conductive layer, 150: conductive layer, 151: conductive layer, 152: conductive layer, 160: insulating layer, 170: conductive layer, 171: conductive layer, 172: conductive layer, 173: conductive layer, 175: insulating layer, 180: insulating layer, 190: insulating layer, 231: region, 232: region, 233: region, 331: region, 332: region, 333: region, 334: region, 335: region, 400: period, 401: period, 402: period, 403: period, 561: photoelectric conversion layer, 562: light-transmitting conductive layer, 563: semiconductor layer, 564: semiconductor layer, 565: semiconductor layer, 566: electrode, 566a: conductive layer, 566b: conductive layer, 567: partition wall, 568: layer for blocking hole injection, 569: layer for blocking electron injection, 600: silicon substrate, 610: transistor, 620: transistor, 650: active layer, 660: silicon substrate, 741: transistor, 742: transistor, 743: transistor, 744: transistor, 745: transistor, 746: transistor, 747: transistor, 751: transistor, 752: transistor, 753: transistor, 754: transistor, 761: wiring, 762: wiring, 763: wiring, 764: wiring, 765: wiring, 771: wiring, 772: wiring, 773: wiring, 774: wiring, 775: wiring, 791: wiring, 792: wiring, 793: wiring, 794: wiring, 810: package substrate, 811: package substrate, 820: cover glass, 821: lens cover, 830: adhesive, 835: lens, 840: bump, 841: land, 850: image sensor chip, 851: image sensor chip, 860: electrode pad, 861: electrode pad, 870: wire, 871: wire, 880: through-hole, 885: land, 890: IC chip, 901: housing, 902: housing, 903: display portion, 904: display portion, 905: microphone, 906: speaker, 907: operation key, 908: stylus, 909: camera, 911: housing, 912: display portion, 919: camera, 931: housing, 932: display portion, 933: wristband, 935: button, 936: winder, 939: camera, 951: housing, 952: lens, 953: support portion, 961: housing, 962: shutter button, 963: microphone, 965: lens, 967: light-emitting portion, 971: housing, 972: housing, 973: display portion, 974: operation key, 975: lens, 976: joint, 1100: layer, 1200: layer, 1400: layer, 1500: diffraction grating, 1600: layer, 2500: insulating layer, 2510: light-blocking layer, 2520: organic resin layer, 2530: color filter, 2530a: color filter, 2530b: color filter, 2530c: color filter, 2540: microlens array, 2550: optical conversion layer, and 2560: insulating layer This application is based on Japanese Patent Application serial no. 2015-178407 filed with Japan Patent Office on Sep. 10, 2015, and Japanese Patent Application serial no. 2015-178420 filed with Japan Patent Office on Sep. 10, 2015, the entire contents of which are hereby incorporated by reference.

The invention claimed is:

1. An imaging device comprising:
a first transistor, a second transistor, a third transistor, a fourth transistor, and a fifth transistor;
a first node and a second node connected to each other through the first transistor;
a photoelectric conversion element; and
a first capacitor and a second capacitor,
wherein:
the first node is electrically connected to the photoelectric conversion element, one of a source and a drain of the first transistor, and one of a source and a drain of the second transistor,
the second node is electrically connected to the other of the source and the drain of the first transistor, one of a source and a drain of the third transistor, one of a source and a drain of the fourth transistor, a gate of the fifth transistor, and the first capacitor,
the other of the source and the drain of the second transistor is electrically connected to the other of the source and the drain of the third transistor,
the second transistor is configured to reset a potential of the first node,
the third transistor is configured to reset a potential of the second node,
the other of the source and the drain of the fourth transistor is electrically connected to the second capacitor, and
each of the first transistor, the second transistor, the third transistor, and the fourth transistor includes an oxide semiconductor.

2. The imaging device according to claim 1, wherein the fifth transistor includes an oxide semiconductor.

3. The imaging device according to claim 1, wherein the oxide semiconductor contains In, Zn, and M (M is one of Al, Ti, Ga, Sn, Y, Zr, La, Ce, Nd, and Hf).

4. The imaging device according to claim 1, wherein the photoelectric conversion element includes selenium or a compound containing selenium in a photoelectric conversion layer.

5. A module comprising the imaging device according to claim 1 and a lens.

6. An electronic device comprising the imaging device according to claim 1 and a display device.

7. An imaging device comprising:
a pixel comprising a first transistor, a second transistor, a third transistor, a charge accumulation portion, and a charge detection portion; and
a first circuit, a second circuit, a third circuit, a fourth circuit, and a fifth circuit,
wherein:
the charge accumulation portion and the charge detection portion are connected to each other through the first transistor,
the second transistor is configured to reset a potential of the charge accumulation portion,
the third transistor is configured to reset a potential of the charge detection portion,
the pixel is electrically connected to the first circuit and the fifth circuit,
the first circuit is electrically connected to the second circuit,
the second circuit is electrically connected to the third circuit and the fourth circuit,
the third circuit is electrically connected to the fifth circuit,
the pixel is configured to capture first imaging data or second imaging data, to accumulate the first imaging data or the second imaging data in the charge accumulation portion, and to transfer the first imaging data or the second imaging data accumulated in the charge accumulation portion to the charge detection portion,
the first circuit is configured to output a first signal obtained by adding or subtracting an absolute value of a difference between a first potential corresponding to the second imaging data and a second potential corresponding to a reset potential of the charge detection portion to or from a reference potential, the second circuit is configured to determine whether the charge detection portion is saturated with an electron with use of the first imaging data, the third circuit is configured to output a second signal for not capturing the second imaging data to the pixel through the fifth circuit when the charge detection portion is not saturated with the electron, and to eliminate saturation of the charge detection portion and output a third signal for capturing the second imaging data to the pixel through the fifth circuit when the charge detection portion is saturated with the electron, and the second circuit and the fourth circuit are configured to convert a signal output from the first circuit into digital data.

8. A module comprising the imaging device according to claim 7 and a lens.

9. An electronic device comprising the imaging device according to claim 7 and a display device.

10. A method of operating an imaging device, comprising:
in an n-th frame period (n is a natural number of 1 or more),
resetting a potential of a charge accumulation portion by a first transistor;
accumulating a charge in the charge accumulation portion;
resetting a potential of a charge detection portion by a second transistor;
transferring a first potential of the charge accumulation portion to the charge detection portion; and
reading a first signal corresponding to the first potential, and determining from the first signal whether the charge detection portion is saturated with an electron,
when the charge detection portion is saturated with the electron, the method comprising:
resetting the first potential of the charge accumulation portion by the first transistor;
accumulating a charge in the charge accumulation portion;
increasing a capacitance of the charge detection portion to eliminate saturation of the charge detection portion; and
transferring a second potential of the charge accumulation portion to the charge detection portion, and
in an (n+1)-th frame period, when the charge detection portion is saturated with the electron, the method further comprising:
reading a second signal corresponding to the second potential in parallel with resetting a potential of the charge accumulation portion and accumulating a charge, and
when the charge detection portion is not saturated with the electron, the method further comprising:
reading the first signal in parallel with resetting a potential of the charge accumulation portion and accumulating a charge.

11. An imaging device comprising:
a first transistor, a second transistor, a third transistor, a fourth transistor, a fifth transistor, and a sixth transistor;
a first node and a second node connected to each other through the first transistor;
a photoelectric conversion element; and
a first capacitor, a second capacitor, and a third capacitor, wherein:
the first node is electrically connected to the photoelectric conversion element, one of a source and a drain of the first transistor, and one of a source and a drain of the second transistor, the second node is electrically connected to the other of the source and the drain of the first transistor, one of a source and a drain of the third transistor, one of a source and a drain of the fourth transistor, a gate of the fifth transistor, and the first capacitor, the other of the source and the drain of the second transistor is electrically connected to the other of the source and the drain of the third transistor, the second transistor is configured to reset a potential of the first node, the third transistor is configured to reset a potential of the second node, the other of the source and the drain of the fourth transistor is electrically connected to the second capacitor, one of a source and a drain of the sixth transistor is electrically connected to a gate of the fourth transistor, and the third capacitor, and each of the first transistor, the second transistor, the third transistor, the fourth transistor, and the sixth transistor includes an oxide semiconductor.

12. The imaging device according to claim 11, wherein the fifth transistor includes an oxide semiconductor.

13. The imaging device according to claim 11, wherein the oxide semiconductor contains In, Zn, and M (M is one of Al, Ti, Ga, Sn, Y, Zr, La, Ce, Nd, and Hf).

14. The imaging device according to claim 11, wherein the photoelectric conversion element includes selenium or a compound containing selenium in a photoelectric conversion layer.

15. A module comprising the imaging device according to claim 11 and a lens.

16. An electronic device comprising the imaging device according to claim 11 and a display device.

17. An imaging device comprising:
a pixel comprising a first transistor, a second transistor, a third transistor, a charge accumulation portion, a charge detection portion, a first capacitor, and a second capacitor; and
a first circuit, a second circuit, a third circuit, and a fourth circuit,
wherein:
the charge accumulation portion and the charge detection portion are connected to each other through the first transistor,
the second transistor is configured to reset a potential of the charge accumulation portion,
the third transistor is configured to reset a potential of the charge detection portion,
the charge detection portion is electrically connected to the first capacitor and the second capacitor,
the pixel is electrically connected to the first circuit and the third circuit,
the first circuit is electrically connected to the second circuit,
the second circuit is electrically connected to the third circuit and the fourth circuit,
the pixel is configured to capture first imaging data or second imaging data, to accumulate the first imaging data or the second imaging data in the charge accumulation portion, and to transfer the first imaging data or the second imaging data accumulated in the charge accumulation portion to the charge detection portion, the first circuit is configured to output a first signal obtained by adding or subtracting an absolute value of a difference between a first potential corresponding to the second imaging data and a second potential corresponding to a reset potential of the charge detection portion to or from a reference potential, the second circuit is configured to determine whether the charge detection portion is saturated with an electron with use of the first imaging data, the third circuit is configured to output a second signal for not electrically connecting the charge detection portion and the second capacitor to the pixel when the charge detection portion is not saturated with the electron, and to output a third signal for electrically connecting the charge detection portion and the second capacitor to the pixel when the charge detection portion is saturated with the electron, the pixel is configured to transfer the second imaging data from the charge accumulation portion to the charge detection portion after the determination, and the second circuit and the fourth circuit are configured to convert a signal output from the first circuit into digital data.

18. A module comprising the imaging device according to claim 17 and a lens.

19. An electronic device comprising the imaging device according to claim 17 and a display device.

20. A method of operating an imaging device, comprising:
in an n-th frame period (n is a natural number of 1 or more),
  resetting a potential of a charge accumulation portion by a first transistor;
  accumulating a charge in the charge accumulation portion;
  resetting a potential of a charge detection portion by a second transistor;
  transferring a first potential of the charge accumulation portion to the charge detection portion; and
  reading a first signal corresponding to the first potential, and determining from the first signal whether the charge detection portion is saturated with an electron,
when the charge detection portion is saturated with the electron, the method comprising:
  increasing a capacitance of the charge detection portion;
  resetting the first potential of the charge detection portion by the first transistor; and
  transferring a second potential of the charge accumulation portion to the charge detection portion, and
when the charge detection portion is not saturated with the electron, the method comprising:
  resetting the first potential of the charge detection portion;
  resetting the first potential of the charge accumulation portion;
  accumulating a charge in the charge accumulation portion; and
  transferring a second potential of the charge accumulation portion to the charge detection portion, and
in an (n+1)-th frame period,
  reading a second signal corresponding to the second potential in parallel with resetting a potential of the charge accumulation portion and accumulating a charge.

* * * * *